United States Patent
Lai et al.

(10) Patent No.: US 11,908,852 B2
(45) Date of Patent: *Feb. 20, 2024

(54) LAYOUT DESIGNS OF INTEGRATED CIRCUITS HAVING BACKSIDE ROUTING TRACKS

(71) Applicant: TAIWAN SEMICONDUCTOR MANUFACTURING COMPANY, LTD., Hsinchu (TW)

(72) Inventors: Wei-An Lai, Hsinchu (TW); Shih-Wei Peng, Hsinchu (TW); Wei-Cheng Lin, Hsinchu (TW); Jiann-Tyng Tzeng, Hsinchu (TW)

(73) Assignee: TAIWAN SEMICONDUCTOR MANUFACTURING COMPANY, LTD, Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/833,531

(22) Filed: Jun. 6, 2022

(65) Prior Publication Data
US 2022/0320070 A1    Oct. 6, 2022

Related U.S. Application Data

(63) Continuation of application No. 16/933,570, filed on Jul. 20, 2020, now Pat. No. 11,355,487.

(51) Int. Cl.
| | |
|---|---|
| *H01L 27/02* | (2006.01) |
| *H01L 21/8238* | (2006.01) |
| *H01L 23/522* | (2006.01) |
| *H03K 19/17736* | (2020.01) |

(52) U.S. Cl.
CPC .. *H01L 27/0207* (2013.01); *H01L 21/823871* (2013.01); *H01L 23/5226* (2013.01); *H03K 19/17744* (2013.01)

(58) Field of Classification Search
CPC ......... H01L 27/0207; H01L 21/823871; H01L 23/5226; H03K 19/17744
USPC .......................................................... 257/499
See application file for complete search history.

(56) References Cited

U.S. PATENT DOCUMENTS

| | | | |
|---|---|---|---|
| 7,260,442 B2 | 8/2007 | Hwang et al. | |
| 9,256,709 B2 | 2/2016 | Yu et al. | |
| 11,355,487 B2 * | 6/2022 | Lai | .............. H03K 19/17744 |
| 2008/0054313 A1 * | 3/2008 | Dyer | ............... H01L 21/76898 257/E21.597 |
| 2014/0040838 A1 | 2/2014 | Liu et al. | |
| 2014/0342529 A1 | 11/2014 | Goktepeli et al. | |

(Continued)

*Primary Examiner* — Tu-Tu V Ho
(74) *Attorney, Agent, or Firm* — Hauptman Ham, LLP

(57) ABSTRACT

An integrated circuit includes a first transistor, a horizontal routing track extending in a first direction in a first metal layer, and a via connector conductively connecting the horizontal routing track to a first terminal of the first transistor. The integrated circuit also includes a backside routing track extending in the first direction in a backside metal layer, and a backside via connector conductively connecting the backside routing track to a second terminal of the first transistor. The backside metal layer and the first metal layer are formed at opposite sides of a semiconductor substrate. In the integrated circuit, either the first terminal or the second terminal is a gate terminal of the first transistor.

20 Claims, 46 Drawing Sheets

(56) References Cited

U.S. PATENT DOCUMENTS

2015/0278429 A1 10/2015 Chang
2021/0225830 A1 7/2021 Liu

* cited by examiner

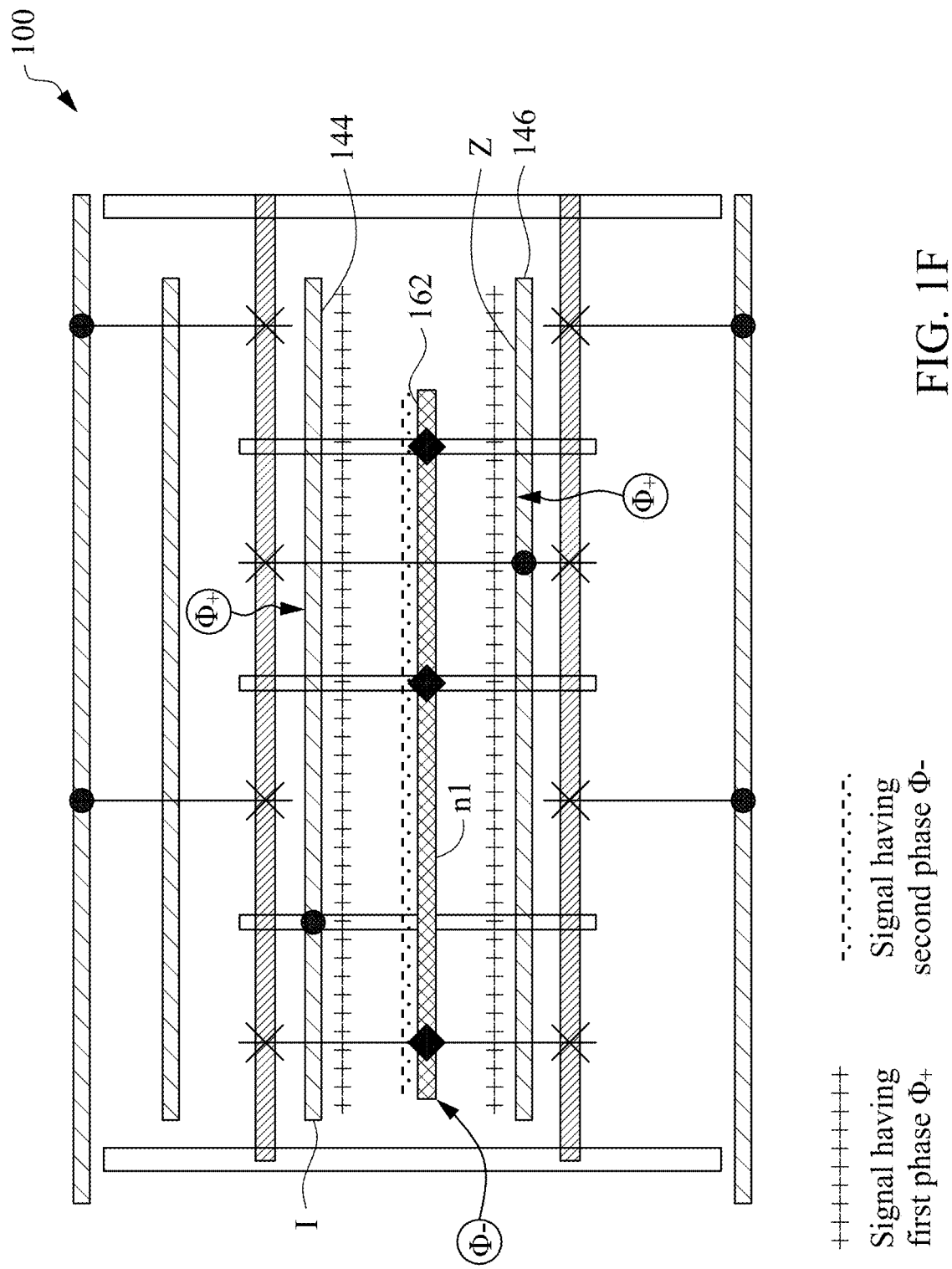

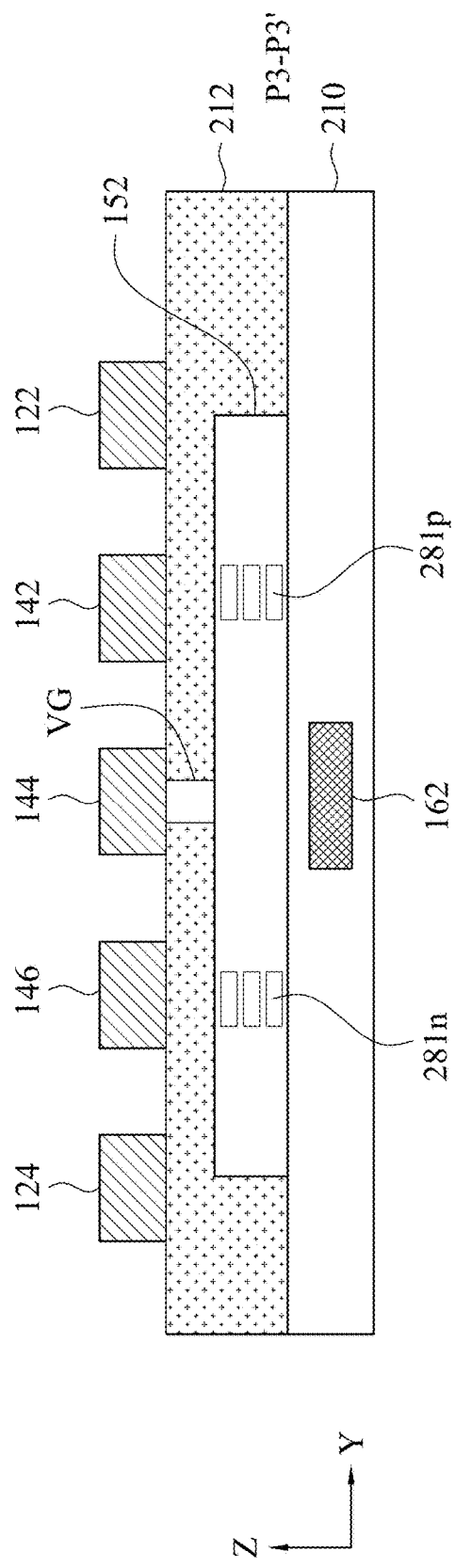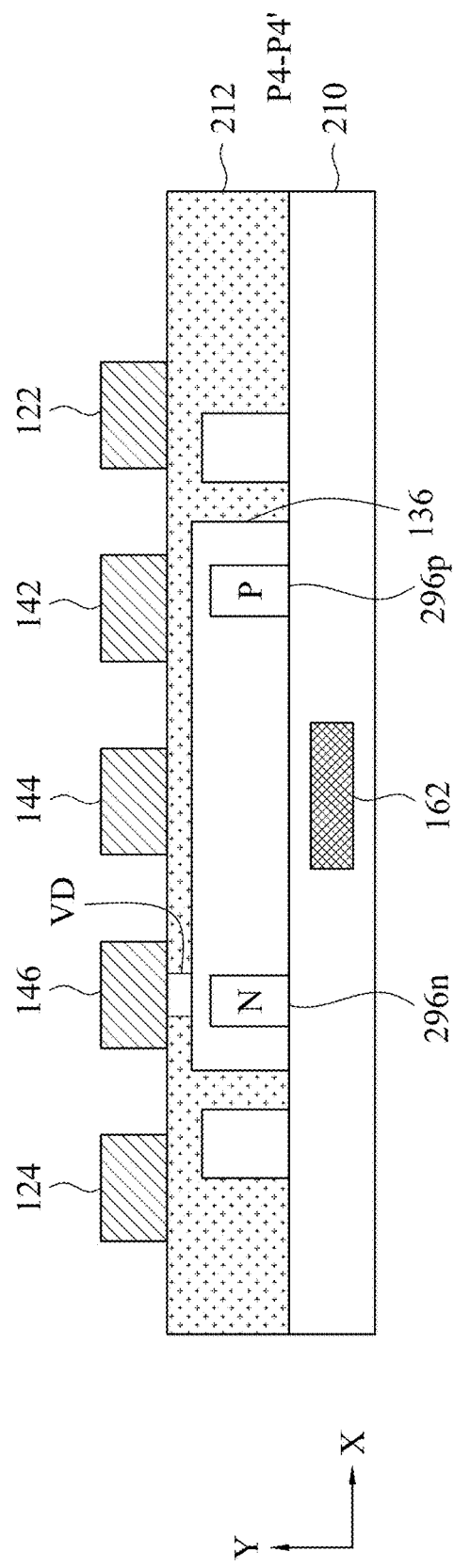

$$ZN = \overline{(A1 \cdot A2 + B1 \cdot B2)}$$

$Z = (I0 \cdot S0 + I1 \cdot S1 + I2 \cdot S2 + I3 \cdot S3)$

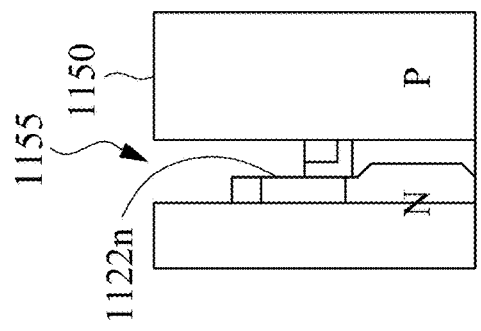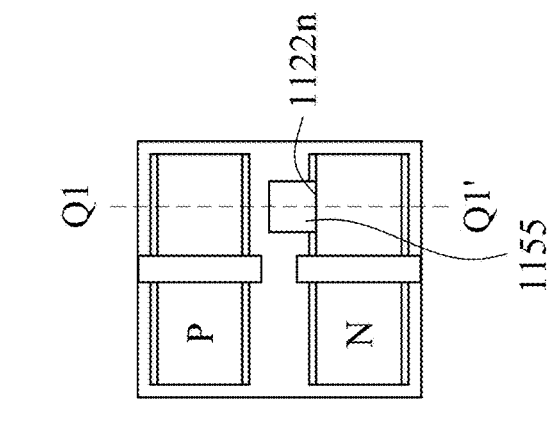
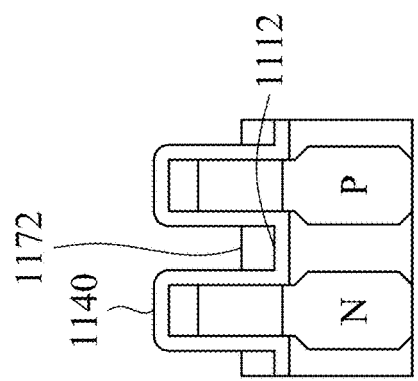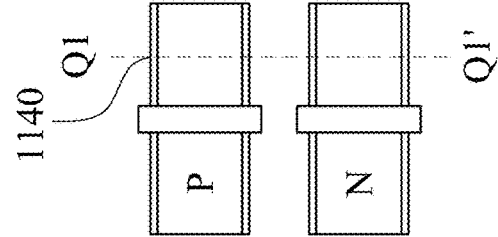
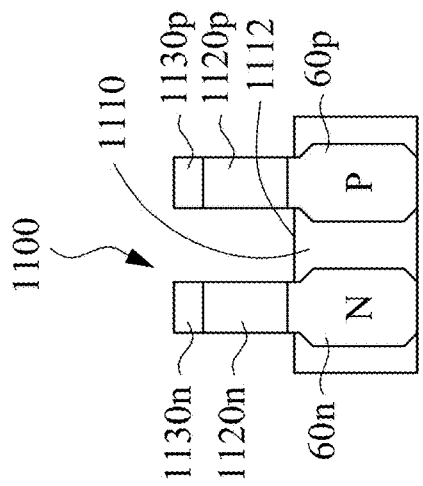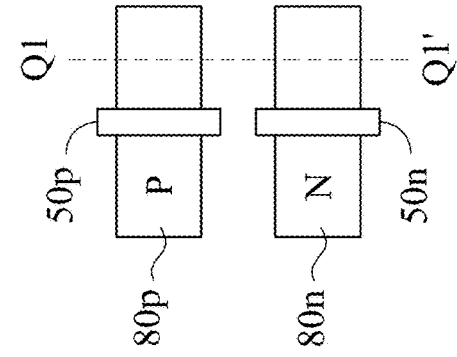
FIG. 11A  FIG. 11B  FIG. 11C

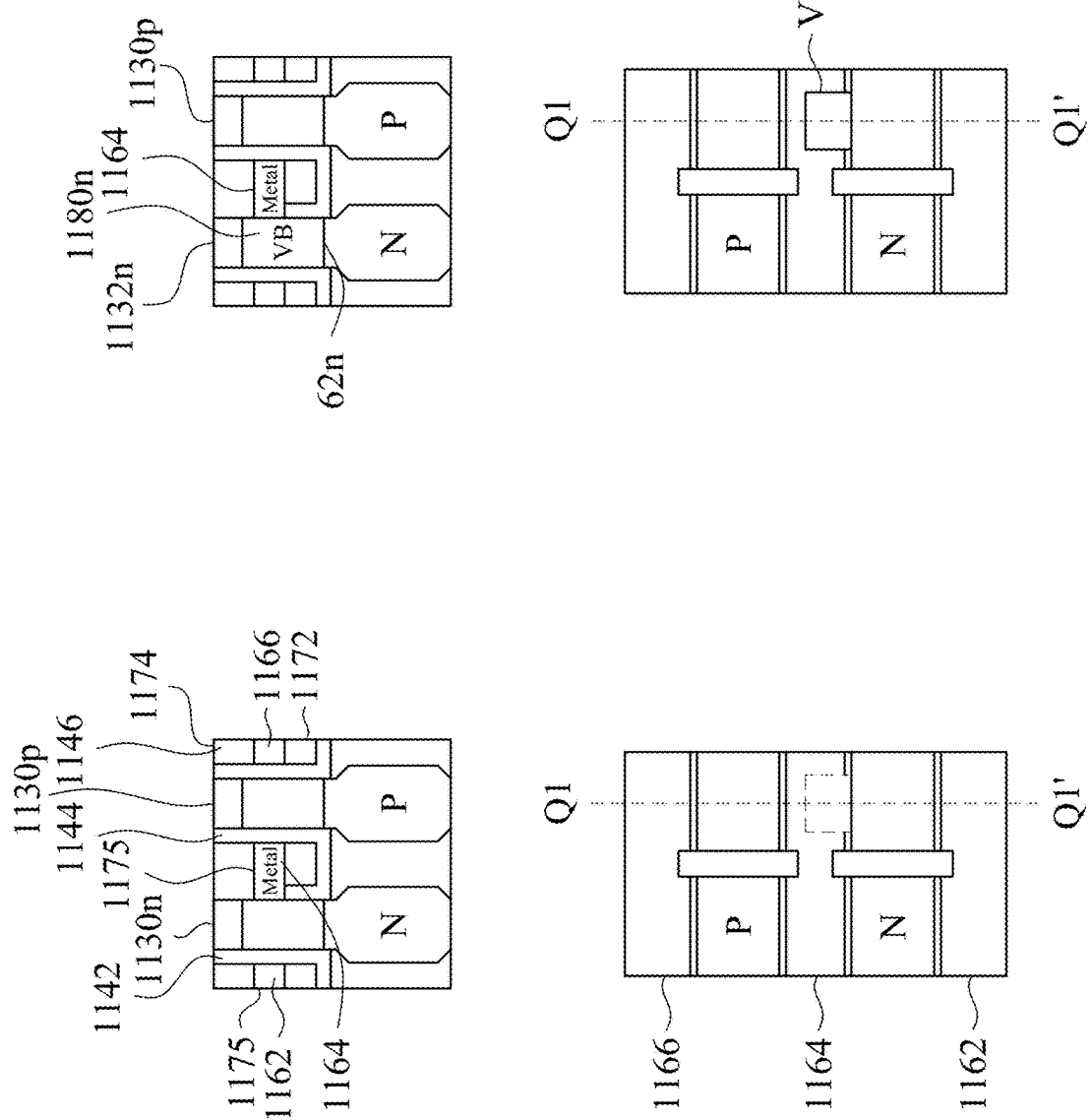

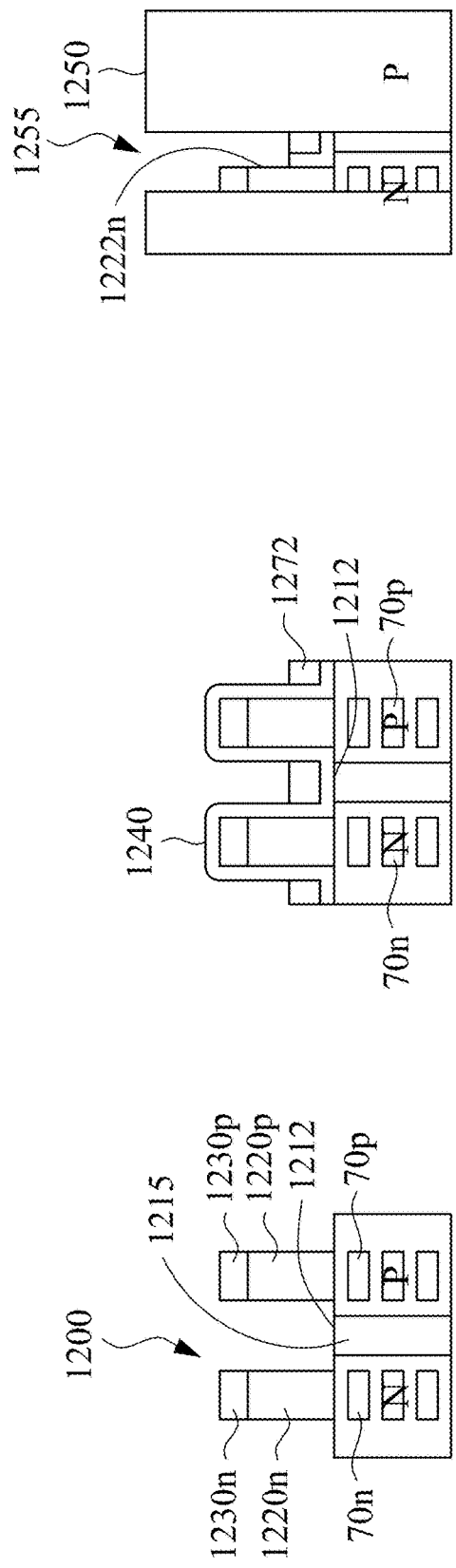
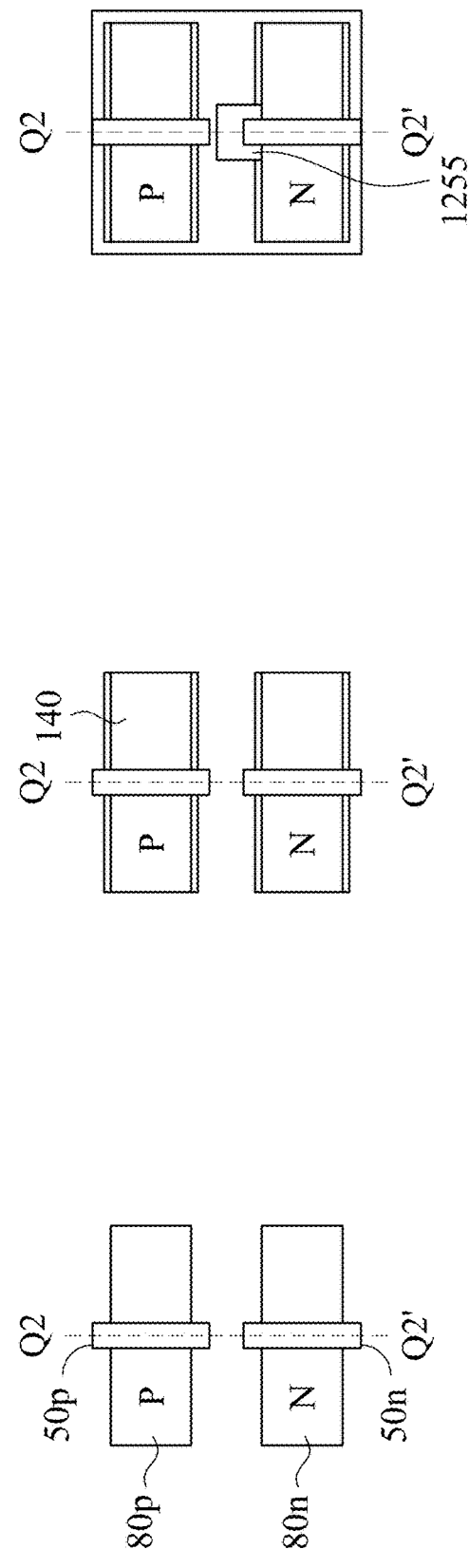
FIG. 12A
FIG. 12B
FIG. 12C

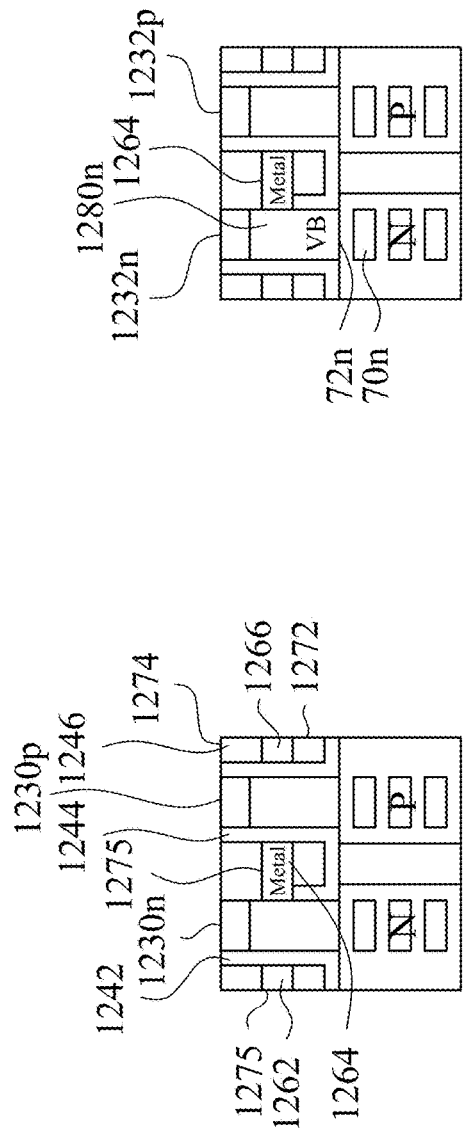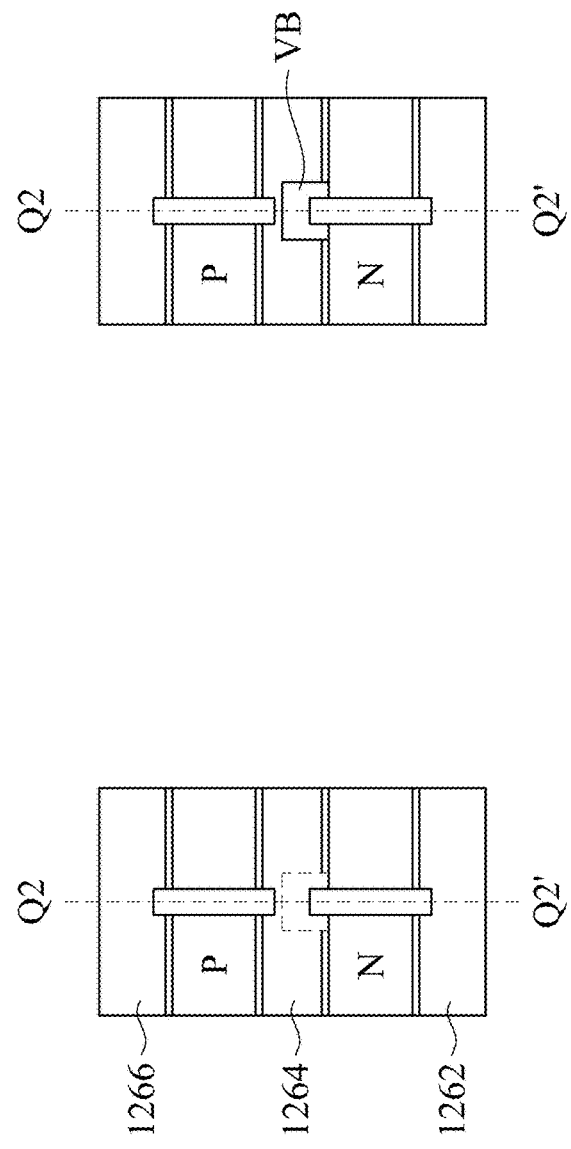
FIG. 12D
FIG. 12E

US 11,908,852 B2

LAYOUT DESIGNS OF INTEGRATED CIRCUITS HAVING BACKSIDE ROUTING TRACKS

PRIORITY CLAIM

The present application is a continuation of U.S. application Ser. No. 16/933,570, filed Jul. 20, 2020, which is incorporated herein by reference in its entirety.

BACKGROUND

The recent trend in miniaturizing integrated circuits (ICs) has resulted in smaller devices which consume less power yet provide more functionality at higher speeds. The miniaturization process has also resulted in stricter design and manufacturing specifications as well as reliability challenges. Various electronic design automation (EDA) tools generate, optimize and verify standard cell layout designs for integrated circuits while ensuring that the standard cell layout design and manufacturing specifications are met.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1F is a stick diagram of the buffer logic gate of FIGS. 1A-1B, in accordance with some embodiments.

FIGS. 2A-2D are cross-sectional views of the buffer logic gate along selected cutting planes of FIGS. 1A-1B, in accordance with some embodiments.

FIGS. 11A-11E are top views and cross-sectional views of intermediate device structures during fabrication of the backside routing tracks and the backside via connector VBd for connecting a backside routing track with a source/drain terminal of a transistor, in accordance with some embodiments.

FIGS. 12A-12E are top views and cross-sectional views of intermediate device structures during fabrication of the backside routing tracks and the backside via connector VB for connecting a backside routing track with a gate terminal of a transistor, in accordance with some embodiments.

DETAILED DESCRIPTION

Figure 1A:
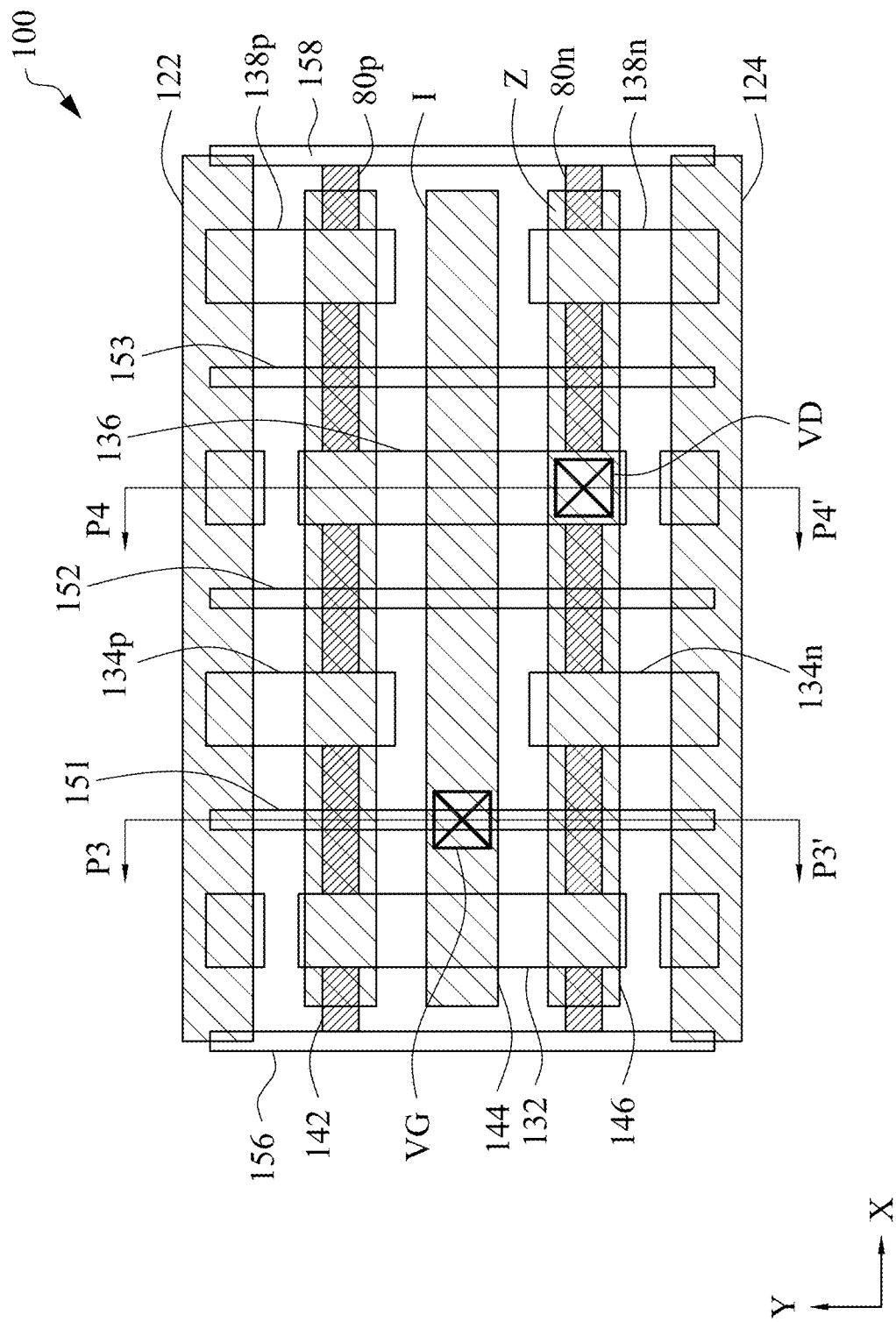
FIGS. 1A-1B are partial layout diagrams of a buffer logic gate, in accordance with some embodiments.

The following disclosure provides many different embodiments, or examples, for implementing different features of the provided subject matter. Specific examples of components, materials, values, steps, operations, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The shrinking of integrated circuit (IC) devices, and the increasing density of integrated circuit devices on a substrate, produces increasing difficulty of designing and manufacturing interconnect structures between elements of individual devices and between devices of the integrated circuit. Interconnect structure complexity increases as devices shrink in successive generations of integrated circuits, and closer spacing between interconnects increases the likelihood of manufacturing defects causing device failure. As crowding between interconnect structure elements increases, parasitic capacitance increases, adversely impacting the performance of individual transistors of the integrated circuit.

Manufacturing an integrated circuit having backside routing tracks and backside via connectors reduces the overall complexity of the interconnect structure on the top side of the integrated circuit. Backside routing tracks and backside via connectors allow for more room between topside interconnects (e.g., lines traversing the circuit), reducing parasitic capacitance in the integrated circuit and providing greater manufacturing flexibility. In particular, when two adjacent routing tracks on a same metal layer carry signals with opposite phases, the parasitic capacitance coupling between the two adjacent routing tracks may adversely impact the speed and the power consumption of the integrated circuit. In accordance with at least one embodiment, when backside routing tracks are available for redesigning the layouts of integrated circuits, it is possible using one or more of the presently disclosed embodiments to reduce the number of unfavorable instances where two adjacent routing tracks on a same metal layer carry signals with opposite phases and to improve the speed and the power consumption of the integrated circuits.

Figure 1B:
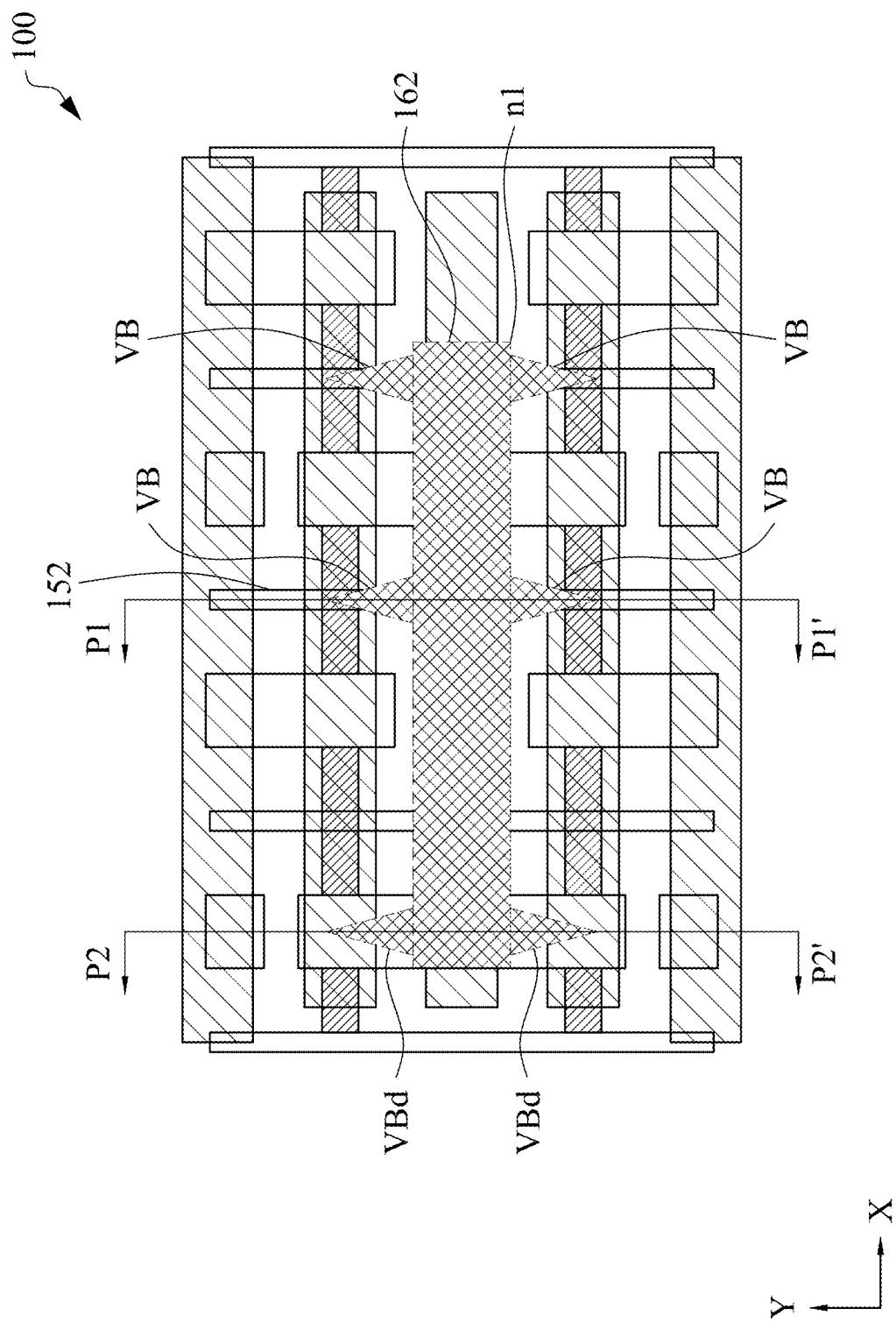
Figure 1C:
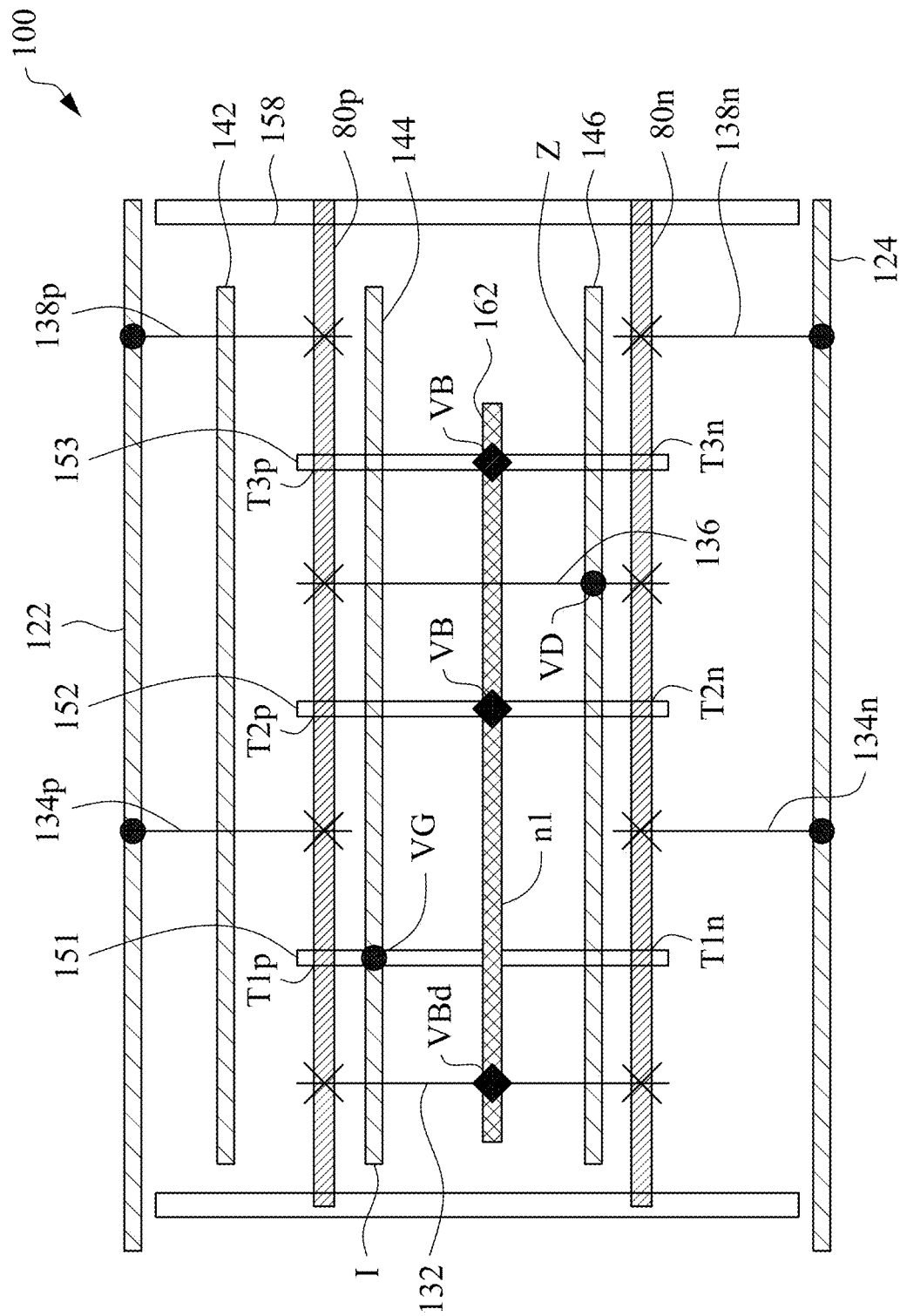
FIG. 1C is a stick diagram of the layout diagrams in FIGS. 1A-1B, in accordance with some embodiments.

FIGS. 1A-1B are partial layout diagrams of a buffer logic gate 100, in accordance with some embodiments. In FIG. 1A, elements formed on the front side of the substrate are shown in corresponding layout patterns. The elements in FIG. 1A include active zones, gate-strips, conductive segments, power rails, horizontal routing tracks in a first metal layer M0, and via connectors for connecting the horizontal routing tracks to the gate-strip and the conductive segment. In FIG. 1B, backside routing tracks and backside via connectors formed on the back side of the substrate are depicted with layout patterns superimposed on the layout patterns in FIG. 1A. FIG. 1C is a stick diagram of the layout diagrams in FIGS. 1A-1B, in accordance with some embodiments.

In the layout diagram of FIG. 1A, the buffer logic gate 100 includes two parallel power rails 122 and 124 extending in the X-direction. The power rail 122 is configured to have a first supply voltage VDD, and the power rail 124 is configured to have a second supply voltage VSS. The buffer logic gate 100 also includes a p-type active zone 80$p$ and an n-type active zone 80$n$ extending in the X-direction. The buffer logic gate 100 further includes multiple gate-strips 151, 152, 153, 156, and 158 extending in the Y-direction that is perpendicular to the X-direction. Each of the three gate-strips 151, 152, and 153 intersects both the p-type active zone 80$p$ and the n-type active zone 80$n$ and overlaps with the channel regions of corresponding p-type transistors and n-type transistors. Specifically, as shown in the stick diagram of FIG. 1C, the gate-strip 151 overlaps the channel region of a p-type transistor T1$p$ and the channel region of an n-type transistor T1$n$. The gate-strip 152 overlaps the channel region of a p-type transistor T2$p$ and the channel region of an n-type transistor T2$n$. The gate-strip 153 overlaps the channel region of a p-type transistor T3$p$ and the channel region of an n-type transistor T3$n$. The channel regions of the p-type transistors T1$p$, T2$p$, and T3$p$ are in the p-type active zone 80$p$. The channel regions of the n-type transistors T1$n$, T2$n$, and T3$n$ are in the n-type active zone 80$n$. In some embodiments, the gate-strips 156 and 158 in FIG. 1A are dummy gate-strips which do not form gate terminals of functioning transistors connected in a circuit.

In the layout diagram of FIG. 1A, the buffer logic gate 100 includes multiple conductive segments 132, 134$p$, 134$n$, 136, 138$p$, and 138$n$ extending in the Y-direction. Each of the conductive segments 132 and 136 intersects both the p-type active zone 80$p$ and the n-type active zone 80$n$. Each of the conductive segments 134$p$ and 138$p$ intersects the p-type active zone 80$p$. Each of the conductive segments 134$n$ and 138$n$ intersects the n-type active zone 80$n$. Each of the multiple conductive segments 132, 134$p$, 134$n$, 136, 138$p$, and 138$n$ overlap at least one source/drain region of a transistor. Specifically, in the stick diagram of FIG. 1C, the conductive segment 132 overlaps the source/drain regions of the p-type transistor T1$p$ and the source/drain region of the n-type transistor T1$n$. The conductive segment 134$p$ overlaps the source/drain regions of the p-type transistors T1$p$ and T2$p$, and the conductive segment 134$n$ overlaps the source/drain regions of the n-type transistors T1$n$ and T2$n$. The conductive segment 136 overlaps the source/drain regions of two p-type transistors (T2$p$ and T3$p$) and overlaps the source/drain regions of two n-type transistors (T2$n$ and T3$n$). The conductive segment 138$p$ overlaps the source/drain region of the p-type transistors T3$p$, and the conductive segment 138$n$ overlaps the source/drain region of the n-type transistors T3$n$. Each of the conductive segments 134$p$ and 138$p$ is also conductively connected to the power rail 122. Each of the conductive segments 134$n$ and 138$n$ is also conductively connected to the power rail 124. The source/drain regions of the p-type transistors T1$p$, T2$p$, and T3$p$ are in the p-type active zone 80$p$. The source/drain regions of the n-type transistors T1$n$, T2$n$, and T3$n$ are in the n-type active zone 80$n$.

In the layout diagram of FIG. 1A, the buffer logic gate 100 includes horizontal routing tracks (e.g., 142, 144, and 146) extending in the X-direction. As shown in the layout diagram of FIG. 1A and in the stick diagram of FIG. 1C, the horizontal routing track 144 is conductively connected to the gate-strip 151 through a via connector VG, and the horizontal routing track 146 is conductively connected to the conductive segment 136 through a via connector VD. In FIG. 1C, the horizontal routing track 142 is not used to carry electrical signals for the buffer logic gate 100.

In the layout diagram of FIG. 1B, the buffer logic gate 100 includes a backside routing track 162 extending in the X-direction and backside via connectors VB and VBd for connecting the backside routing track 162 to other elements in the circuit. Specifically, as shown in the stick diagram of FIG. 1C, the backside routing track 162 is conductively connected to each of the gate-strips 152 and 153 through a backside via connector VB. The backside routing track 162 is also conductively connected to the conductive segment 132 through a backside via connector VBd. In the layout diagram of FIG. 1B, the backside routing track 162 and the backside via connectors VBd and VB are depicted and superimposed on the layout patterns in FIG. 1A, while ignoring the depiction of the front side via connectors VG and VD, for better clarity.

In the layout diagram of FIG. 1B, some of the device elements are specified with layout patterns in abstract representations. For example, while each of the backside via connectors VB and VBd in FIG. 1B is represented by a triangle pattern, the physical shapes of the backside via connectors are not necessarily triangular in shape. In some embodiments, the triangle pattern generally specifies the location of a backside via connector that is needed for connecting an identified backside routing track with another identified conductive element (such as an identified gate-strip or an identified conductive segment which is a source/drain terminal of a transistor). In some embodiments, when the layout diagram is interpreted by a software interpreter program, the triangle pattern is translated into the corresponding mask patterns in a mask set for fabricating the backside via connector represented by the triangle pattern. In some embodiments, the shape and the dimensions of the mask patterns in the mask set for fabricating the backside via connector depend upon the technologies used for the fabrication. In some embodiments, each opening in the masks for fabricating the backside via connector is rectangular or square in shape, and consequently, the shape of the backside via connector in the top view at a selected plane is correspondingly rectangular shape or square shape. In some embodiments, the shape and the dimensions of the mask patterns in the mask set for fabricating the backside via connector are provided by a database or a technology file associated with the technologies used for the fabrication. Some example shapes of the backside via connectors VB and VBd are provided in the cross-sectional views of FIGS. 2A-2D.

Furthermore, in some embodiments, when a layout diagram is displayed in an editing mode on a display screen, the order of the layers of various layout patterns is not the same as the as-fabricated order of the layers containing the fabricated elements specified by the layout patterns. For example, in some embodiments, when the layout patterns for the backside via connectors VB and VBd are selected for editing in an editing mode, the layout patterns for the backside via connectors as shown in FIG. 1B is bring up to be in front of all other layout patterns. When another layout element (such as, a gate-strip or a conductive segment) is selected for editing, in some embodiments, the newly selected layout element is bring up to be in front of all other layout patterns.

FIGS. 2A-2D are cross-sectional views of the buffer logic gate 100 along selected cutting planes as specified by the layout diagrams in FIGS. 1A-1B, in accordance with some embodiments. In FIGS. 2A-2D, the power rails 122 and 124, the horizontal routing tracks 142, 144, and 146, the front side via connectors VG and VD, and the insulation layer 212 are formed at the front side of the substrate 210, while the backside routing track 162 and the backside via connectors VB and VBd are formed at the backside of the substrate 210. The Z-direction, which is perpendicular to the Y-direction and the X-direction (which is not shown in FIGS. 2A-2D), points towards the front side of the substrate 210.

Figure 2A:
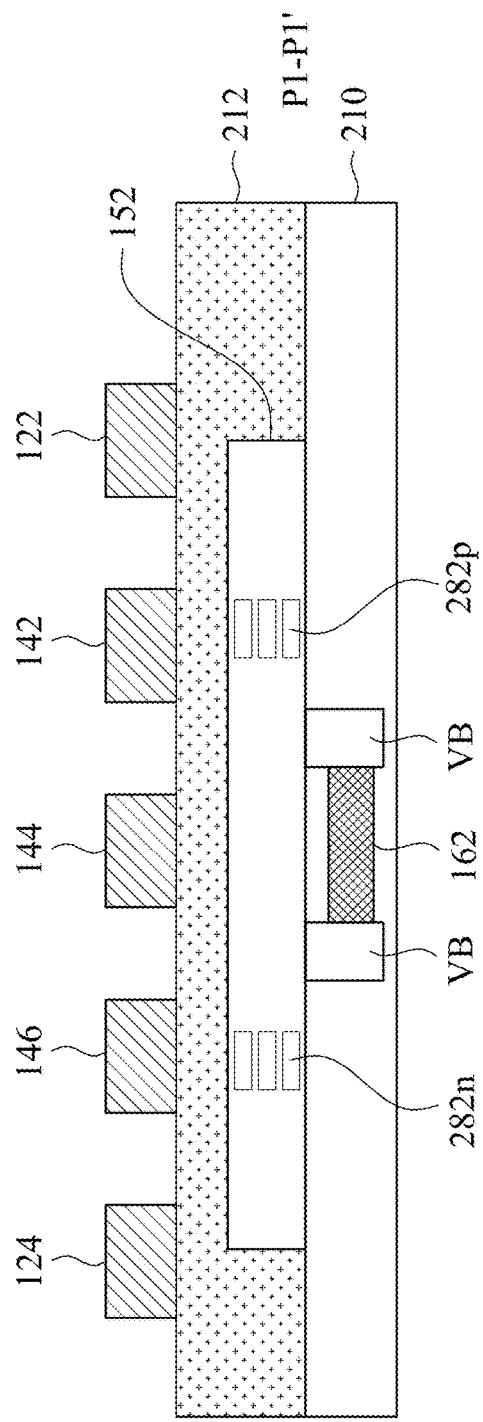

FIG. 2A is a cross-sectional view of the buffer logic gate 100 along the cutting plane P1-P1' as shown in FIG. 1B, in accordance with some embodiments. In FIG. 2A, the channel region 282p of the p-type transistor T2p, the channel region 282n of the n-type transistor T2n, and the gate-strip 152 are also formed at the front side of the substrate 210. The backside routing track 162 and the backside via connectors VB are formed at the backside of the substrate 210. The channel region 282p of the p-type transistor T2p and the channel region 282n of the n-type transistor T2n are formed with nanosheet materials. Correspondingly, the p-type transistor T2p and the n-type transistor T2n are both nanosheet transistors. In other embodiments, the channel region 282p of the p-type transistor T2p and the channel region 282n of the n-type transistor T2n are formed with nanowire materials, while the transistors T2p and T2n are nanowire transistors. In other embodiments, the channel region 282p of the p-type transistor T2p and the channel region 282n of the n-type transistor T2n are formed with fin structures, while the transistors T2p and T2n are fin transistors. In FIG. 2A, the gate-strip 152 is connected to the gate terminal of the p-type transistor T2p and the gate terminal of the n-type transistor T2n. The backside routing track 162 is conductively connected to the gate-strip 152 through the backside via connectors VB.

Figure 2B:
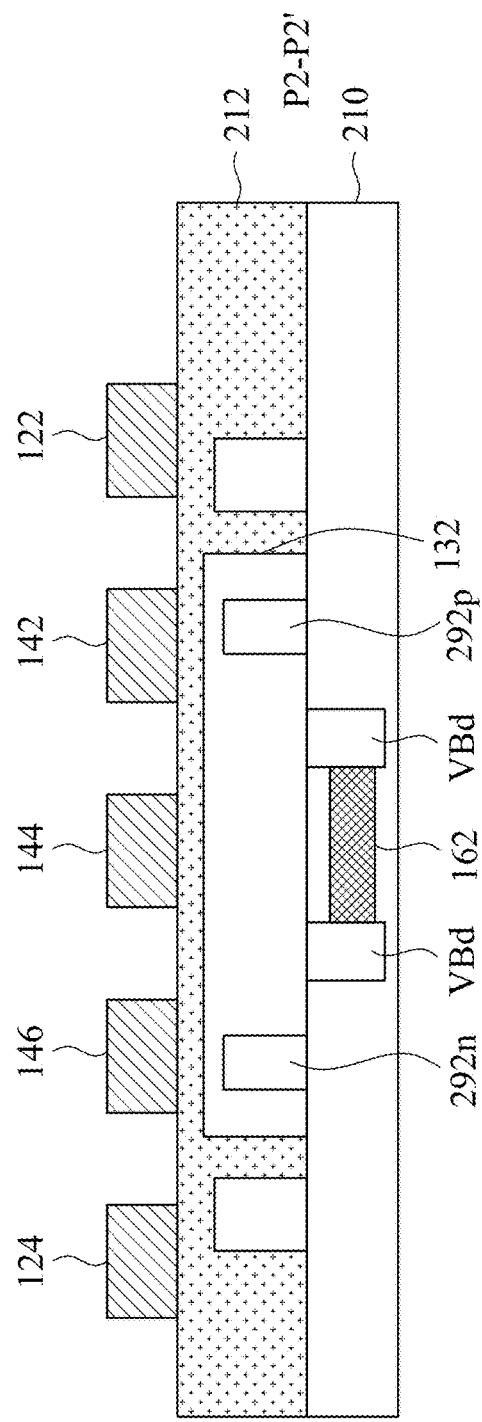

FIG. 2B is a cross-sectional view of the buffer logic gate 100 along the cutting plane P2-P2' as shown in FIG. 1B, in accordance with some embodiments. In FIG. 2B, the source/drain region 292p of the p-type transistors T1p, the source/drain region 292n of the n-type transistor T1n, and the conductive segments 132 are formed at the front side of the substrate 210. The backside routing track 162 and the backside via connectors VBd are formed at the backside of the substrate 210. The conductive segment 132 is connected to the drain terminal of the p-type transistor T1p and the drain terminal of the n-type transistor T1n. The backside routing track 162 is conductively connected to the conductive segment 132 through the backside via connectors VBd.

FIG. 2C is a cross-sectional view of the buffer logic gate 100 along the cutting plane P3-P3' as shown in FIG. 1A, in accordance with some embodiments. In FIG. 2C, the channel region 281p of the p-type transistor T1p, the channel region 281n of the n-type transistor T2n, the gate-strip 151, and the via connector VG are formed at the front side of the substrate 210. Examples of the p-type transistor T1p and the n-type transistor T2n include nanosheet transistors, nanowire transistors, and fin transistors. In FIG. 2C, the gate-strip 151 is connected to the gate terminal of the p-type transistor T1p and the gate terminal of the n-type transistor T1n. The horizontal routing track 144 is conductively connected to the gate-strip 151 through the via connector VG at the front side of the substrate 210.

FIG. 2D is a cross-sectional view of the buffer logic gate 100 along the cutting plane P4-P4' as shown in FIG. 1A, in accordance with some embodiments. In FIG. 2D, the source/drain region 296p of the p-type transistors T2p and T3p, the source/drain region 296n of the n-type transistors T2n and T3n, the conductive segments 136, and the via connector VD are formed at the front side of the substrate 210. The source/drain terminal 296p of the p-type transistors T2p and T3*p* are connected, through the conductive segment 136, to the source/drain terminal 296*n* of the n-type transistors T2*n* and T3*n*. The horizontal routing track 146 is conductively connected to the conductive segment 136 through the via connector VD at the front side of the substrate 210.

Figure 1D:
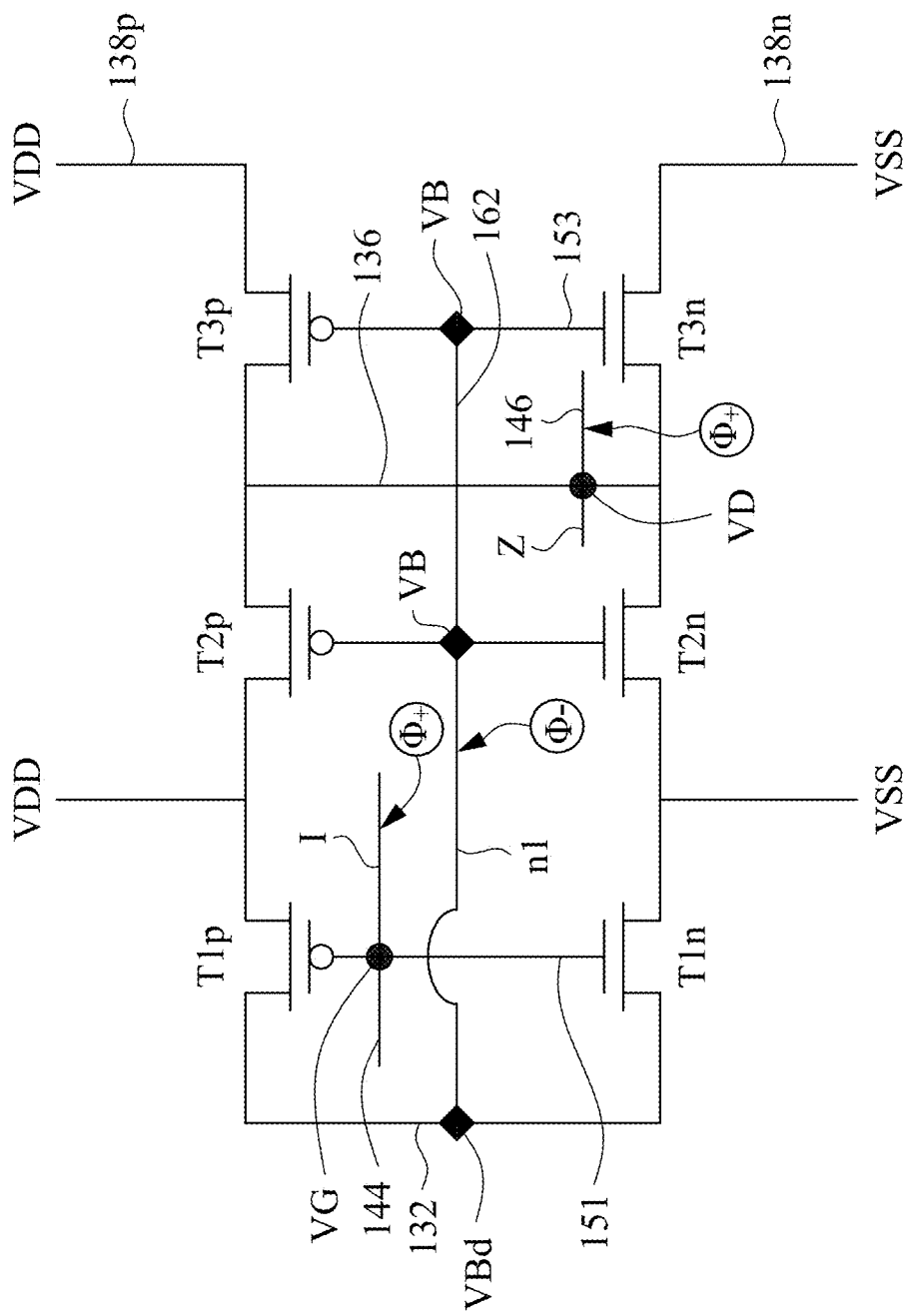
FIG. 1D is an equivalent circuit of the buffer logic gate of FIG. 1C, in accordance with some embodiments.

The locations of the backside via connectors VB, the backside via connector VBd, the via connector VG, and the via connector VD as shown in FIGS. 2A-2D are also schematically depicted in the stick diagram of FIG. 1C. FIG. 1D is an equivalent circuit of the buffer logic gate 100 as specified by the stick diagram in FIG. 1C, in accordance with some embodiments. In FIG. 1C and FIG. 1D, the source terminals of the p-type transistors T1*p*, T2*p*, and T3*p* are connected to the first power supply VDD, and the drain terminals of the n-type transistors T1*n*, T2*n*, and T3*n* are connected to the second power supply VSS. The gate terminal of the p-type transistor T1*p* and the gate terminal of the n-type transistor T1*n* are connected together by the gate-strip 151, the gate terminal of the p-type transistor T2*p* and the gate terminal of the n-type transistor T2*n* are connected together by the gate-strip 152, and the gate terminal of the p-type transistor T3*p* and the gate terminal of the n-type transistor T3*n* are connected together by the gate-strip 153. The drain terminal of the p-type transistor T1*p* and the drain terminal of the n-type transistor T1*n* are connected together by the conductive segment 132. The drain terminals of the p-type transistors T2*p* and T3*p* are connected to the drain terminals of the n-type transistors T2*n* and T3*n* by the conductive segment 136. The conductive segment 132 is conductively connected to the gate-strips 152 and 153 through the backside routing track 162, after conductively passing through the backside via connectors VBd and VB. The horizontal routing track 144 is conductively connected to the gate-strip 151 through the front end via connectors VG and provides the input terminal "I" for the buffer logic gate 100. The horizontal routing track 146 is conductively connected to the conductive segment 136 through the front end via connectors VD and provides the output terminal "Z" for the buffer logic gate 100.

Figure 1E:
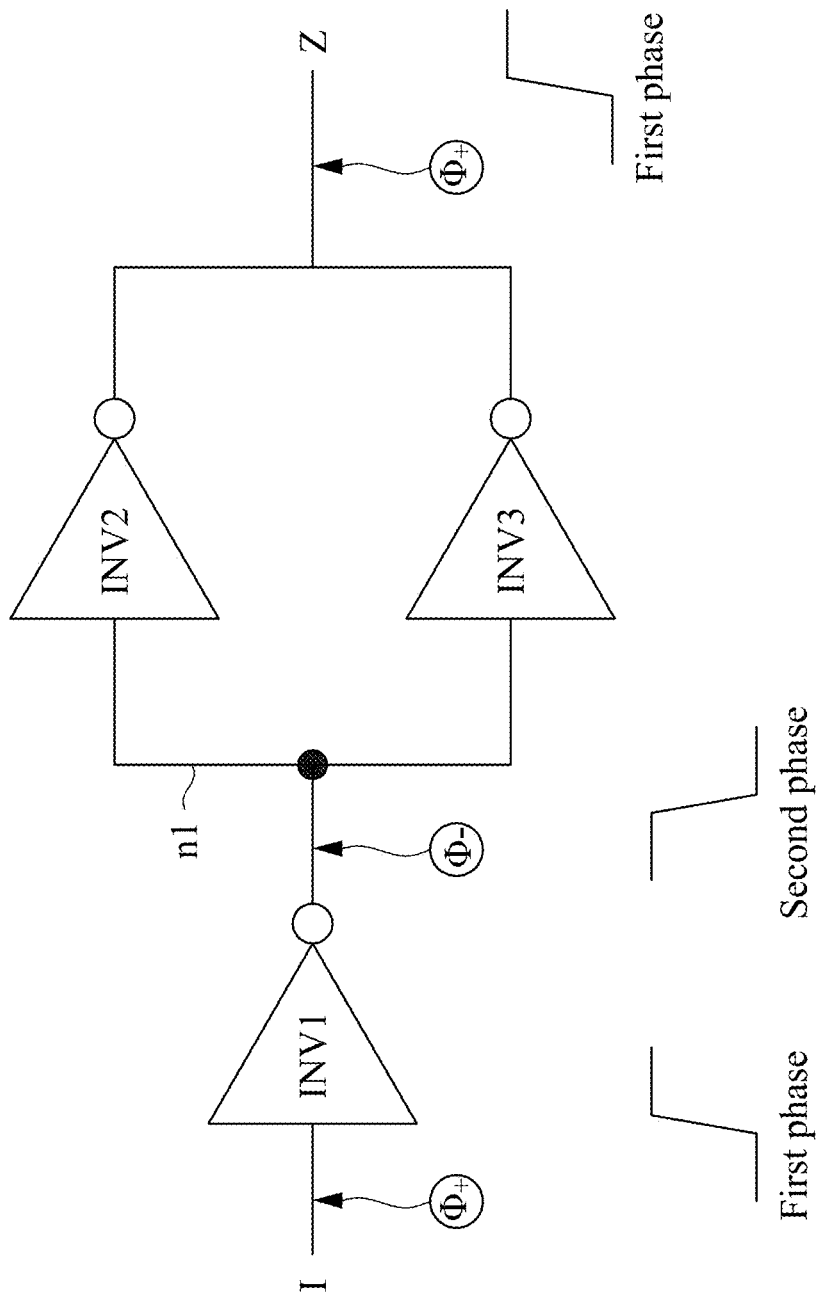
FIG. 1E is a circuit diagram of the logic gates formed from the transistors in FIG. 1D, in accordance with some embodiments.

FIG. 1E is a circuit diagram of the logic gates formed from the transistors in FIG. 1D, in accordance with some embodiments. The p-type transistor T1*p* and the n-type transistor T1*n* in FIG. 1D are connected to form an inverter INV1. The p-type transistor T2*p* and the n-type transistor T2*n* in FIG. 1D are connected to form an inverter INV2. The p-type transistor T3*p* and the n-type transistor T3*n* in FIG. 1D are connected to form an inverter INV3. The inverter INV1 receives a first digital input signal from the input terminal "I" and generates a first digital output signal at the intermediate node "n1" between the output of the inverter INV1 and the inputs of the inverters INV2 and INV3. The inverters INV2 and INV3 receive the first digital output signal at the intermediate node "n1" and generates a second digital output signal at the output terminal "Z." The buffer logic gate 100 is formed by the inverters INV1, INV2, and INV3.

In FIG. 1E, the digital input signal received at the input terminal "I" has a first phase $\Phi_+$, the intermediate output signal at the intermediate node "n1" has a second phase $\Phi_-$, and the output signal generated at the output terminal "Z" has the first phase $\Phi_+$. Because the phase of the intermediate output signal at the intermediate node "n1" is opposite to the phase of the input signal at the input terminal "I", whenever the input signal changes from a first voltage level to a second voltage level, the intermediate output signal correspondingly changes from the second voltage level to the first voltage level. If the first voltage level is logic HIGH, the second voltage level is logic LOW. If the first voltage level is logic LOW, the second voltage level is logic HIGH. Similarly, because the phase of the output signal generated at the output terminal "Z" is opposite the phase of the intermediate output signal at the intermediate node "n1", whenever the intermediate output signal changes from the second voltage level to the first voltage level, the output signal generated at the output terminal "Z" correspondingly changes from the first voltage level to the second voltage level.

FIG. 1F is a stick diagram of the buffer logic gate 100 formed by the layout diagrams in FIGS. 1A-1B, in accordance with some embodiments. The stick diagram in FIG. 1F is a modification of the stick diagram in FIG. 1C, by labeling the phases of varies signals on the routing tracks. The input signal having the first phase $\Phi_+$ is carried by the horizontal routing track 144, and the output signal having the first phase $\Phi_+$ is carried by the horizontal routing track 146. The intermediate output signal having the second phase $\Phi_-$ at the intermediate node "n1" is carried by the backside routing track 162. When the routing track carrying the input signal with the first phase $\Phi_+$ is adjacent to the routing track carrying the intermediate output signal with the second phase $\Phi_-$ that is opposite to the first phase $\Phi_+$, the capacitive coupling between the two adjacent routing tracks often reduces the speed performance and increases the power consumption of the logic circuit. In the layout of FIGS. 1A-1B, the capacitive coupling between the backside routing track 162 and each of the horizontal routing tracks 144 and 146 is smaller than the capacitive coupling between two adjacent horizontal routing tracks 144 and 146. When the intermediate node "n1" is placed on the backside routing track 162, the speed and the power consumption of the buffer logic gate 100 are improved over some other approaches in which some signals of opposite phases are carried by two adjacent horizontal routing tracks.

Figure 3A:
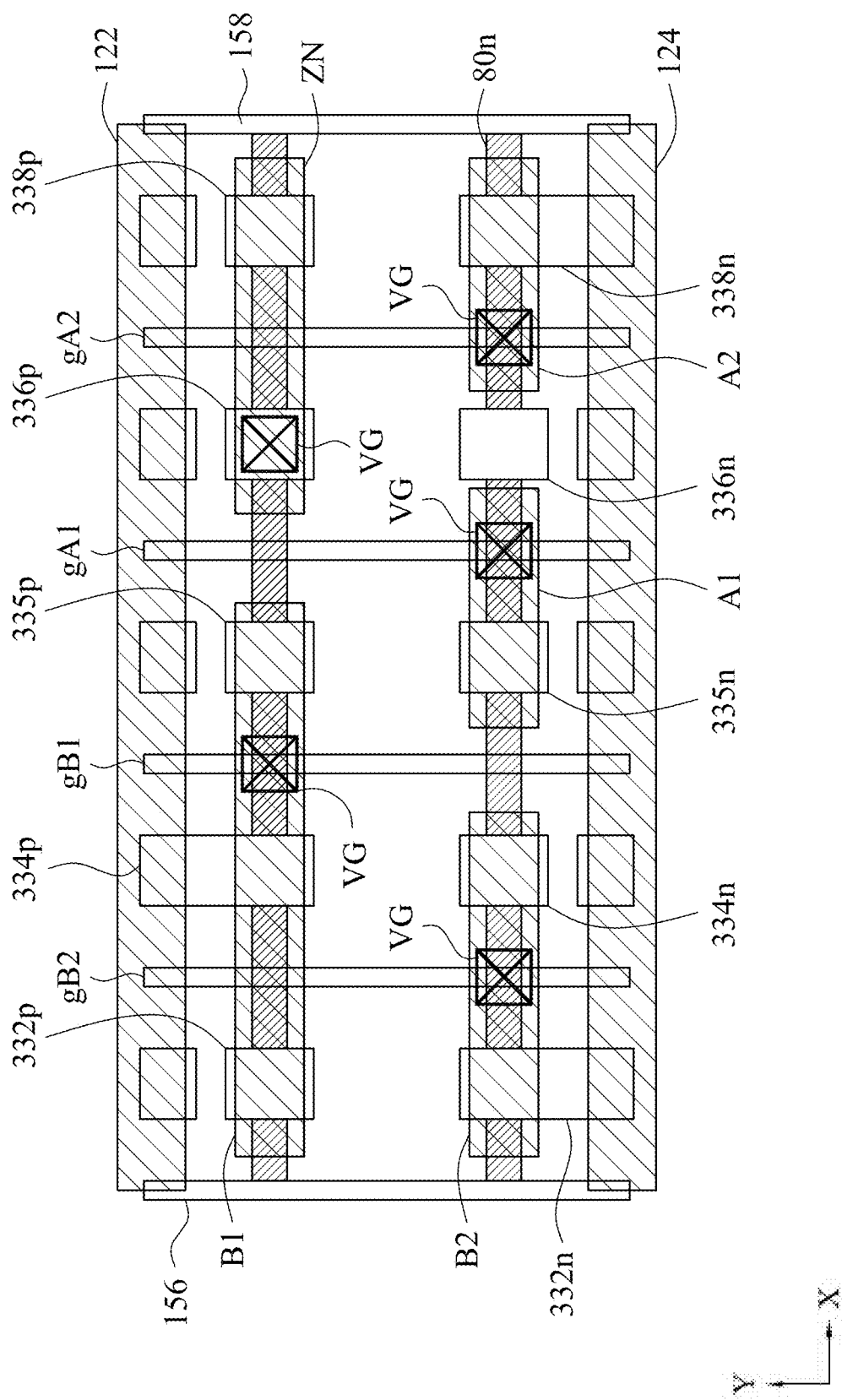
FIGS. 3A-3B are partial layout diagrams of an And-Or-Invertor ("AOI") logic circuit having two backside routing tracks, in accordance with some embodiments.
Figure 3B:
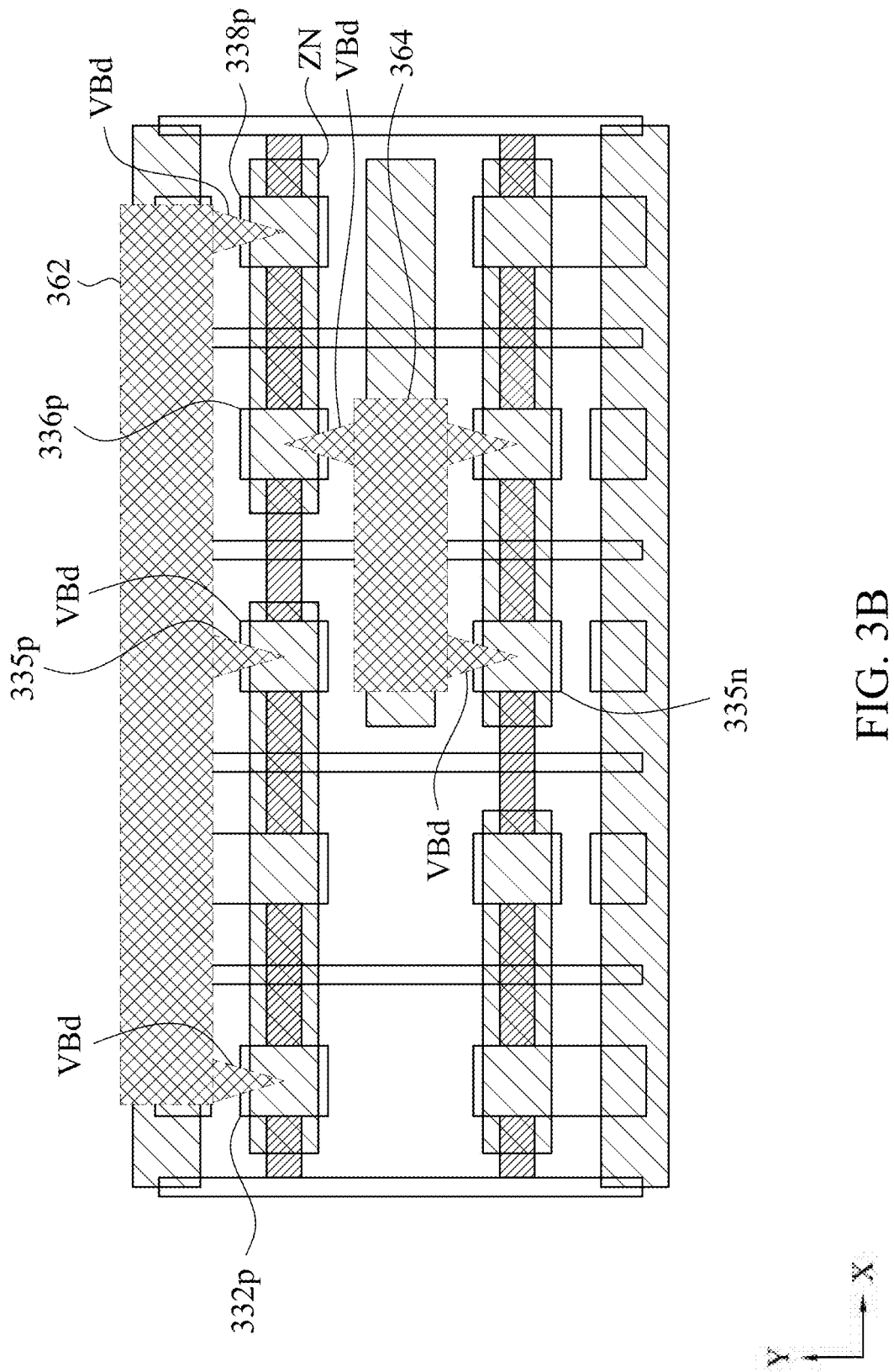
Figure 3C:
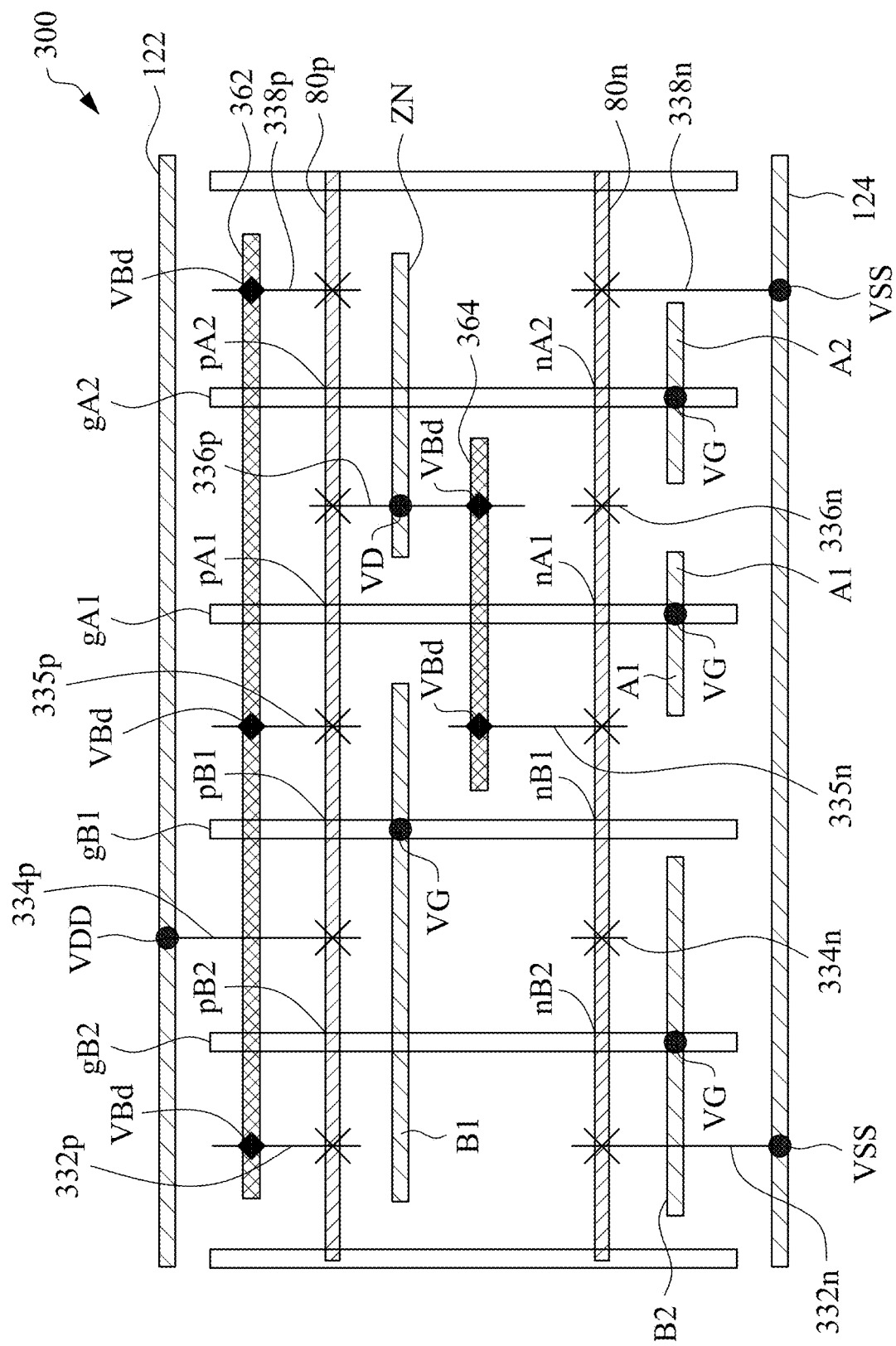
FIG. 3C is a stick diagram of the AOI logic circuit of FIGS. 3A-3B, in accordance with some embodiments.
Figure 5A:
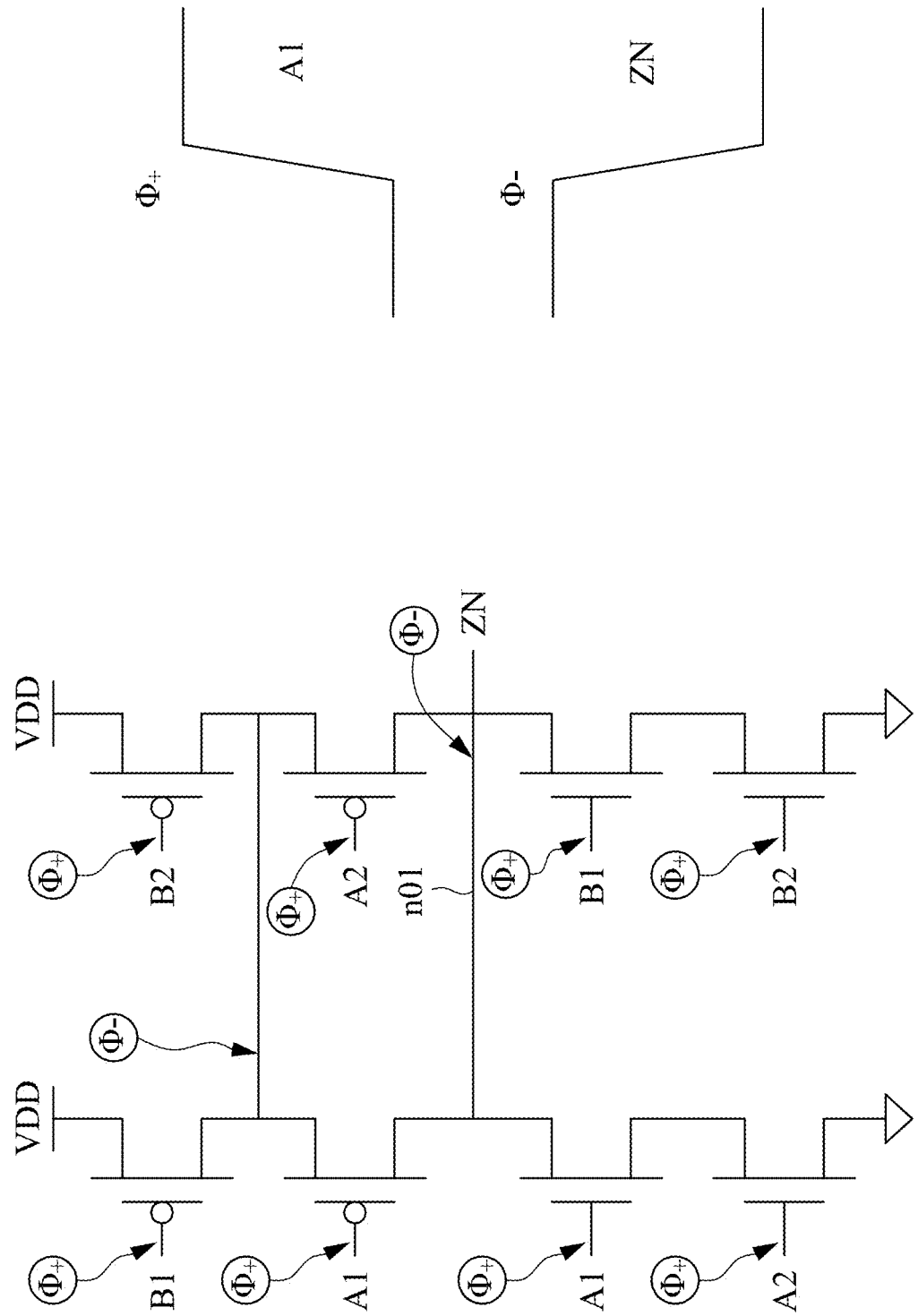
FIG. 5A is a circuit diagram of the AOI logic circuit, in accordance with some embodiments.
Figure 5B:
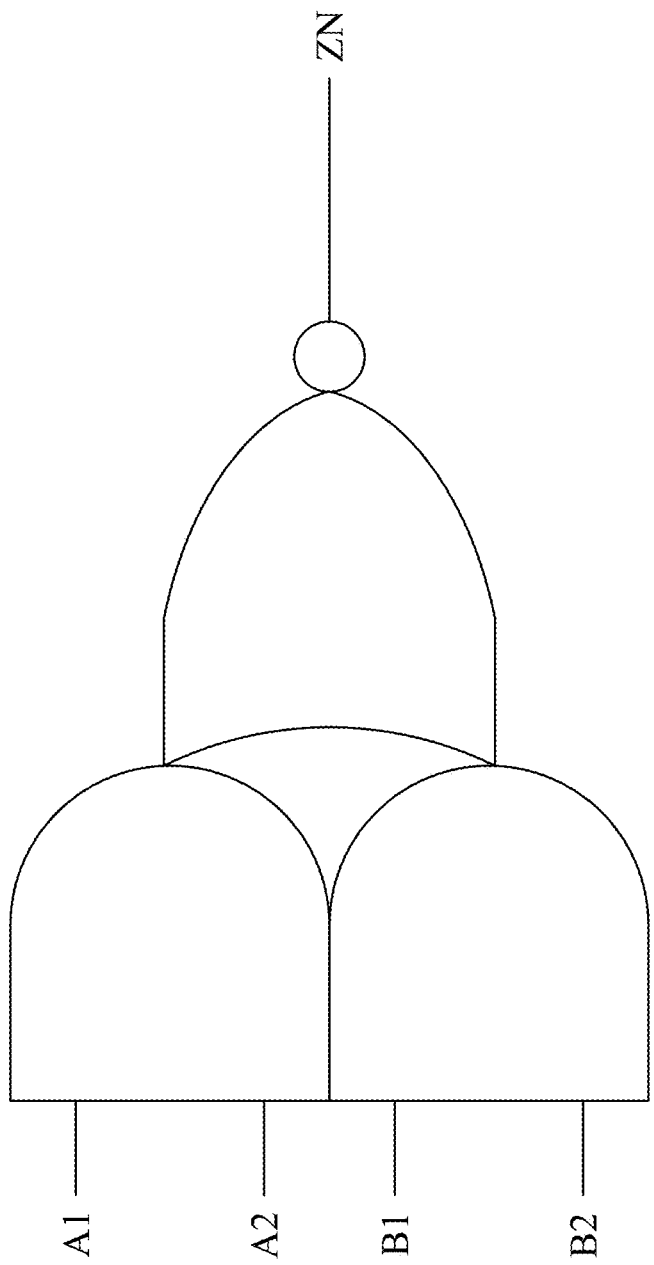
FIG. 5B is a logic symbol of the AOI logic circuit in FIG. 5A, in accordance with some embodiments.

FIGS. 3A-3B are partial layout diagrams of an And-Or-Invertor ("AOI") logic circuit 300 having two backside routing tracks, in accordance with some embodiments. In FIG. 3A, elements formed on the front side of the substrate are shown in corresponding layout patterns. In FIG. 3B, the backside routing track and the backside via connectors formed on the back side of the substrate are depicted with layout patterns superimposed on the layout patterns in FIG. 3A, while ignoring the depiction of the front side via connectors VG and VD, for better clarity. FIG. 3C is a stick diagram of the AOI logic circuit 300 formed by the layout diagrams in FIGS. 3A-3B, in accordance with some embodiments. The AOI logic circuit 300 formed by the layout diagrams in FIGS. 3A-3B is an example of the 2-2 AOI logic circuit in FIG. 5A. The logic symbol of the 2-2 AOI logic circuit is shown in FIG. 5B. In FIGS. 5A-5B, the output ZN is related to the inputs A1, A2, B1, and B2 by the logic relationship ZN=$\overline{(A1 \cdot A2 + B1 \cdot B2)}$.

FIG. 5A is a circuit diagram of the AOI logic circuit, in accordance with some embodiments. In FIG. 5A, the source terminals of the p-type transistors having inputs B1 and B2 are connected to the power supply VDD. The drain terminals of the p-type transistors having inputs B1 and B2 are connected together as the node n01. The source terminals of the p-type transistors having inputs A1 and A2 are also connected to the node n01. The drain terminals of the p-type transistors having inputs A1 and A2 are connected together as the output terminal ZN. The drain terminals of the n-type transistors having inputs A1 and B1 are also connected to the output terminal ZN. The source terminal of the n-type transistor having inputs A1 is connected to the drain terminal of the n-type transistor having input A2, and the source terminal of the n-type transistor having inputs B1 is connected to the drain terminal of the n-type transistor having input B2. The source terminals of the n-type transistors having inputs A2 and B2 are connected to the power supply VSS.

In FIG. 5A, the voltage level change at the output terminal ZN induced by the voltage level change at an input terminal (such as A1, A2, B1, or B2) has the second phase $\Phi_-$ that is opposite to the first phase $\Phi_+$ of the input voltage level change. As an example, the voltage level change at the output terminal ZN induced by the voltage level change at the input A1 is depicted in the inset of FIG. 5A. When the signal at the input A1 changes from a first voltage level to a second voltage level, the signal at the output terminal ZN correspondingly changes from the second voltage level to the first voltage level. In the layout design of FIGS. 3A-3B, when two adjacent routing tracks on a same metal layer do not carry signals with opposite phases, both the speed and the power consumption of the AOI logic circuit 300 are improved, as compared with some other approaches in which some signals of opposite phases are placed on two adjacent horizontal routing tracks.

Figure 3D:
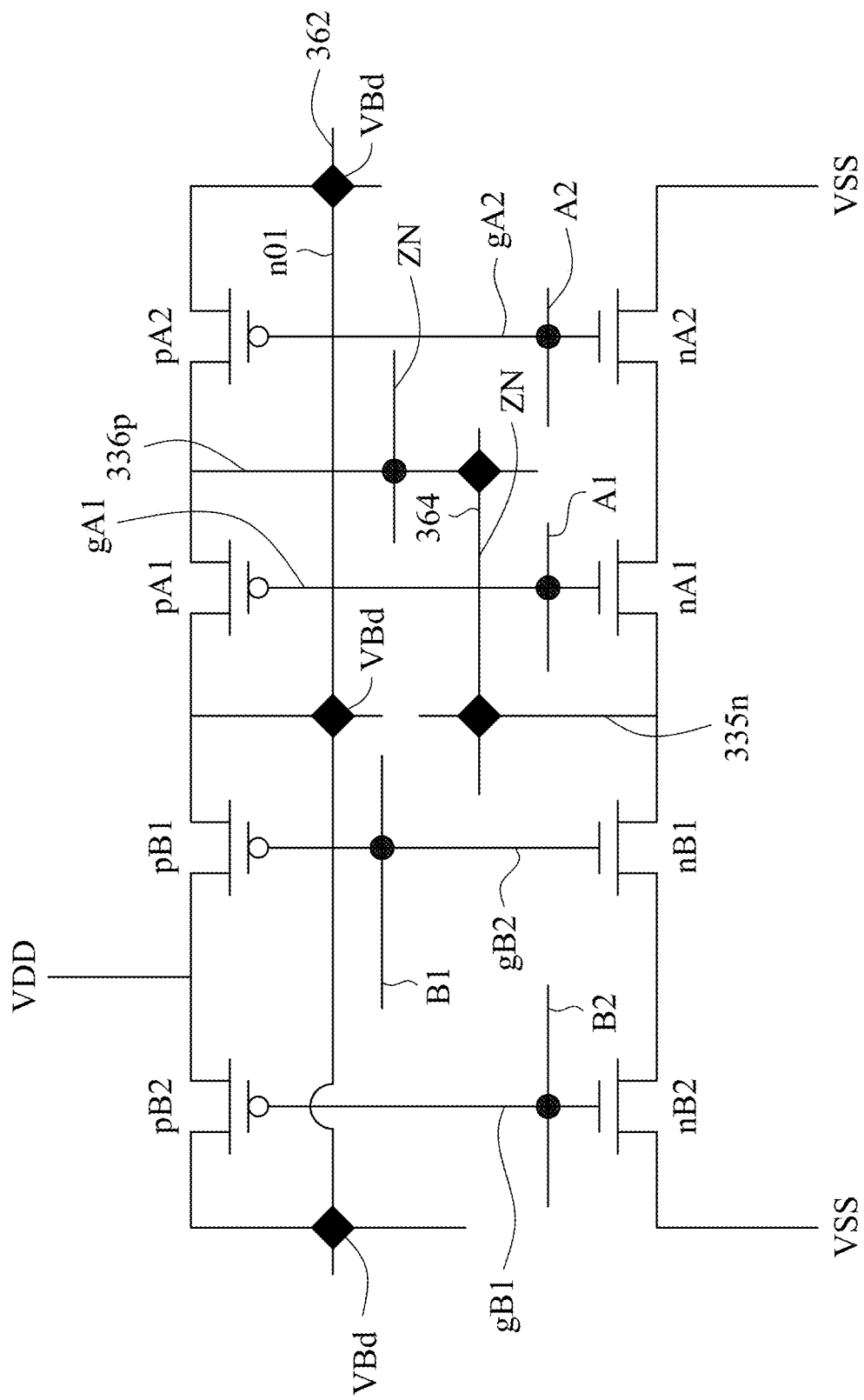
FIG. 3D is an equivalent circuit of the AOI logic circuit of FIG. 3C, in accordance with some embodiments.

The elements formed on the front side of the substrate and specified by the layout patterns in FIG. 3A include the active zones, the gate-strips, the conductive segments, the horizontal routing tracks, the power rails, and the via connectors. In FIG. 3A, the p-type active zone 80$p$ and the n-type active zone 80$n$ are both extending in the X-direction. Each of the gate-strips gA1, gA2, gB1, gB2, extending in the Y-direction, overlaps the p-type active zone 80$p$ and forms correspondingly the gate terminals of the p-type transistors pA1, pA2, pB1, and pB2 (as shown in FIGS. 3C-3D). Each of the gate-strips gA1, gA2, gB1, gB2 also overlaps the n-type active zone 80$n$ and forms correspondingly the gate terminals of the n-type transistors nA1, nA2, nB1, and nB2 (as shown in FIGS. 3C-3D). The gate-strips 156 and 158 are dummy gate-strips.

In FIG. 3A and FIG. 3C, the conductive segments 332$p$, 334$p$, 335$p$, 336$p$, and 338$p$ overlap the p-type active zone 80$p$ and form the source/drain terminals of the p-type transistors. The conductive segments 332$n$, 334$n$, 335$n$, 336$n$, and 338$n$ overlap the n-type active zone 80$n$ and form the source/drain terminals of the n-type. The horizontal routing tracks A1, A2, B1, B2, and ZN extending in the X-direction are formed in a first metal layer M0 on the front side of the substrate. The horizontal routing tracks A1, A2, B1, B2 are correspondingly connected to the gate-strips gA1, gA2, gB1, gB2 through the via connector VG formed on the front side of the substrate. The horizontal routing track ZN is connected to the conductive segment 336$p$ through the via connector VD. The conductive segment 336 is located between the gate-strips gA1 and gA2. The power rails 122 and 124 extending in the X-direction are configured to provide correspondingly the supply voltages VDD and VSS. The conductive segment 334$p$ (located between the gate-strips gB1 and gB2) is connected to the power rail 122 for receiving the supply voltage VDD. The conductive segments 332$p$ (located between the gate-strips gB2 and dummy gate-strip 156) and the conductive segments 332$p$ (located between the gate-strips gA2 and dummy gate-strip 158) are both connected to the power rail 124 for receiving the supply voltage VSS.

The elements formed on the back side of the substrate and specified by the layout patterns in FIG. 3B include the backside routing tracks 362 and 364, and the backside via connectors VBd. In FIG. 3B and FIG. 3C, the backside routing track 362 is connected to the conductive segments 332$p$, 335$p$, and 338$p$ through the backside via connectors VBd. The backside routing track 364 is connected to the conductive segments 335$n$ and 336$p$ through the backside via connectors VBd.

FIG. 3D is an equivalent circuit of the AOI logic circuit 300 as specified by the stick diagram in FIG. 3C, in accordance with some embodiments. In FIGS. 3C and 3D, the gate terminals of the p-type transistor pB2 and the n-type transistor nB2 are connected together by the gate-strip gB2, the gate terminals of the p-type transistor pB1 and the n-type transistor nB1 are connected together by the gate-strip gB1, the gate terminals of the p-type transistor pA1 and the n-type transistor nA1 are connected together by the gate-strip gA1, and the gate terminals of the p-type transistor pA2 and the n-type transistor nA2 are connected together by the gate-strip gA2. The source terminals of the p-type transistors pB2 and pB1 are connected to the power supply VDD. The drain terminals of the p-type transistors pB2 and pB1 are connected to the source terminals of the p-type transistors pA1 and pA2 through the backside routing track 362. The drain terminals (on the conductive segment 336$p$) of the p-type transistors pA1 and pA2 are connected to the drain terminals (on the conductive segment 335$n$) of the n-type transistors nB1 and nA1 through the backside routing track 364. The source terminal of the n-type transistor nB1 and the source terminal of the n-type transistor nA1 are correspondingly connected to the drain terminal of the n-type transistor nB2 and the drain terminal of the n-type transistor nA2. The source terminals of the n-type transistors nB2 and nA2 are connected to the power supply VSS. The horizontal routing tracks A1, A2, B1, and B2 (which are correspondingly connected to the gate-strips gA1, gA2, gB1, and gB2) are configured to receive the input signals. The horizontal routing tracks ZN (which is connected to the conductive segment 336$p$) is configured to transmit the output signal.

Figure 3E:
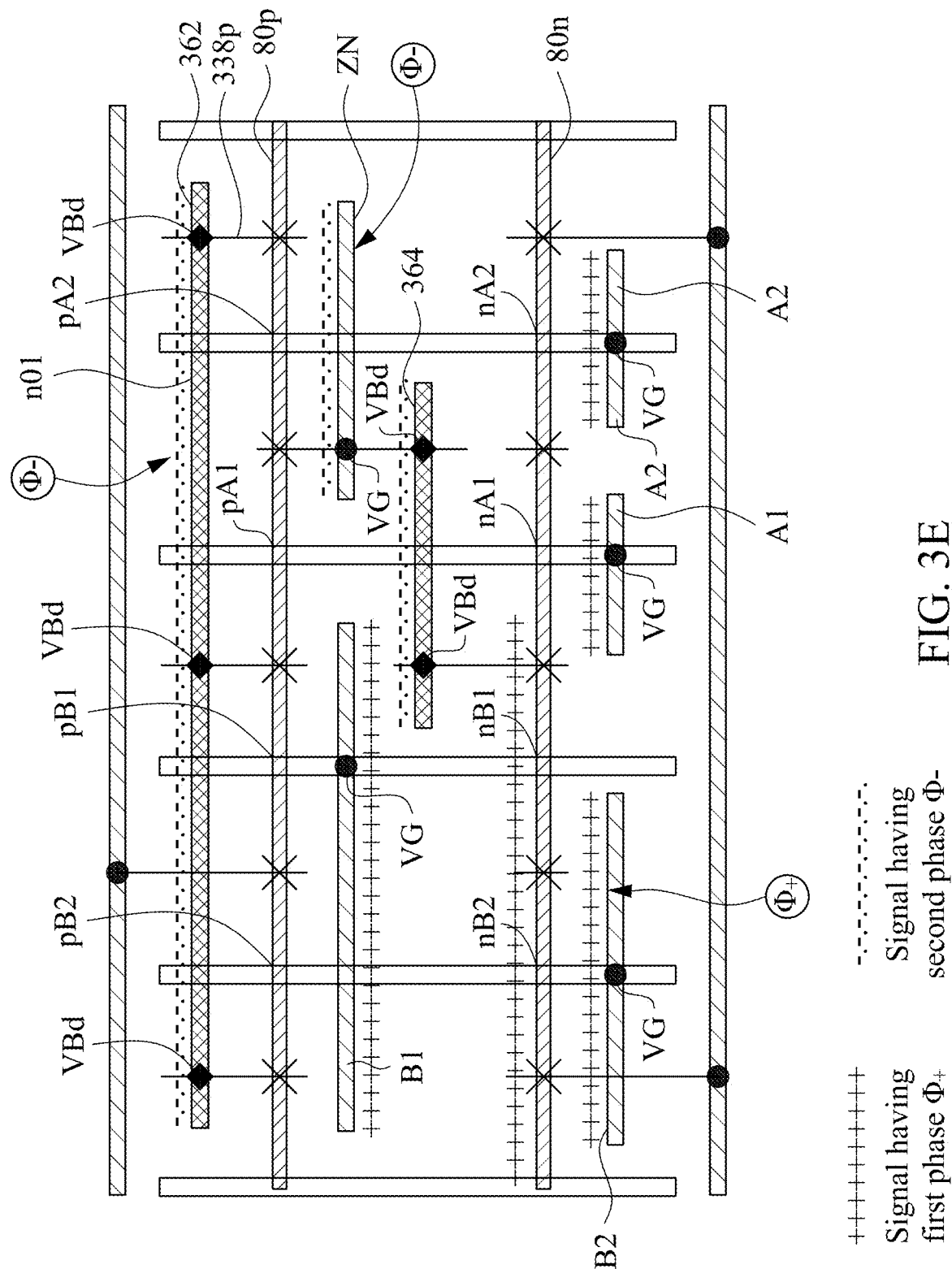
FIG. 3E is a stick diagram of the AOI logic circuit of FIGS. 3A-3B, in accordance with some embodiments.

FIG. 3E is another stick diagram of the AOI logic circuit 300 formed by the layout diagrams in FIGS. 3A-3B, in accordance with some embodiments. The stick diagram in FIG. 3E is a modification of the stick diagram in FIG. 3C, by labeling the phases of varies signals on the routing tracks. The input signals A1, A2, B1, and B2 of the AOI logic circuit 300 are correspondingly carried by the horizontal routing tracks A1, A2, B1, and B2. The output signal ZN of the AOI logic circuit 300 is carried by the horizontal routing track ZN and the backside routing track 364. The intermediate signal at the node "n01" received from the drain terminals of the p-type transistors B1 and B2 is carried by the backside routing track 362. In FIG. 3E, the horizontal routing tracks A1, A2, B1, and B2 carry signals with the first phase $\Phi_+$. The backside routing tracks 362 and 364 carry signals with the second phase $\Phi_-$. The horizontal routing track ZN also carry signals with the second phase $\Phi_-$. In the layout designs in FIGS. 3A-3B, adjacent routing tracks on a same metal layer do not carry signals with opposite phases, and the speed and the power consumption of the AOI logic circuit 300 are improved. In FIGS. 3A-3B, signals with the first phase $\Phi_+$ are carried by the horizontal routing tracks (e.g., A1, A2, B1, and B2) on the front side of the substrate, while signals with the second phase $\Phi_-$ are carried by the backside routing tracks (e.g., 362 and 364) on the backside of the substrate.

Figure 4A:
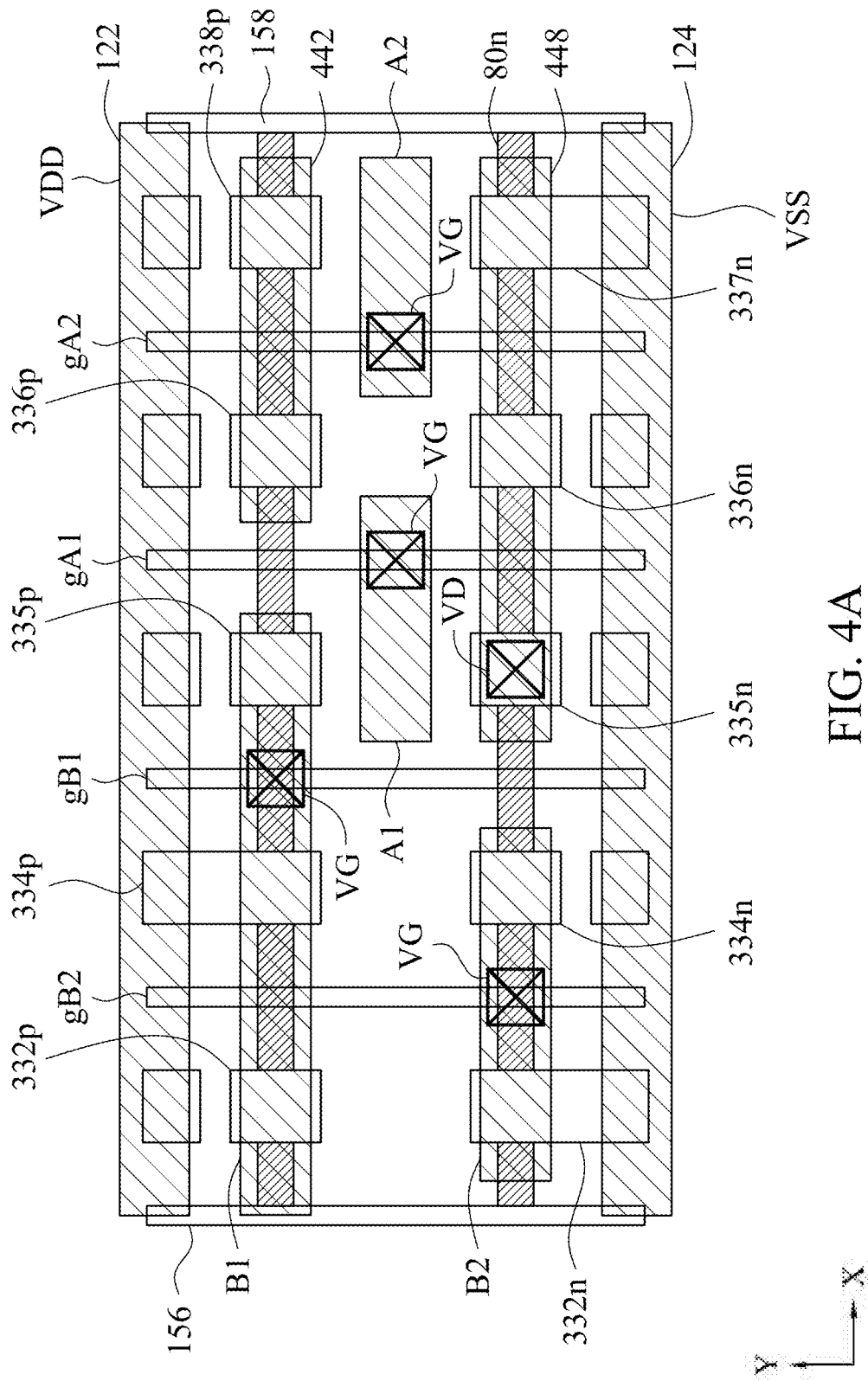
FIGS. 4A-4C are partial layout diagrams of an AOI logic circuit having one backside routing track, in accordance with some embodiments.
Figure 4B:
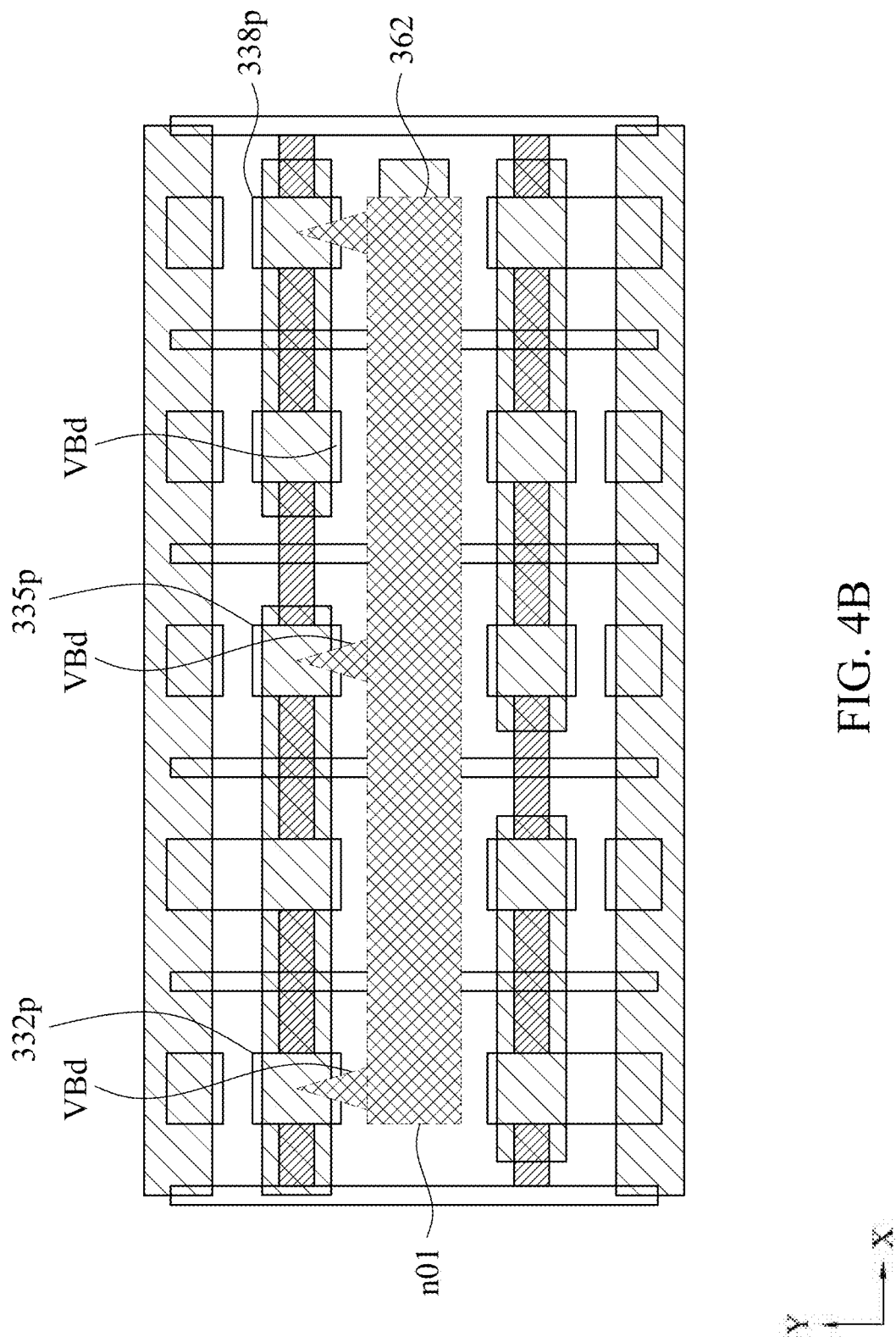
Figure 4C:
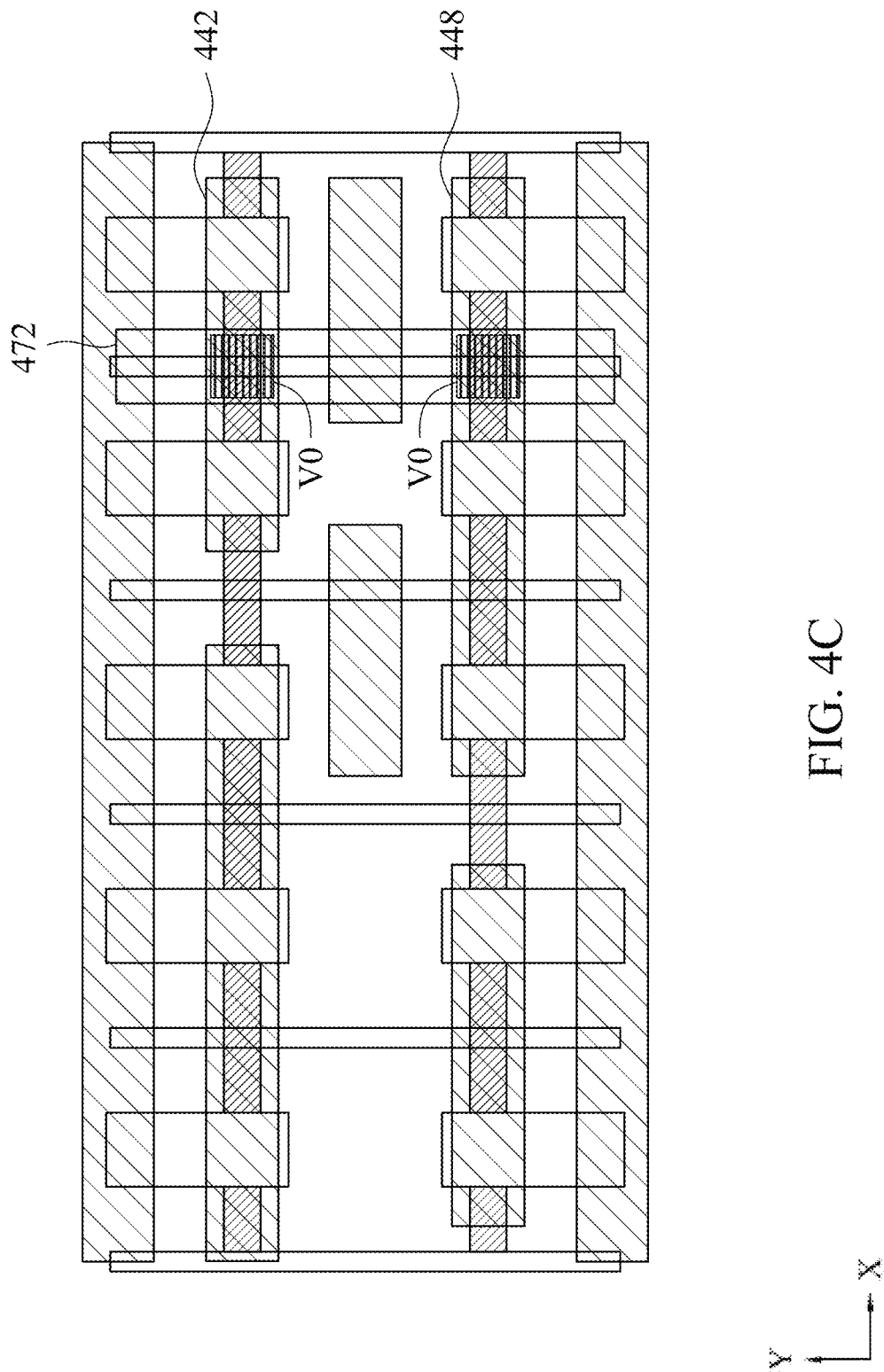
Figure 4D:
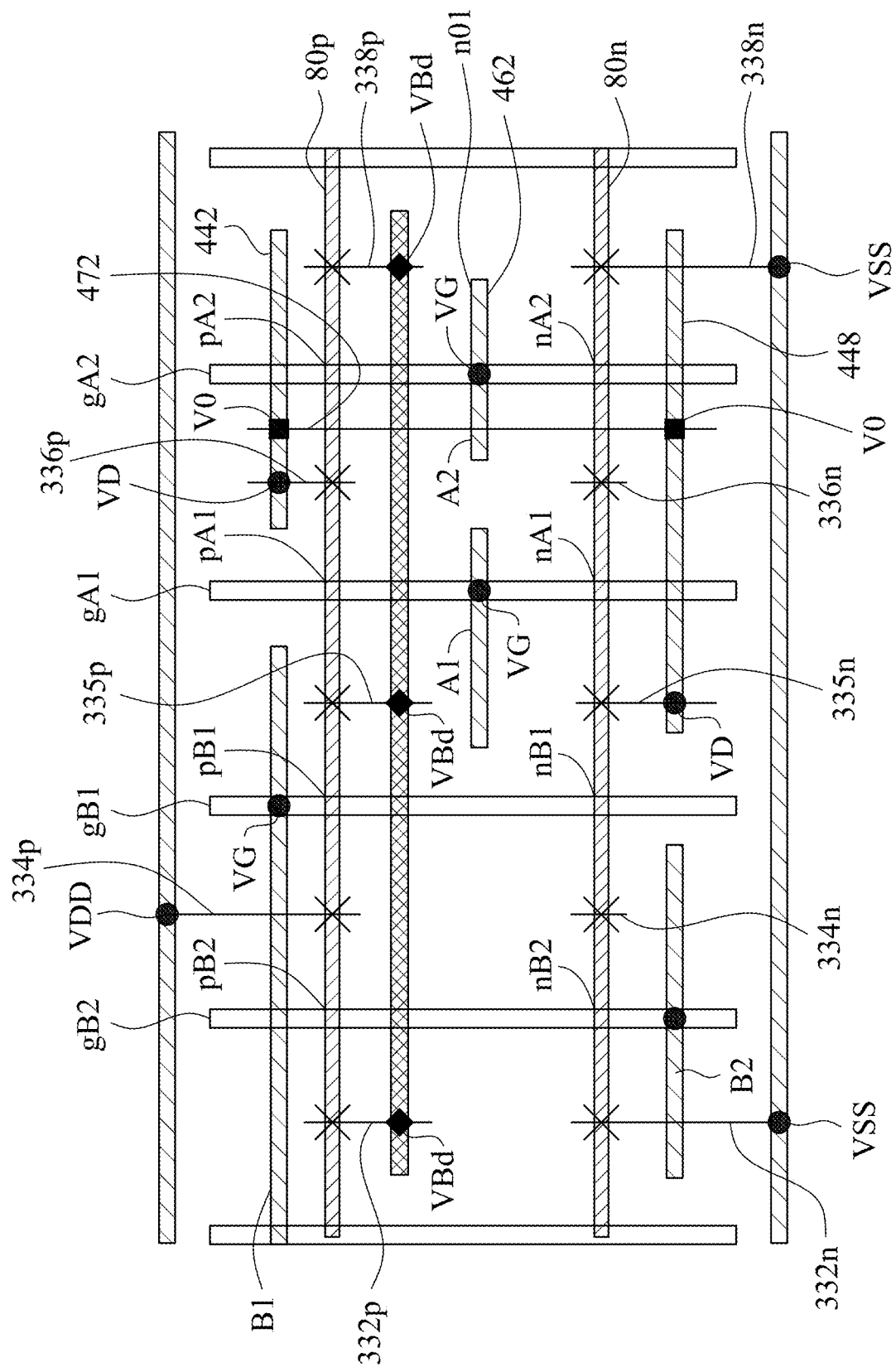
FIG. 4D is a stick diagram of the AOI logic circuit of FIGS. 4A-4C, in accordance with some embodiments.

Another example layout design of the 2-2 AOI logic circuit in FIGS. 5A-5B is the AOI logic circuit 400 formed by the layout diagrams in FIGS. 4A-4C. In FIGS. 5A-5B, the output ZN is related to the inputs A1, A2, B1, and B2 and expressed as the logic relationship ZN=$\overline{(A1 \cdot A2 + B1 \cdot B2)}$. FIGS. 4A-4C are partial layout diagrams of an AOI logic circuit 400 having one backside routing track, in accordance with some embodiments. FIG. 4D is a stick diagram of the AOI logic circuit 400 formed by the layout diagrams in FIGS. 4A-4C, in accordance with some embodiments.

In FIG. 4A and FIG. 4C, elements formed on the front side of the substrate are selectively shown in corresponding layout patterns. The elements formed on the front side of the substrate and specified by the layout patterns in FIG. 4A include the active zones, the gate-strips, conductive segments, the horizontal routing tracks, power rails, and the front side via connectors. Some of the elements in the layout of FIG. 4A are arranged identically as the corresponding elements in the layout of FIG. 3A. The identically arranged elements include the active zones 80p and 80n, the gate-strips gA1, gA2, gB1, and gB2, the power rails 122 and 124, the conductive segments (332p, 334p, 335p, 336p, 338p, 332n, 334n, 335n, 336n, and 338n), and some of the horizontal routing tracks B1, and B2. In comparison with the layout of FIG. 3A, some of the horizontal routing tracks A1, and A2 in FIG. 4A are modified to shift in positions along the Y-direction. In both FIG. 4A and FIG. 3A, each of the horizontal routing tracks A1, A2, B1, and B2 is correspondingly connected to one of the gate-strips gA1, gA2, gB1, and gB2 through the via connectors VG. A comparison between the layouts of FIG. 4A and FIG. 3A indicates that the horizontal routing track ZN is substituted with the horizontal routing tracks 442 and 448.

In FIG. 4B, the backside routing track 362 and the backside via connectors VBd formed on the back side of the substrate are depicted with layout patterns superimposed on the layout patterns in FIG. 4A, while ignoring the depiction of the front side via connectors VG and VD, for better clarity. The position of the backside routing track 362 is modified along the Y-direction, when the layout of FIG. 4B is compared with the layout of FIG. 3B. Similar to the layout in FIG. 3B, the backside routing track 362 in the layout of FIG. 4B is also connected to the conductive segments 332p, 335p, and 338p through the backside via connectors VBd. A comparison between the layouts of FIG. 4B and FIG. 3B indicates that the backside routing track 364 is removed in the layout of FIG. 4B.

In FIG. 4C, the vertical routing track 472 and the via connectors V0 are depicted with layout patterns superimposed on the layout patterns in FIG. 4A, while ignoring the depiction of the front side via connectors VG and VD, for better clarity. The vertical routing track 472 extending in the Y-direction is formed in a second metal layer M1 on top of the interlayer dielectric overlying the first metal layer M0. The vertical routing track 472 is connected to the horizontal routing tracks 442 and 448 through the via connectors V0 between the second metal layer M1 and the first metal layer M0.

The stick diagram of the AOI logic circuit 400 in FIG. 4D is almost identical to the stick diagram of the AOI logic circuit 300 in FIG. 3C, other than the different routes of connections between the conductive segment 336p and the conductive segments 335n. In the stick diagram of FIG. 4D, the conductive segment 336p is connected to the horizontal routing track 442 through the via connector VD, the horizontal routing track 442 is connected to the vertical routing track 472 through the via connector V0, the vertical routing track 472 is connected to the horizontal routing track 448 through the via connector V0, the horizontal routing track 448 is connected to the conductive segment 335n through the via connector VD. As a comparison, in the stick diagram of FIG. 3C, the conductive segment 336p is connected to the conductive segments 335n through the backside routing track 364 and the backside via connectors VBd.

Figure 4E:
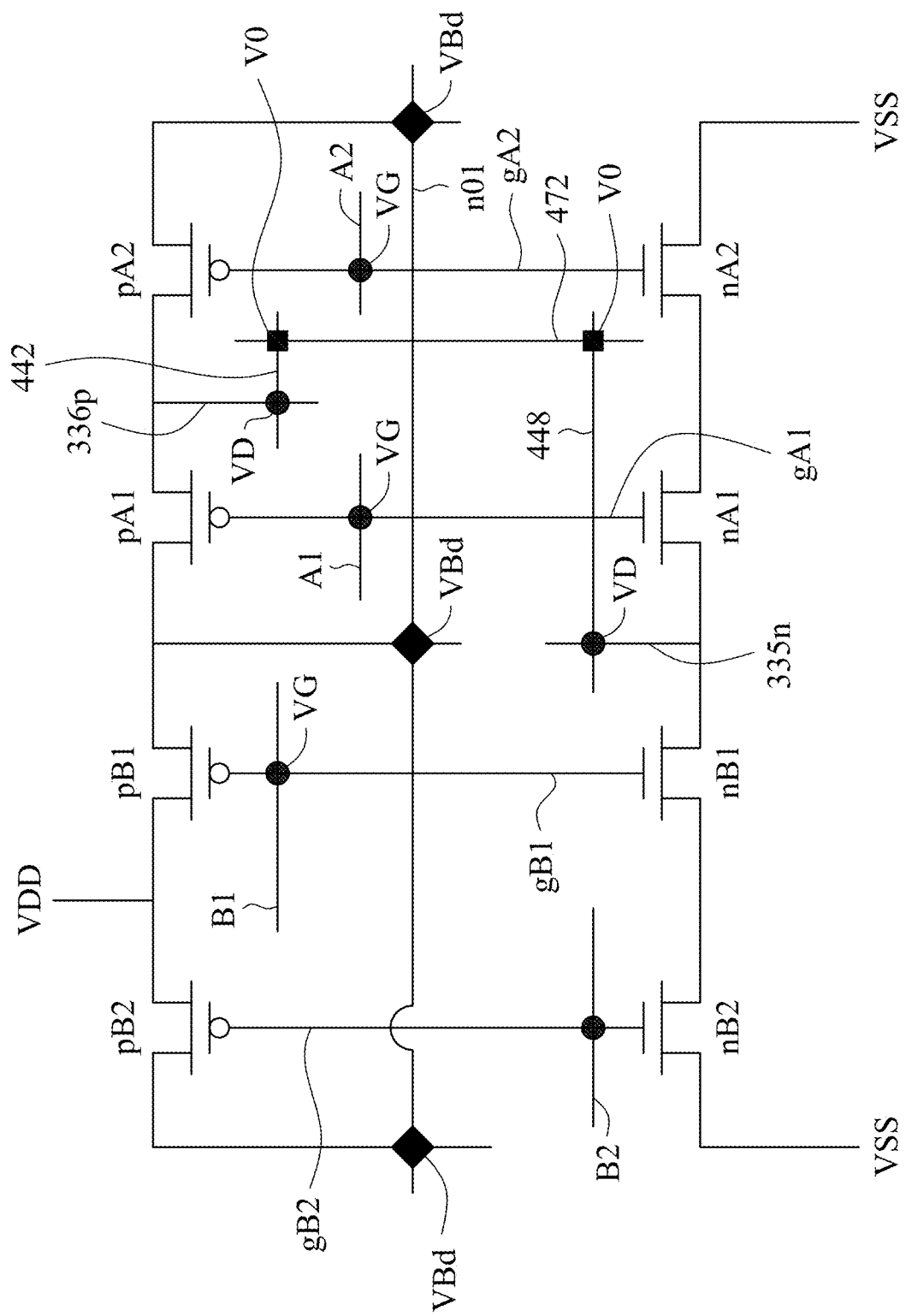
FIG. 4E is an equivalent circuit of the AOI logic circuit of FIG. 4D, in accordance with some embodiments.

FIG. 4E is an equivalent circuit of the AOI logic circuit 400 as specified by the stick diagram in FIG. 4D, in accordance with some embodiments. With the exception of the conductive connection from the conductive segments 336p to the conductive segments 335n, the circuit connections in FIG. 4E and in FIG. 3D are identical. In FIG. 4E, the conductive segments 336p is connected to the conductive segments 335n through the horizontal routing track 442, the vertical routing track 472, and the horizontal routing track 448. In FIG. 3D, the conductive segments 336p is connected to the conductive segments 335n through the backside routing track 364.

Figure 4F:
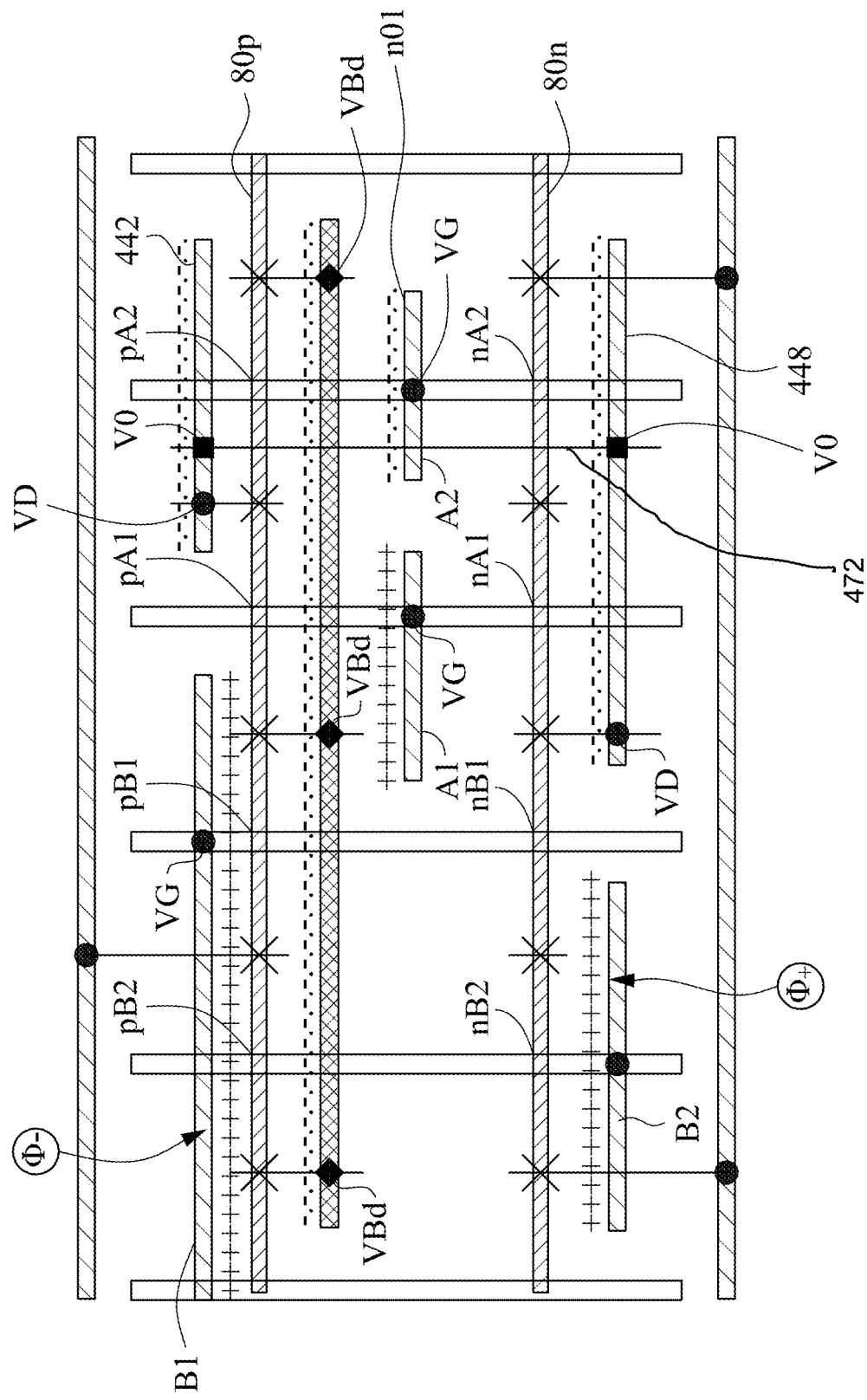
FIG. 4F is a stick diagram of the AOI logic circuit of FIGS. 4A-4C, in accordance with some embodiments.

FIG. 4F is another stick diagram of the AOI logic circuit 400 formed by the layout diagrams in FIGS. 4A-4C, in accordance with some embodiments. The stick diagram in FIG. 4F is a modification of the stick diagram in FIG. 4D, by labeling the phases of varies signals on the routing tracks. The input signals A1, A2, B1, and B2 of the AOI logic circuit 400 are correspondingly carried by the horizontal routing tracks A1, A2, B1, and B2. The output signal ZN of the AOI logic circuit 400 is carried by the horizontal routing tracks 442 and 448 and by the vertical routing track 472. The intermediate signal at the node "n01" received from the drain terminals of the p-type transistors B1 and B2 is carried by the backside routing track 362.

In FIG. 4F, the horizontal routing tracks A1, A2, B1, and B2 carry input signals with the first phase $\Phi_+$. The backside routing tracks 362 carry signals with the second phase $\Phi_-$. The horizontal routing tracks 442 and 448 and the vertical routing track 472 carry the output signal ZN with the second phase $\Phi_-$. In the layout designs of FIGS. 4A-4C, there are only three pairs of adjacent routing tracks that carry signals with opposite phases. The first pair is formed by the routing track A1 and the horizontal routing tracks 448. The second pair is formed by the routing track A2 and the horizontal routing tracks 448. The third pair is formed by the routing track A2 and the horizontal routing tracks 442. In the layout designs of FIGS. 4A-4C, the sum of the capacitive couplings between the three pairs of adjacent routing tracks having signals with the opposite phases is reduced as compared with some of the alternative designs in which no backside routing track is available. The speed and the power consumption of the AOI logic circuit 400 are improved over some of the alternative designs which have no backside routing tracks. In addition, in embodiments in which the backside routing track 362 is not positioned near the edges of the cell of the AOI logic circuit 400, it is possible to place the cell of the AOI logic circuit 400 vertically near another cell having backside routing tracks near the edges of the cell. In some embodiments, it is possible to achieve better cell density in a circuit designed with the AOI logic circuit 400 than that in a circuit designed with the AOI logic circuit 300. Furthermore, the cell width of the AOI logic circuit 400 is only 5 CPP, whereas the cell width of an AOI logic circuit of another approach (which has no backside routing tracks) generally is larger than or equal to 7 CPP. Here, the unit of one CPP (Contacted Poly Pitch) is the pitch distance between the two adjacent gate-strips, such as the pitch distance between the gate-strips gB2 and gB1. In FIGS. 4A-4C, the cell width of the AOI logic circuit 400 is equal to the pitch distance between the dumpy gate-strips 156 and 158.

Figure 6A:
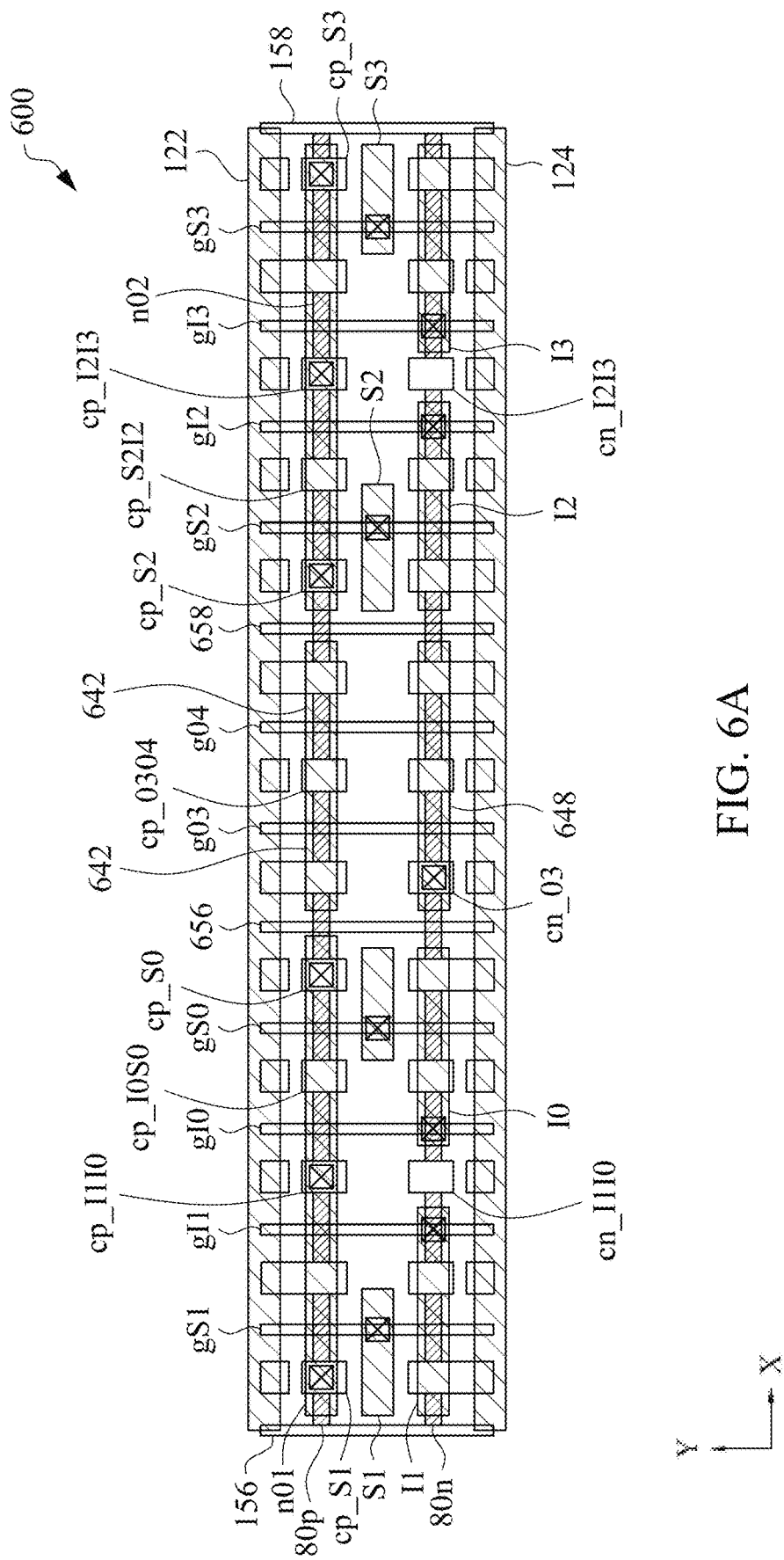
FIGS. 6A-6C are partial layout diagrams of a multiplexer circuit, in accordance with some embodiments.
Figure 6B:
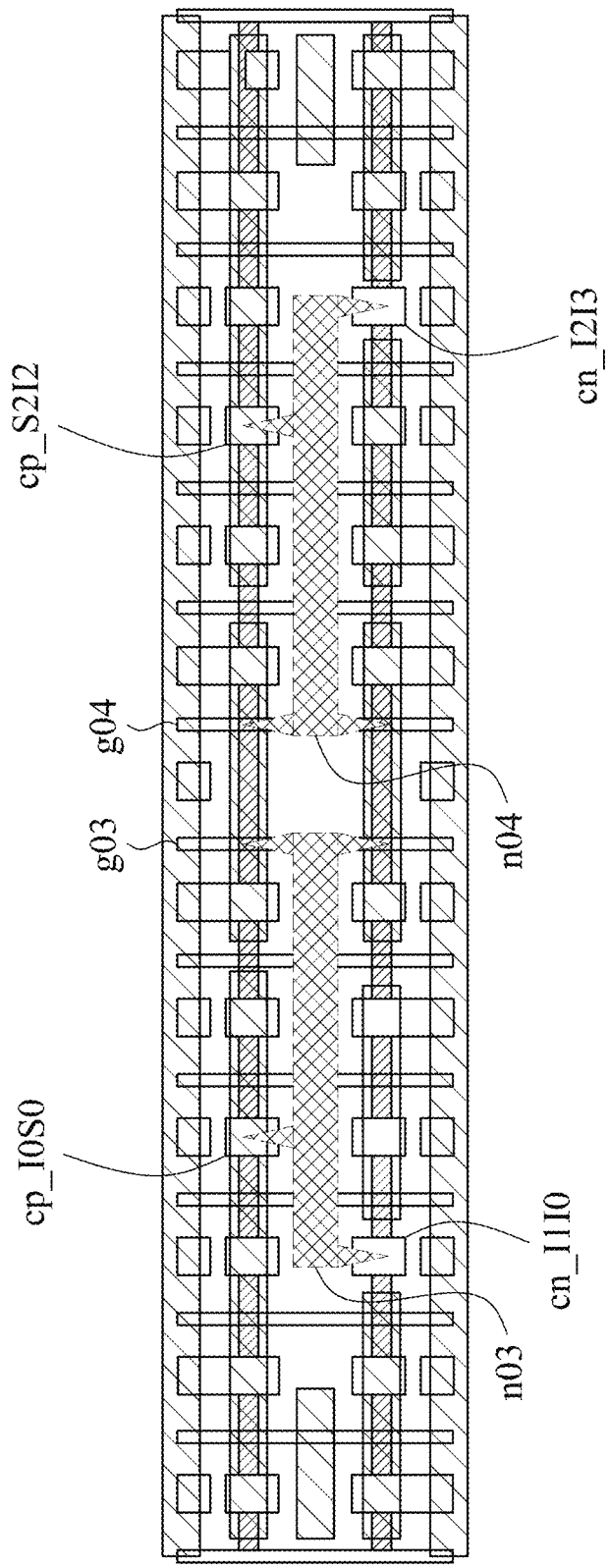
Figure 6C:
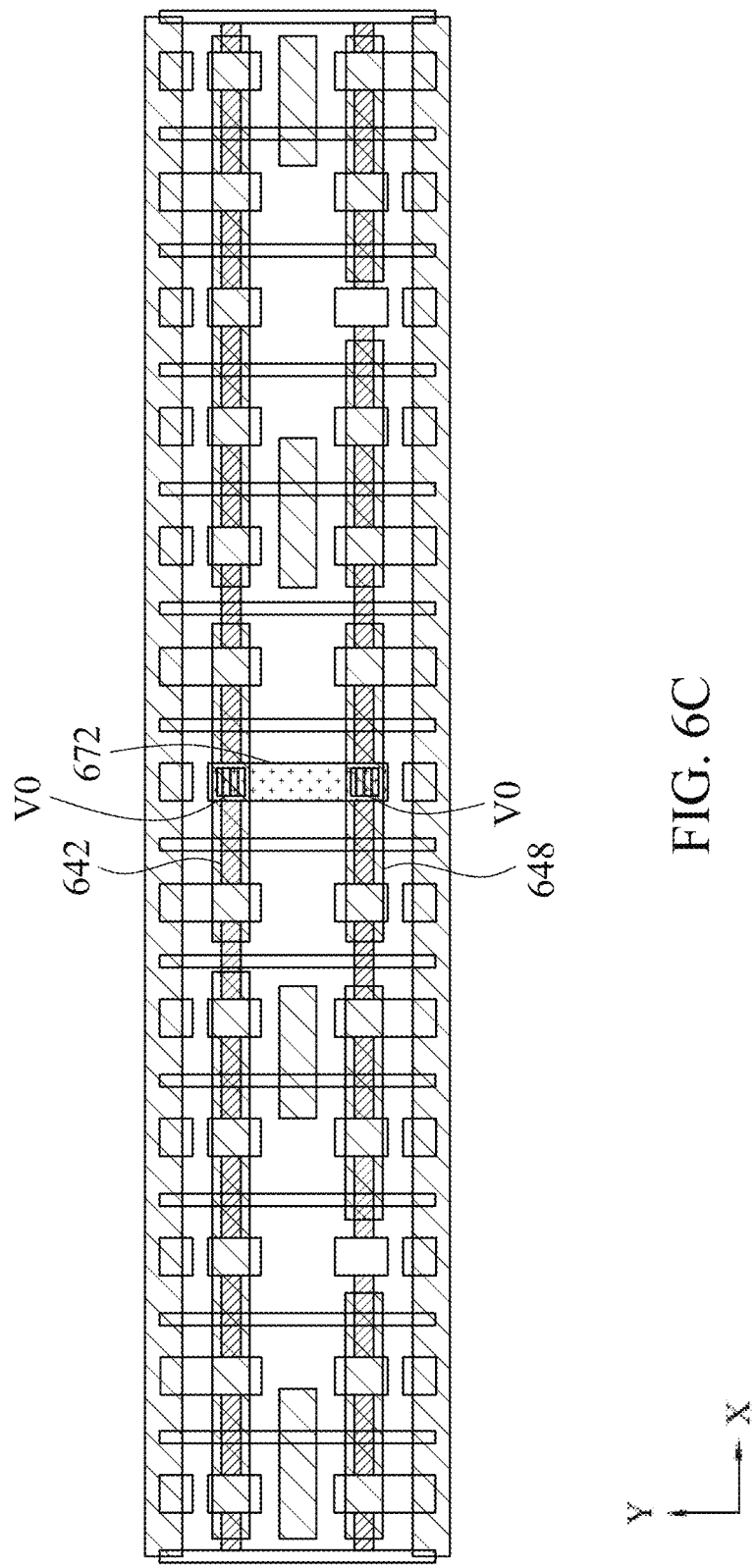
Figure 6D:
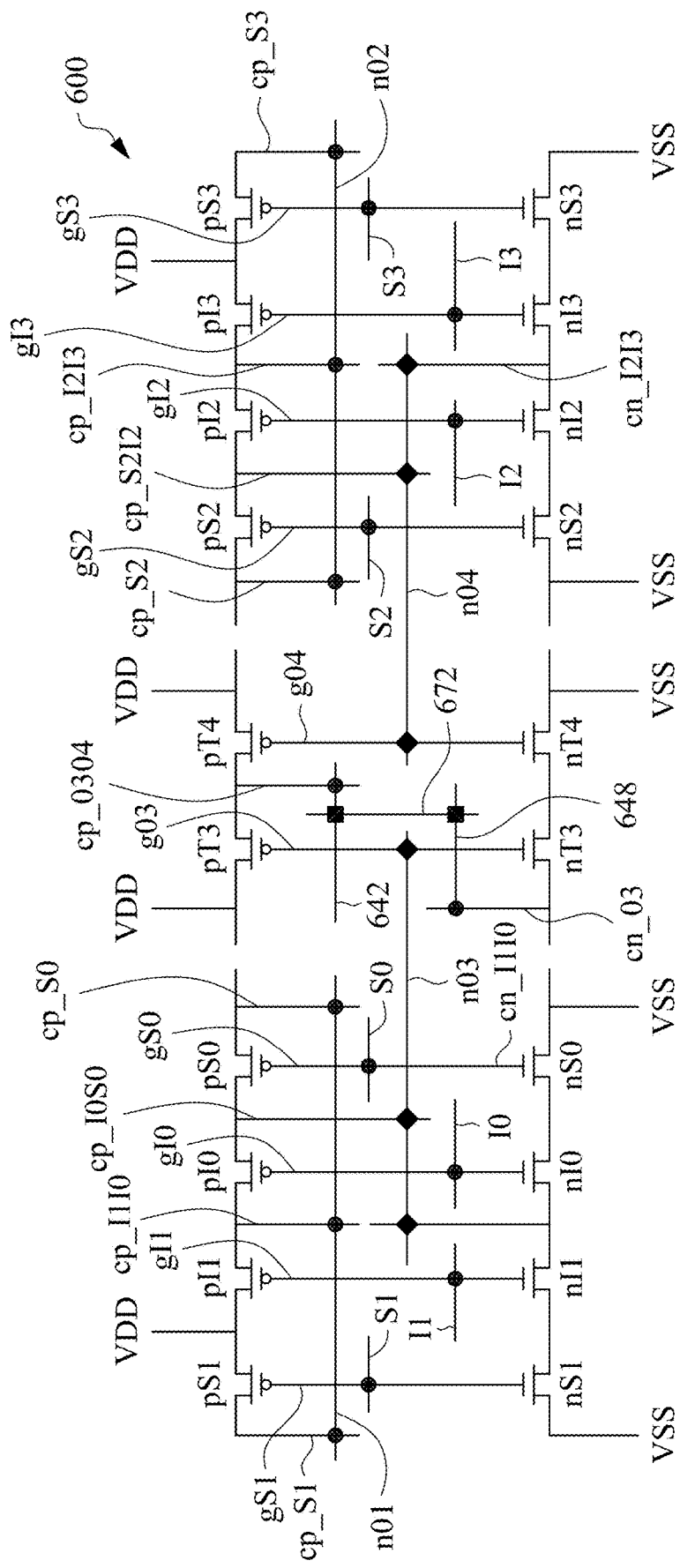
FIG. 6D is an equivalent circuit of the multiplexer circuit of FIGS. 6A-6C, in accordance with some embodiments.

FIGS. 6A-6C are partial layout diagrams of a multiplexer circuit 600, in accordance with some embodiments. FIG. 6D is an equivalent circuit of the multiplexer circuit 600 formed by the layout diagrams in FIGS. 6A-6C, in accordance with some embodiments. The multiplexer circuit 600 formed by the layout diagrams in FIGS. 6A-6C is an example of the four channel multiplexer circuit in FIG. 6F. An implementation of the four channel multiplexer circuit based logic gates is shown in FIG. 6G. In FIGS. 6F-6G, the output Z is related to the inputs I0, I1, I2, and I3 and the selection signals S0, S1, S2, and S3. The logic relationship for specifying the output Z is expressed as Z=I0·S0+I1·S1+I2S·2+I3·S3.

In FIG. 6A and FIG. 6D, elements formed on the front side of the substrate are shown in corresponding layout patterns. The elements formed on the front side of the substrate and specified by the layout patterns in FIG. 6A include the active zones, the gate-strips, the conductive segments, the horizontal routing tracks, the power rails, and the front side via connectors. The gate-strips gS1, gI1, gI0, and gS0 overlaps the p-type active zone 80$p$ and correspondingly form the gate terminals of the p-type transistors pS1, pI1, pI0, and pS0 (as shown in FIG. 6D). The gate-strips gS2, gI2, gI3, and gS3 overlaps the p-type active zone 80$p$ and correspondingly form the gate terminals of the p-type transistors pS2, pI2, pI3, and pS3 (as shown in FIG. 6D). The gate-strips gS1, gI1, gI0, and gS0 overlaps the n-type active zone 80$n$ and correspondingly form the gate terminals of the n-type transistors nS1, nI1, nI0, and nS0 (as shown in FIG. 6D). The gate-strips gS2, gI2, gI3, and gS3 overlaps the n-type active zone 80$n$ and correspondingly form the gate terminals of the n-type transistors nS2, nI2, nI3, and nS3 (as shown in FIG. 6D). The gate-strips g03 and g04 overlaps the p-type active zone 80$p$ and correspondingly form the gate terminals of the p-type transistors pT3 and pT4 (as shown in FIG. 6D). The gate-strips g03 and g04 overlaps the n-type active zone 80$n$ and correspondingly form the gate terminals of the n-type transistors nT3 and nT4 (as shown in FIG. 6D). Dummy gate-strips 156, 656, 658, and 158 are not configured as gate terminals of transistors for using in the equivalent circuit of the multiplexer circuit 600 (as shown in FIG. 6D).

In FIG. 6A and FIG. 6D, the horizontal routing tracks S1, S0, S2, and S3 are correspondingly connected to the gate-strips gS1, gS0, gS2, and gS3 through front end via connectors VG. The horizontal routing tracks I1, I0, I2, and I3 are correspondingly connected to the gate-strips gI1, gI0, gI2, and gI3 through front end via connectors VG. The horizontal routing track n01 is connected to the conductive segments cp_S1, cp_M0, and cp_S0 through front end via connectors VD. The horizontal routing track n02 is connected to the conductive segments cpS_2, cp_I2I3, and cp_S3 through front end via connectors VD. The horizontal routing track 642 is connected to the conductive segment cp_0304 through a front end via connector VD. The horizontal routing track 648 is connected to the conductive segment cn_03 through a front end via connector VD. The source terminals of the p-type transistors pS1, pI1, pI3, pS3, pT3, and pT4 are connected to the power supply VDD. The source terminals of the n-type transistors nS1, nS0, nS2, nS3, and nT4 are connected to the power supply VSS.

In FIG. 6C and FIG. 6D, the vertical routing track 672 extending in the Y-direction is depicted with layout patterns superimposed on the layout patterns in FIG. 6A, while ignoring the depiction of the front side via connectors VG and VD, for better clarity. The vertical routing track 672 extending in the Y-direction is formed in a second metal layer M1 on top of the interlayer dielectric overlying the first metal layer M0. The horizontal routing tracks 642 and 648 are connected by the vertical routing track 672 through the via connectors V0 between the second metal layer M1 and the first metal layer M0.

In FIG. 6B, the backside routing tracks and the backside via connectors formed on the back side of the substrate are depicted with layout patterns superimposed on the layout patterns in FIG. 6A, while ignoring the depiction of the front side via connectors VG and VD, for better clarity. The elements formed on the back side of the substrate and specified by the layout patterns in FIG. 6B include the backside routing tracks n03 and n04, and the backside via connectors VB and VBd. In FIG. 6B and FIG. 6D, the backside routing track n03 is connected to the conductive segments cn_I1I0 and cp_I0S0 through backside via connectors VBd. The backside routing track n03 is also connected to the gate-strip g03 through backside via connector VB. The backside routing track n04 is connected to the conductive segments cn_I2I3 and cp_S2I2 through backside via connectors VBd. The backside routing track n04 is also connected to the gate-strip g04 through backside via connector VB.

Figure 6E:
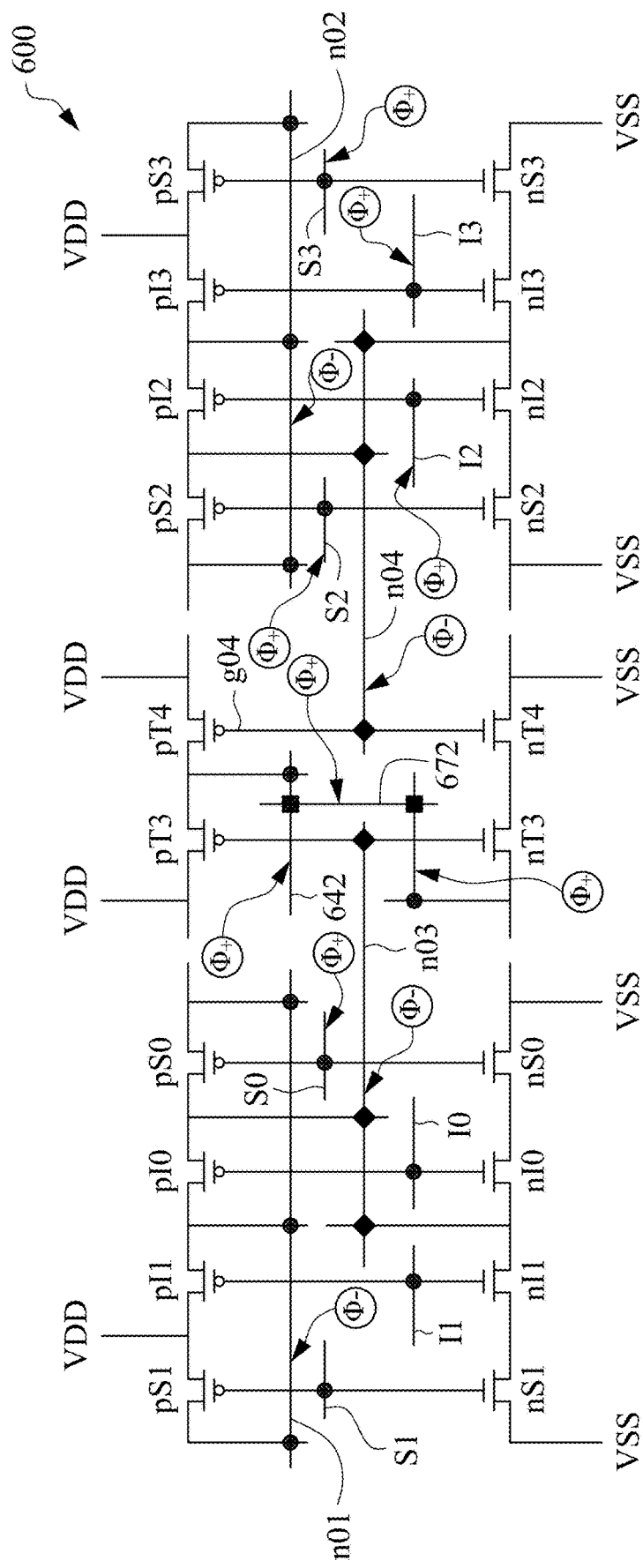
FIG. 6E is an equivalent circuit of the multiplexer circuit of FIGS. 6A-6C, in accordance with some embodiments.
Figure 6F:
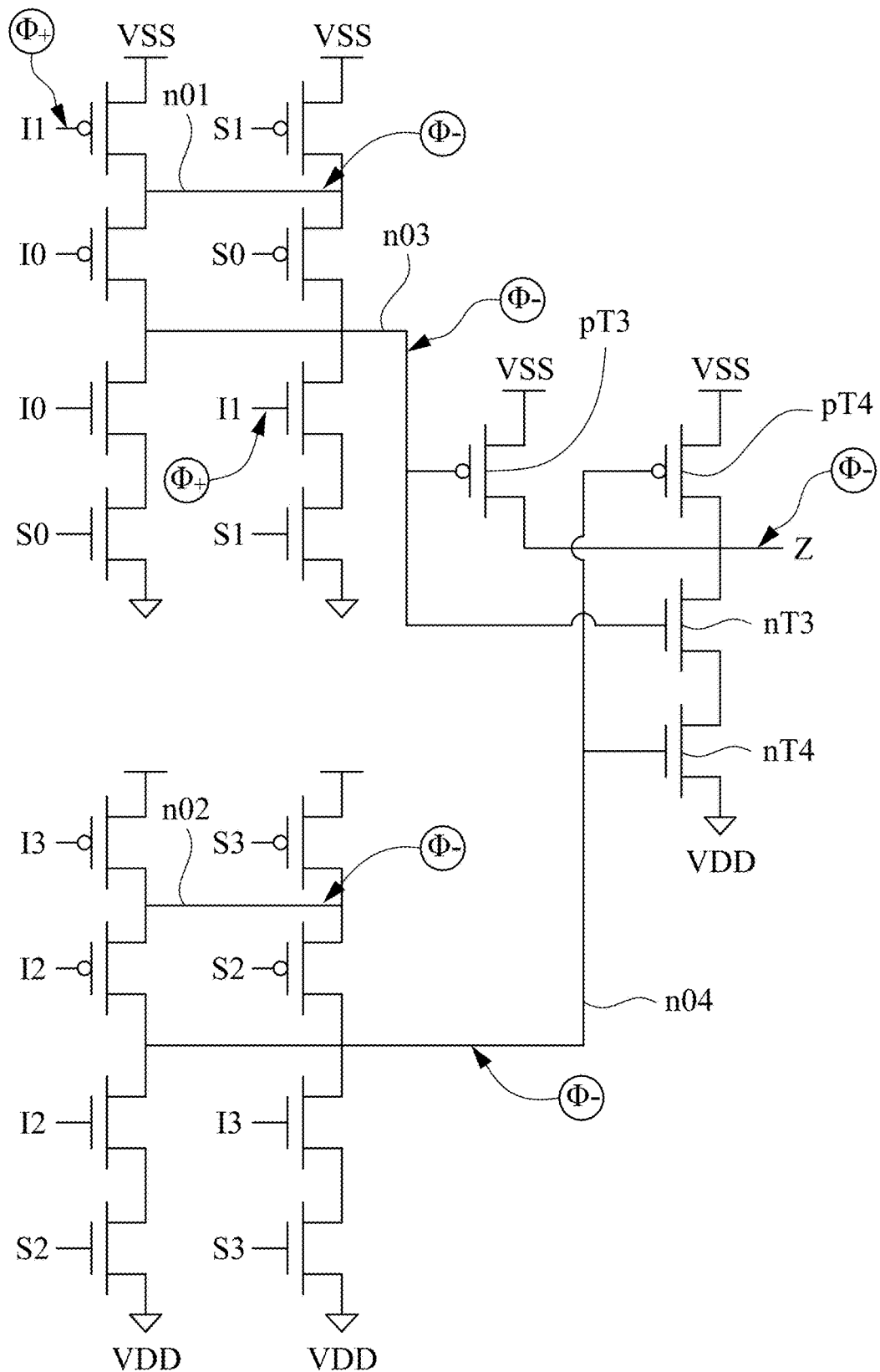
FIG. 6F is a circuit diagram of a four channel multiplexer circuit, in accordance with some embodiments.
Figure 6G:
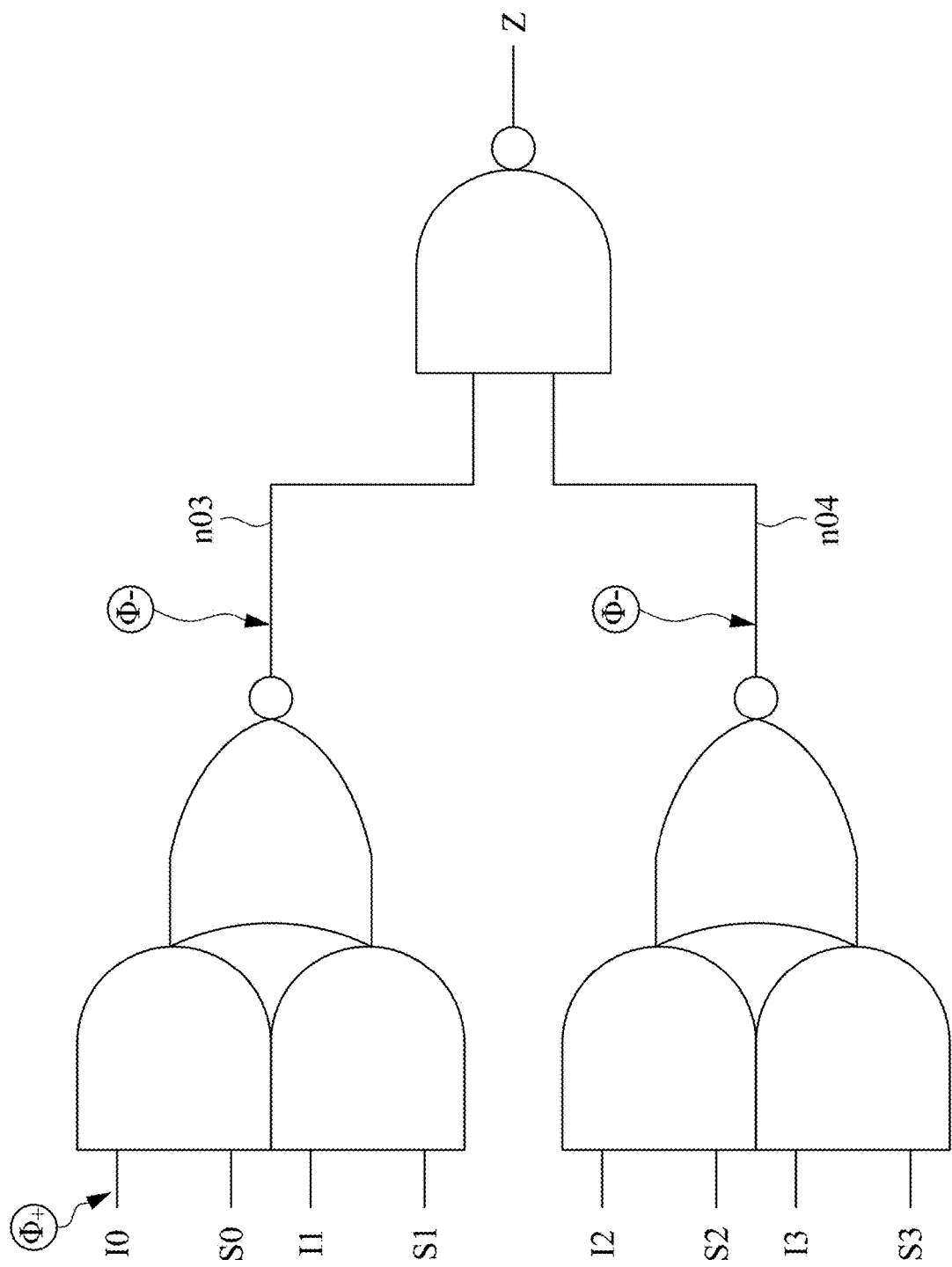
FIG. 6G is a logic gate circuit diagram of a four channel multiplexer circuit, in accordance with some embodiments.

FIG. 6E is another stick diagram of the multiplexer circuit 600 formed by the layout diagrams in FIGS. 6A-6C, in accordance with some embodiments. The stick diagram in FIG. 6E is a modification of the stick diagram in FIG. 6D, by labeling the phases of varies signals on the routing tracks. The horizontal routing tracks I0, I1, I2, I3, So, S1, S2, S3, 642, and 648 carry signals with the first phase $\Phi_+$. The vertical routing track 672 also carry signals with the first phase $\Phi_+$. The horizontal routing tracks n01 and n02 and the backside routing tracks n03 and n04 carry signals with the second phase $\Phi_-$ that is opposite to the first phase $\Phi_+$. In FIGS. 6A-6C, adjacent routing tracks on a same metal layer (such as the metal layer M0) do not carry signals with the opposite phase. Consequently, the speed and the power consumption of the multiplexer circuit 600 are improved over some of the alternative designs which have capacitive couplings due to opposite phase signals carried by adjacent routing tracks on a same metal layer. In FIGS. 6A-6C, signals with the first phase $\Phi_+$ are carried by the horizontal routing tracks on the front side of the substrate, while signals with the second phase $\Phi_-$ are carried by the backside routing tracks (e.g., n01, n02, n03, and n04) on the backside of the substrate.

Figure 7A:
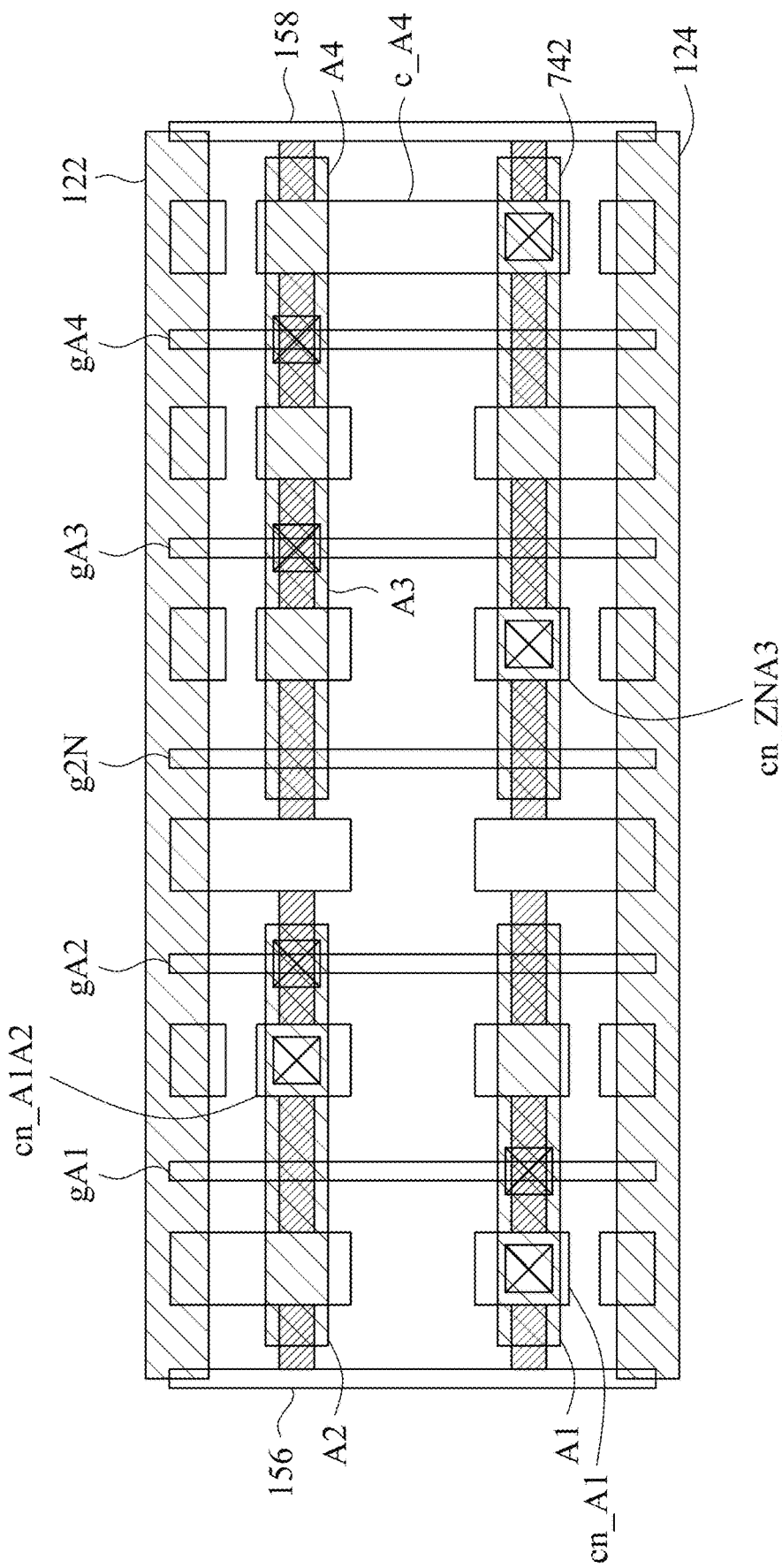
FIGS. 7A-7B are partial layout diagrams of a logic-gates combo circuit having a backside routing track, in accordance with some embodiments.
Figure 7B:
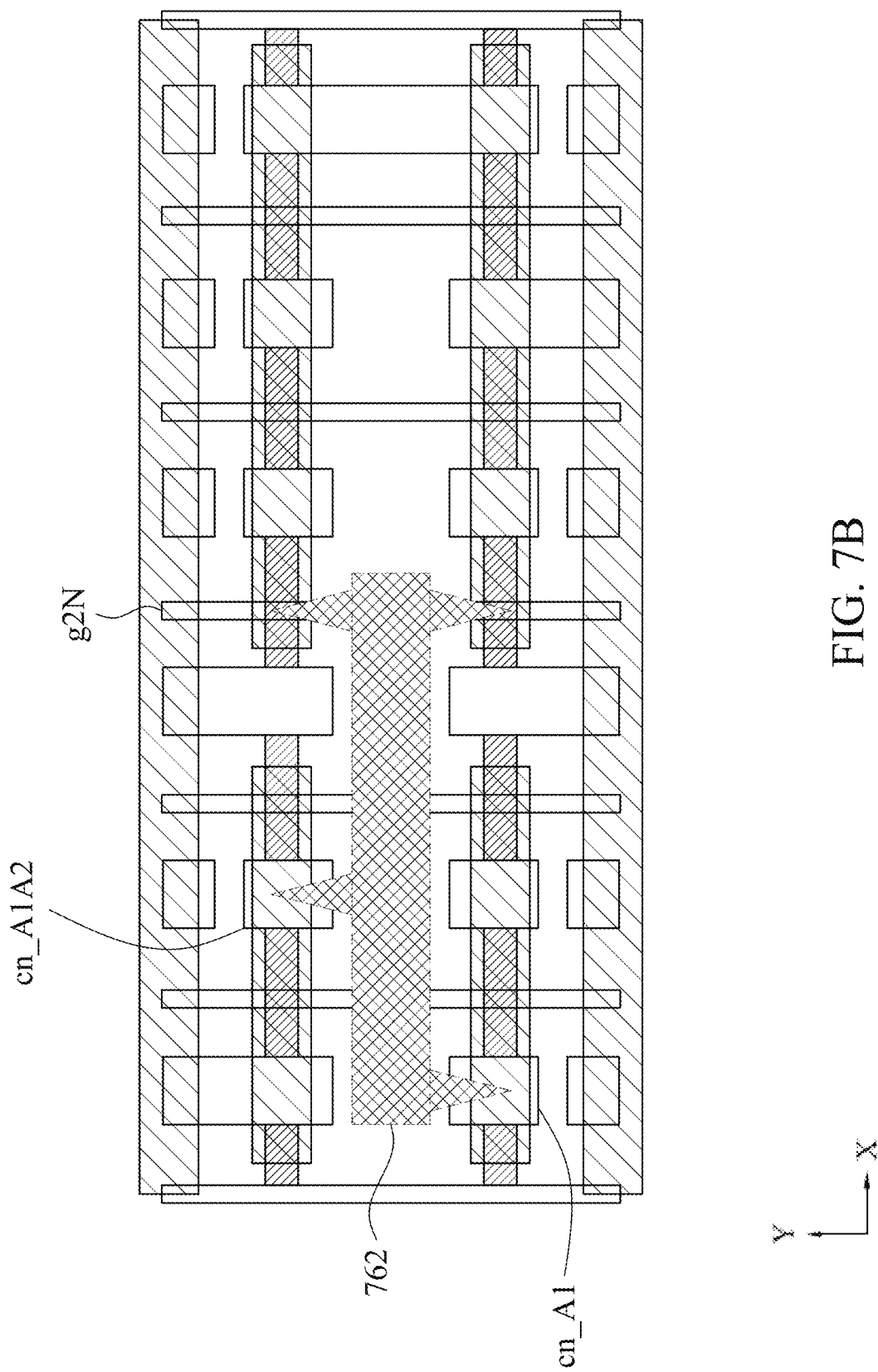
Figure 7C:
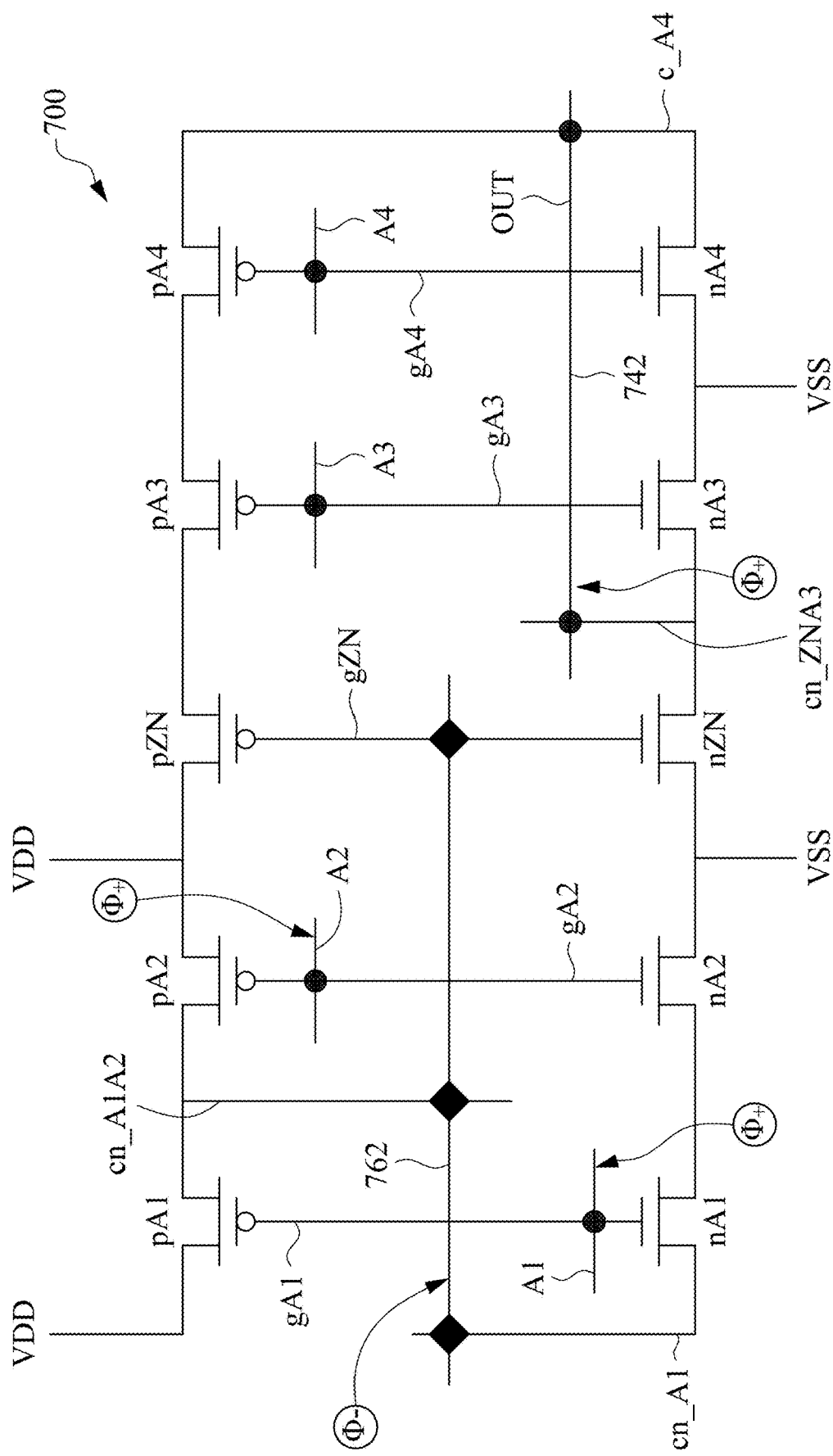
FIG. 7C is an equivalent circuit of the logic-gates combo circuit of FIGS. 7A-7B, in accordance with some embodiments

FIGS. 7A-7B are partial layout diagrams of a logic-gates combo circuit 700 having a backside routing track, in accordance with some embodiments. FIG. 7C is an equivalent circuit of the logic-gates combo circuit 700 formed by the layout diagrams in FIGS. 7A-7B, in accordance with some embodiments.

In FIG. 7A, elements formed on the front side of the substrate are shown in corresponding layout patterns. The elements formed on the front side of the substrate and specified by the layout patterns in FIG. 7A include the active zones, the gate-strips, the conductive segments, the horizontal routing tracks, the power rails, and the via connectors. The p-type active zone 80$p$ and the n-type active zone 80$n$ are both extending in the X-direction. Each of the gate-strips gA1, gA2, gZN, gA3, and gA4 extending in the Y-direction overlaps the p-type active zone 80$p$ and forms correspondingly the gate terminal of one of the p-type transistors pA1, pA2, pZN, pA3, and pA4 (as shown in FIG. 7C). Each of the gate-strips gA1, gA2, gZN, gA3, and gA4 also overlaps the n-type active zone 80$n$ and forms correspondingly the gate terminal of one of the n-type transistors nA1, nA2, nZN, nA3, and nA4 (as shown in FIG. 7C). In FIG. 7A and FIG. 7C, the horizontal routing tracks A1, A2, A3, and A4 are correspondingly connected to the gate-strips gA1, gA2, gA3, and gA4 through the via connectors VG formed on the front side of the substrate. The horizontal routing track 742 is connected to the conductive segments cn_ZNA3 and c_A4 through the via connectors VD. The source terminals of the p-type transistors pA1, pA2, and pZN are connected to the power rail 122 for receiving the supply voltage VDD. The source terminals of the n-type transistors nA2, nZN, nA3, and nA4 are connected to the power rail 124 for receiving the supply voltage VSS.

In FIG. 7B, the backside routing track and the backside via connectors formed on the back side of the substrate are depicted with layout patterns superimposed on the layout patterns in FIG. 7A, while ignoring the depiction of the front side via connectors VG and VD, for better clarity. The elements formed on the back side of the substrate and specified by the layout patterns in FIG. 7B include the backside routing track 762, and the backside via connectors VB and VBd. In FIG. 7B and FIG. 7C, the backside routing track 762 is connected to the conductive segments cn_A1 and cp_A1A2 through backside via connectors VBd. The backside routing track 762 is also connected to the gate-strip gZN through backside via connector VB. In FIG. 7C, the horizontal routing tracks A1, A2, A3, and A4 (which are correspondingly connected to the gate-strips gA1, gA2, gA3, and gA4) are configured as the input terminals for receiving the input signals. The horizontal routing track 742 is configured as the out terminal "OUT" for transmitting the output signal.

Figure 7D:
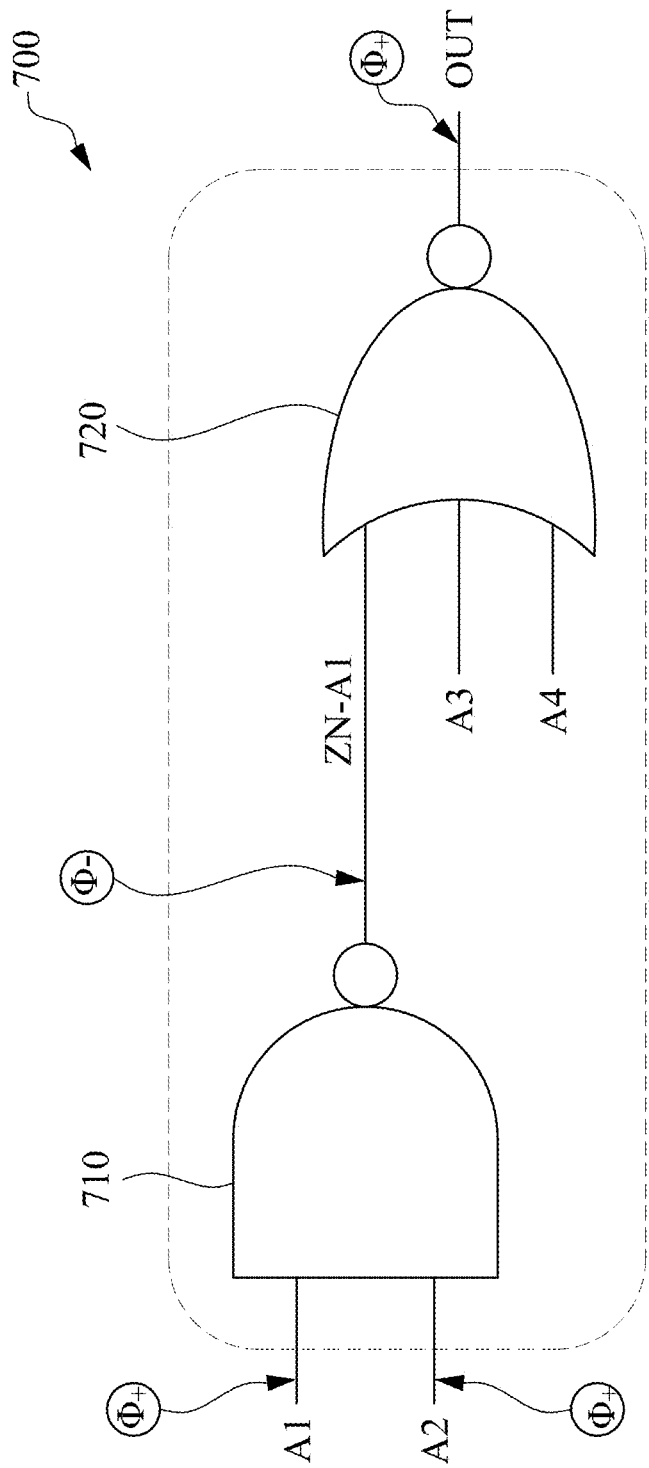
FIG. 7D is a circuit diagram of the logic gates of FIG. 7C, in accordance with some embodiments.

FIG. 7D is a circuit diagram of the logic gates formed from the transistors in FIG. 7C, in accordance with some embodiments. The circuit 700 in FIG. 7D includes a two-inputs NAND gate 710 and a three-inputs NOR gate 720. The NAND gate 710 are formed from four transistors pA1, nA1, pA2, and nA2 in FIG. 7C. The NOR gate 720 are formed from six transistors pZN, nZN, pA3, nA3, pA4, and nA4 in FIG. 7C. The NAND gate 710 receives a digital signal at each of the two inputs A1 and A2, and generates an output signal ZN-A1. The NOR gate 720 receives, at one of the three inputs, the output signal ZN-A1 from the output terminal of the NAND gate 710. The NOR gate 720 also receives additional digital signals at the other two inputs A3 and A4.

In FIG. 7C, the horizontal routing tracks A1, A2, and 742 carry signals with the first phase I. The backside routing track 762 carry signals with the second phase $\Phi_-$ that is opposite to the first phase $\Phi_+$. In FIGS. 7A-7C, because the signal at the output of the NAND gate 710 with the second phase $\Phi_-$ is carried by the backside routing track 762, the capacitive coupling between the output of the NAND gate 710 and the inputs A1 and A2 of the NAND gate 710 reduced, as compared with some of the alternative designs in which some of the signals having opposite phase $\Phi_+$ and $\Phi_-$ are carried by adjacent routing tracks on a same metal layer. Consequently, the speed and the power consumption of the logic-gates combo circuit 700 are improved over some of the alternative designs.

Figure 8A:
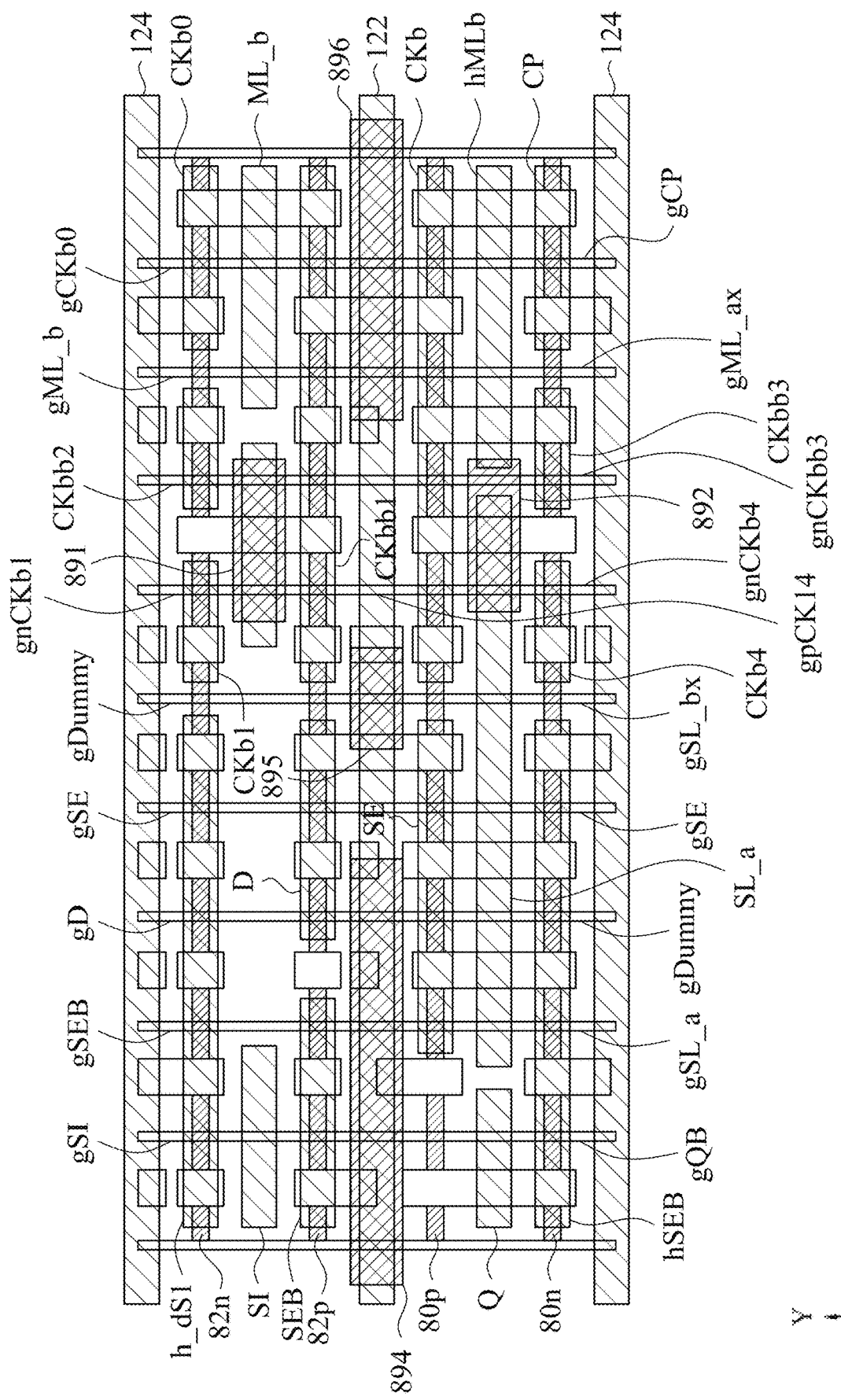
FIGS. 8A-8B are partial layout diagrams of a Scan D Flip-flop (SDF) circuit, in accordance with some embodiments.
Figure 8B:
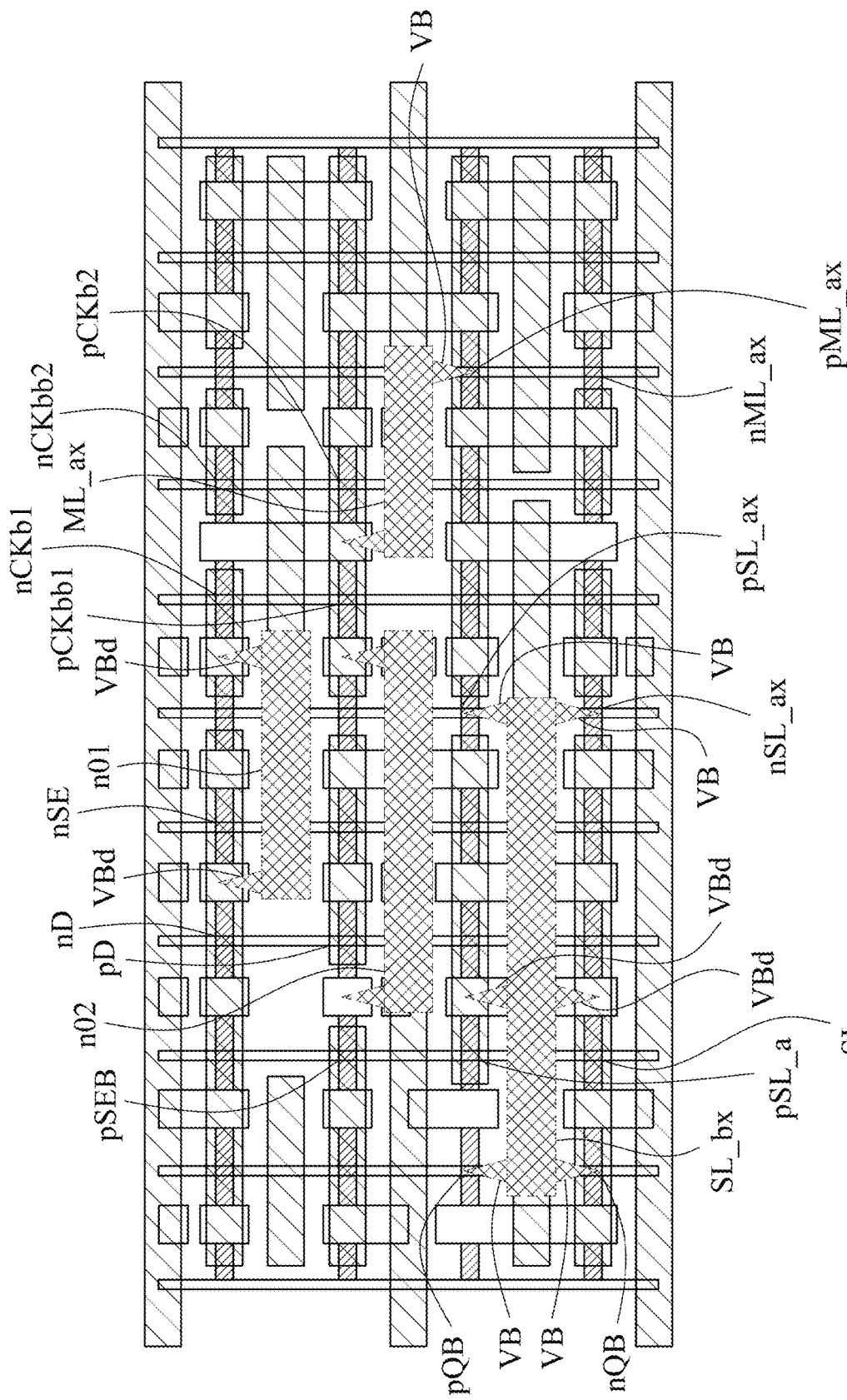
Figure 8C:
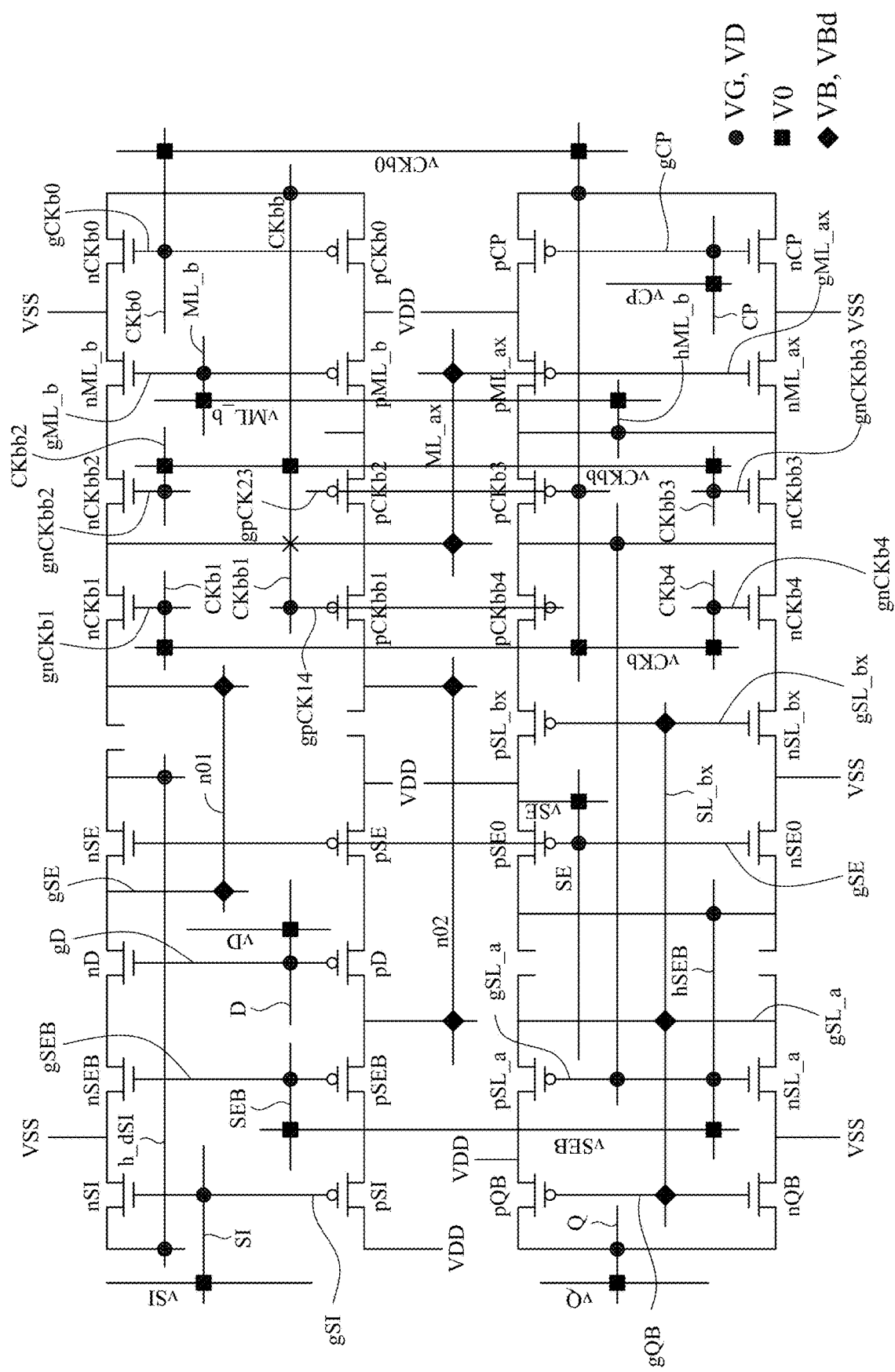
FIG. 8C is a circuit diagram of the SDF circuit in FIGS. 8A-8B, in accordance with some embodiments.
Figure 9A:
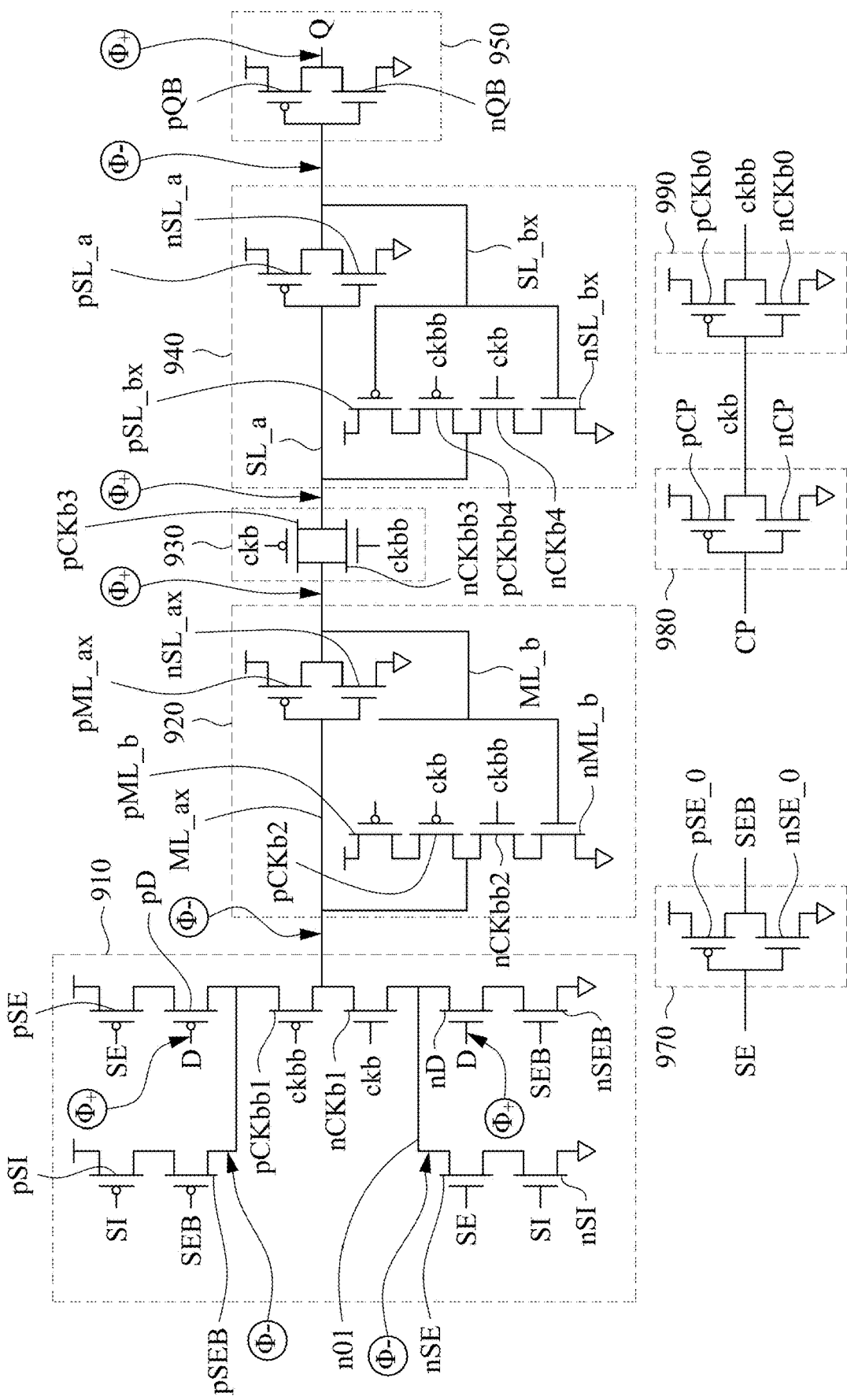
FIG. 9A is a circuit diagram of the SDF circuit in FIGS. 8A-8B, in accordance with some embodiments.

FIGS. 8A-8B are partial layout diagrams of a Scan D Flip-flop (SDF) circuit 800, in accordance with some embodiments. In FIG. 8A, elements formed on the front side of the substrate are shown in corresponding layout patterns. In FIG. 8B, the backside routing track and the backside via connectors formed on the back side of the substrate are depicted with layout patterns superimposed on the layout patterns in FIG. 8A. FIG. 8C and FIG. 9A are circuit diagrams of the SDF circuit 800 formed by the layout diagrams in FIGS. 8A-8B, in accordance with some embodiments. The circuit diagram in FIG. 8C closely tracks the physical locations of various elements (such as, the transistors, the routing tracks, and via connectors) in the layout diagrams in FIGS. 8A-8B, while the circuit diagram in FIG. 9A groups the transistors in FIG. 8C into various functional blocks.

Figure 9B:
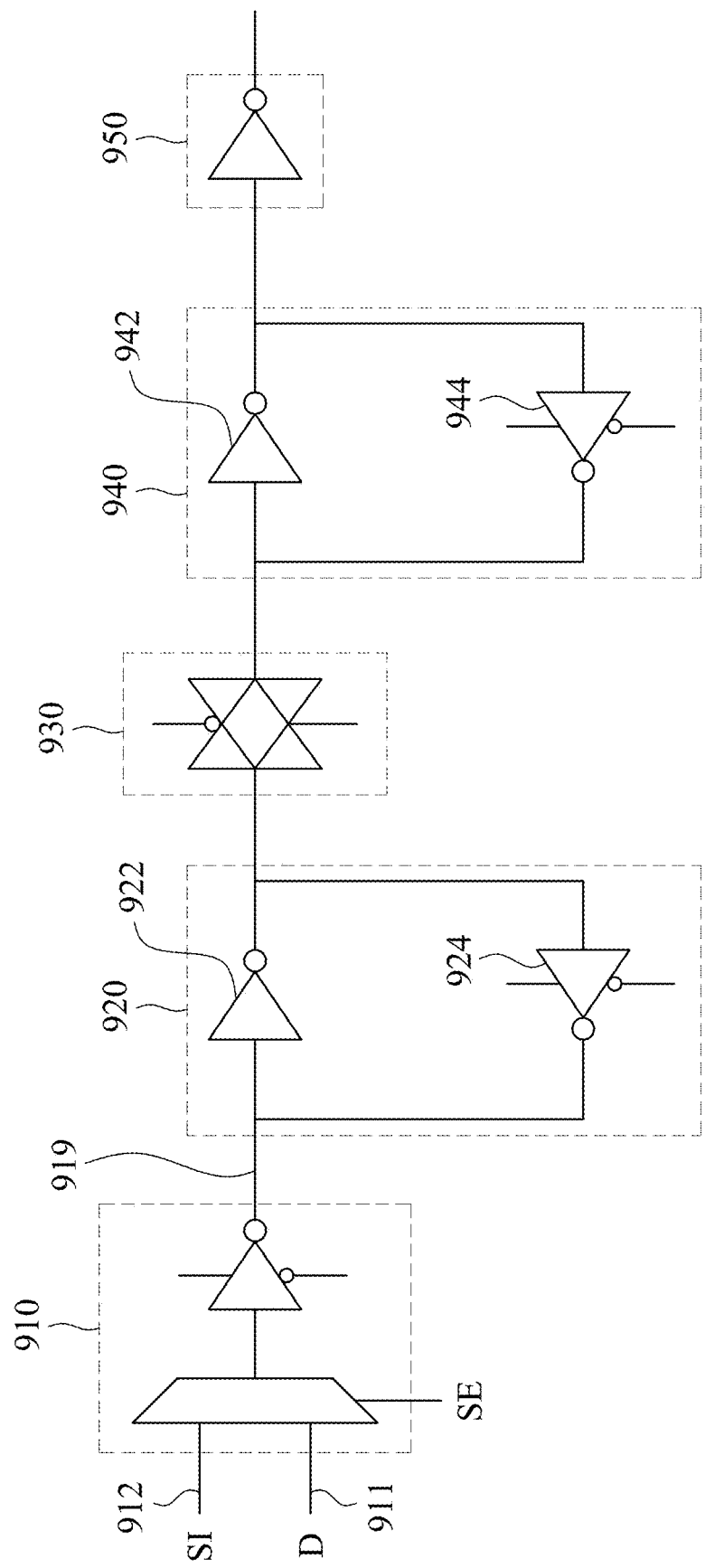
FIG. 9B is a circuit diagram of the SDF circuit represented in functional blocks, in accordance with some embodiments.

FIG. 9B is a circuit diagram of the SDF circuit 800 represented in functional blocks, in accordance with some embodiments. In FIG. 9B, the SDF circuit 800 includes a two-input multiplexer 910, a mater latch 920, a transmission gate 930, a slave latch 940, and an inverter 950. The two-input multiplexer 910 receives a data signal D at a first input 911 and a scan input signal SI at a second input 912. Each of the two-input multiplexer 910, the mater latch 920, and the slave latch 940 is clocked by clock signals synchronized to the clock signal CP. Depending upon the logical levels of the selection enable signal SE, either the data signal D or the scan input signal SI is generated as an inverted signal at the output 919 of the two-input multiplexer 910. In some embodiments, the inverse of the data signal is generated at the at the output 919 when the selection enable signal SE is at the logic HIGH, and the inverse of the scan input signal SI is generated at the at the output 919 when the selection enable signal SE is at the logic LOW. The output 919 of the two-input multiplexer 910 is connected to the input of the mater latch 920. The transmission gate 930 is connected between the mater latch 920 and the slave latch 940. The output of the slave latch 940 is connected to the input of the inverter 950. The output of the SDF circuit 800 is provided by the output of the inverter 950.

In FIG. 8A, various elements for forming the SDF circuit 800 are specified by the corresponding layout patterns. The elements formed on the front side of the substrate and specified by the layout patterns include the active zones, the gate-strips, the conductive segments, the horizontal routing tracks, the power rails, and the via connectors. The gate-strips gSI, gSEB, gD, and gSE overlaps the p-type active zone 82$p$ and correspondingly form the gate terminals of the p-type transistors pSI, pSEB, pD, and pSE (as shown in FIG. 8C). The gate-strips gSI, gSEB, gD, and gSE overlaps the n-type active zone 82$n$ and correspondingly form the gate terminals of the n-type transistors nSI, nSEB, nD, and nSE (as shown in FIG. 8C). The gate-strips gQB, gSL_a, and gSE overlaps the p-type active zone 80$p$ and correspondingly form the gate terminals of the p-type transistors pQB, pSL_a, and pSE0 (as shown in FIG. 8C). The gate-strips gQB, gSL_a, and gSE overlaps the n-type active zone 80$n$ and correspondingly form the gate terminals of the n-type transistors nQB, nSL_a, and nSE0 (as shown in FIG. 8C). A poly-cut pattern 894 specifies a first disconnection gap between the gate-strips gSI and the gate-strips gQB and a second disconnection gap between the gate-strips gSEB and gSL_a. During device fabrication, in some embodiments, the gate-strips gSI and the gate-strips gQB are physically disconnected from each other by removing a gate-strip section as specified by the physical disconnection gap in the layout design, and the gate-strips gSI and the gate-strips gQB are similarly disconnected from each other. The poly-cut pattern 894 also specifies a third disconnection gap between the gate-strip gD and a vertically dummy gate-strip.

In FIG. 8A, the gate-strip gSL_bx overlaps the p-type active zone 80$p$ and the n-type active zone 80$n$, forming correspondingly the gate terminals of the p-type transistors pSL_bx and the n-type transistors nSL_bx (as shown in FIG. 8C). A poly-cut pattern 895 specifies a disconnection gap between the gate-strip gSL_bx and a vertically dummy gate-strip.

In FIG. 8A, the gate-strips gpCK14, gpCK23, gML_b, and gCKb0 overlaps the p-type active zone 82$p$ and correspondingly form the gate terminals of the p-type transistors pCKbb1, pCKb2, pML_b, and pCKb0 (as shown in FIG. 8C). The gate-strips gnCKb1, gnCKbb2, gML_b, and gCKb0 overlaps the n-type active zone 82n and correspondingly form the gate terminals of the n-type transistors nCKb1, nCKbb2, nML_b, and nCKb0 (as shown in FIG. 8C). The gate-strips gpCK14, pCK23, gML_ax, and gCP overlaps the p-type active zone 80p and correspondingly form the gate terminals of the p-type transistors pCKbb4, pCKb3, pML_ax, and pCP (as shown in FIG. 8C). The gate-strips gnCKb4, gnCKbb3, gML_ax, and gCP overlaps the n-type active zone 80n and correspondingly form the gate terminals of the n-type transistors nCKb4, nCKbb3, nML_ax, and nCP (as shown in FIG. 8C). A poly-cut pattern 896 specifies a first disconnection gap between the gate-strips gML_b and gML_ax and a second disconnection gap between the gate-strips gCKb0 and gCP. A poly-cut pattern 891 specifies a first disconnection gap between the gate-strips gnCKb1 and gpCK14 and a second disconnection gap between the gate-strips gnCKbb2 and gpCK23. A poly-cut pattern 892 specifies a first disconnection gap between the gate-strips gpCK14 and gnCKb4 and a second disconnection gap between the gate-strips gpCK23 and gnCKbb3.

In FIG. 8C and FIG. 9A, five p-type transistors (pSI, pSEB, pSE, pD, and pCKbb1) and five n-type transistors (nSI, nSE, nSEB, nD, and nCKb1) are used for forming the two-input multiplexer 910 (as shown in FIG. 9B). The p-type transistor pML_ax and the n-type transistor nML_ax form an inverter 922 in the mater latch 920. Two p-type transistors (pML_b and pCKb2) and two n-type transistors (nML_b and nCKbb2) form a clocked inverter 924 in the mater latch 920. The p-type transistor pCKb3 and the n-type transistor nCKbb3 form the transmission gate 930. The p-type transistor pSL_a and the n-type transistor nSL_a form an inverter 942 in the slave latch 920. Two p-type transistors (pSL_bx and pCKbb4) and two n-type transistors (nSL_bx and nCKb4) form a clocked inverter 944 in the mater latch 920. The p-type transistor pQB and the n-type transistor nQB form the inverter 950.

In FIG. 8C and FIG. 9A, the p-type transistor pSE0 and the n-type transistor nSE0 form an inverter 970 for generating an inverted selection enable signal SEB from the selection enable signal SE. The selection enable signal SE is coupled to the gate terminals of the p-type transistor pSE and the n-type transistor nSE. The p-type transistor pCP and the n-type transistor nCP form an inverter 980 for generating an inverted clock signal ckb from the clock signal CP. The p-type transistor pCKb0 and the n-type transistor nCKb0 form an inverter 990 for generating a clock signal ckbb from the inverted clock signal ckb. The inverted clock signal ckb is couple to the gate terminals of the p-type transistors pCKb2 and pCKb3 and the gate terminals of the n-type transistors nCKb1 and nCKb4. The clock signal ckbb is couple to the gate terminals of the p-type transistors pCKbb1 and pCKbb4 and the gate terminals of the n-type transistors nCKbb2 and nCKbb3.

In FIG. 8C, various connections between the terminals of the transistors are formed from one or more of the horizontal routing tracks, the backside routing tracks, the via connectors, and/or the vertical routing tracks. The type of the via connectors include the front side via connectors VG and VD which connect the horizontal routing tracks with the terminals of the transistors, the backside via connectors VB and VBd which connect the backside routing tracks with the terminals of the transistors, and the front side via connectors V0 which connect the vertical routing tracks with the horizontal routing tracks.

The layout patterns of the horizontal routing tracks are depicted in FIG. 8A. In FIG. 8A and FIG. 8C, the SDF circuit 800 incudes horizontal routing tracks h_dSI, CKb1, CKbb2, CKb0, SI, ML_b, SEB, D, CKbb1, SE, CKb, Q, SL_a, hML_b, hSEB, CKb4, CKbb3, and CP. The layout positions of the front side via connectors VG and VD in FIG. 8A, which are not explicitly shown, may be determined from the needed connections provided by the via connectors VG and VD in FIG. 8C, because a connection between a chosen horizontal routing track and a chosen terminal of a transistor in FIG. 8C implies a front side via connector VG or VD in FIG. 8A at the intersection between the chosen horizontal routing track and the chosen terminal.

The layout patterns of the backside routing tracks are depicted in FIG. 8B. In FIG. 8B and FIG. 8C, the SDF circuit 800 incudes the backside routing tracks n01, n02, ML_ax, and SL_bx. The backside routing track n01 connects the source/drain terminals of the transistor nD and nSE with the source/drain terminal of the transistor nCKb1 through the backside via connectors VBd. The backside routing track n02 connects the source/drain terminals of the transistor pD and pSEB with the source/drain terminal of the transistor pCKbb1 through the backside via connectors VBd. The backside routing track ML_ax is connect to the gate terminals of the transistors pML_ax and nML_ax through the backside via connector VB. The backside routing track ML_ax is connect to the source/drain terminals of the transistors pCKbb1, nCKb1, pCKb2, and nCKbb2 through the backside via connectors VBd, The backside routing track SL_bx is connect to the gate terminals of the transistors pSL_bx and nSL_bx through the backside via connector VB. The backside routing track SL_bx is connect to the gate terminals of the transistors pQB and nQB through the backside via connector VB. The backside routing track SL_bx is connect to the source/drain terminals of the transistors pSL_a and nSL_a through the backside via connectors VBd, In FIG. 8C, the SDF circuit 800 includes the vertical routing tracks vSI, vQ, vSEB, vD, vCKb, vCKbb, vML_b, vCP, and vCKb0. The vertical routing track vSEB connects the horizontal routing tracks SEB and hSEB through the front side via connectors V0. The vertical routing track vCKb connects the horizontal routing tracks CKb1, CKb, and CKb4 through the front side via connectors V0. The vertical routing track vCKbb connects the horizontal routing tracks CKbb2, CKbb1 and CKbb3 through the front side via connectors V0. The vertical routing track vML_b connects the horizontal routing tracks ML_b and hML_b through the front side via connectors V0.

In FIG. 8C, the vertical routing track vSI connects the horizontal routing track SI through the front side via connector V0. The vertical routing track vQ connects the horizontal routing track Q through the front side via connector V0. The vertical routing track vD connects the horizontal routing track D through the front side via connector V0. The vertical routing track vCP connects the horizontal routing track SI through the front side via connector CP. The vertical routing tracks vD, vQ, vSI, and vCP provides input pins correspondingly for the input data signal D, the output signal Q, the scan input signal SI, and the clock signal CP.

As shown in FIG. 9A, when the input data signal D has a first phase Φ+, both the signal at the connection node n01 and the signal at the connection node n02 has a second phase Φ− that is opposite to the first phase Φ+. The signal at the connection node ml_ax, which is between the output of the two-input multiplexer 910 and the input of the mater latch 920, has the second phase Φ−. The signal at the connection node ml_b, which is between the output of the mater latch 920 and the input of the transmission gate 930, has the first phase Φ+. The signal at the connection node sl_a, which is between the output of transmission gate 930 and the input of the slave latch 940, has the first phase Φ+. The signal at the connection node sl_bx, which is between the output of the slave latch 940 and the input of the inverter 950, has the second phase Φ−. The signal Q at the output of the inverter 950 has the first phase Φ+.

Figure 8D:
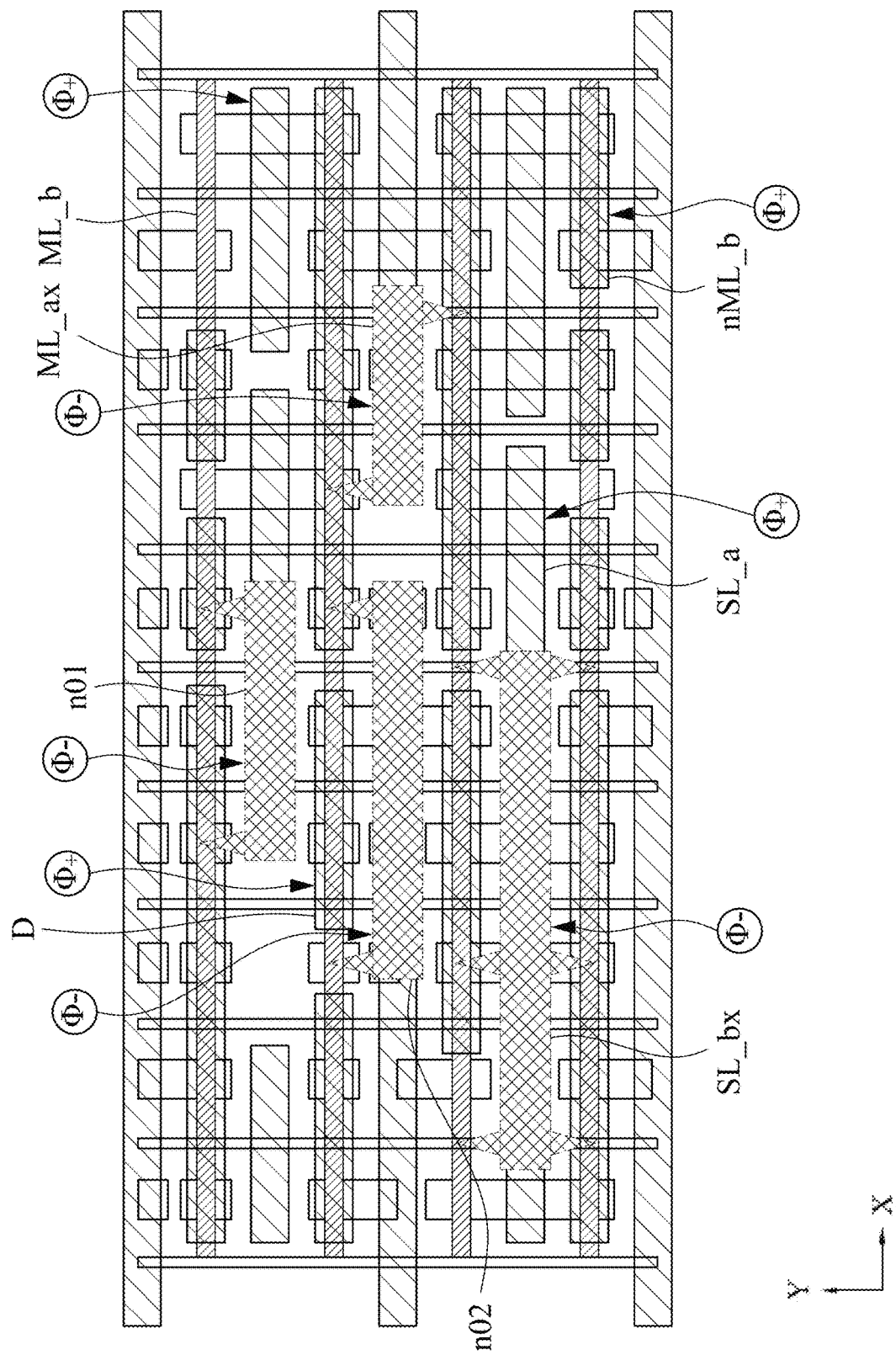
FIG. 8D is a partial layout diagram of a Scan D Flip-flop (SDF) circuit which has some of the signal phases identified, in accordance with some embodiments.

In the layout design of the SDF circuit 800, when adjacent routing tracks on a same metal layer (such as the metal layer M0) do not carry signals with the opposite phase, the speed and the power consumption of the SDF circuit 800 will be improved over some of the alternative designs which have capacitive couplings due to opposite phase signals carried by adjacent routing tracks on a same metal layer. A SDF circuit 800 based on the layout design of in FIGS. 8A-8B will have improved speed and the improved power consumption over some of the alternative designs. As shown in FIG. 8D, signals with the first phase Φ₊ are carried by the horizontal routing tracks D, ML_b, hML_b, Q, and SL_a the front side of the substrate, while signals with the second phase Φ₋ are carried by the backside routing tracks n01, n02, ML_ax, and SL_bx on the backside of the substrate.

Figure 10:
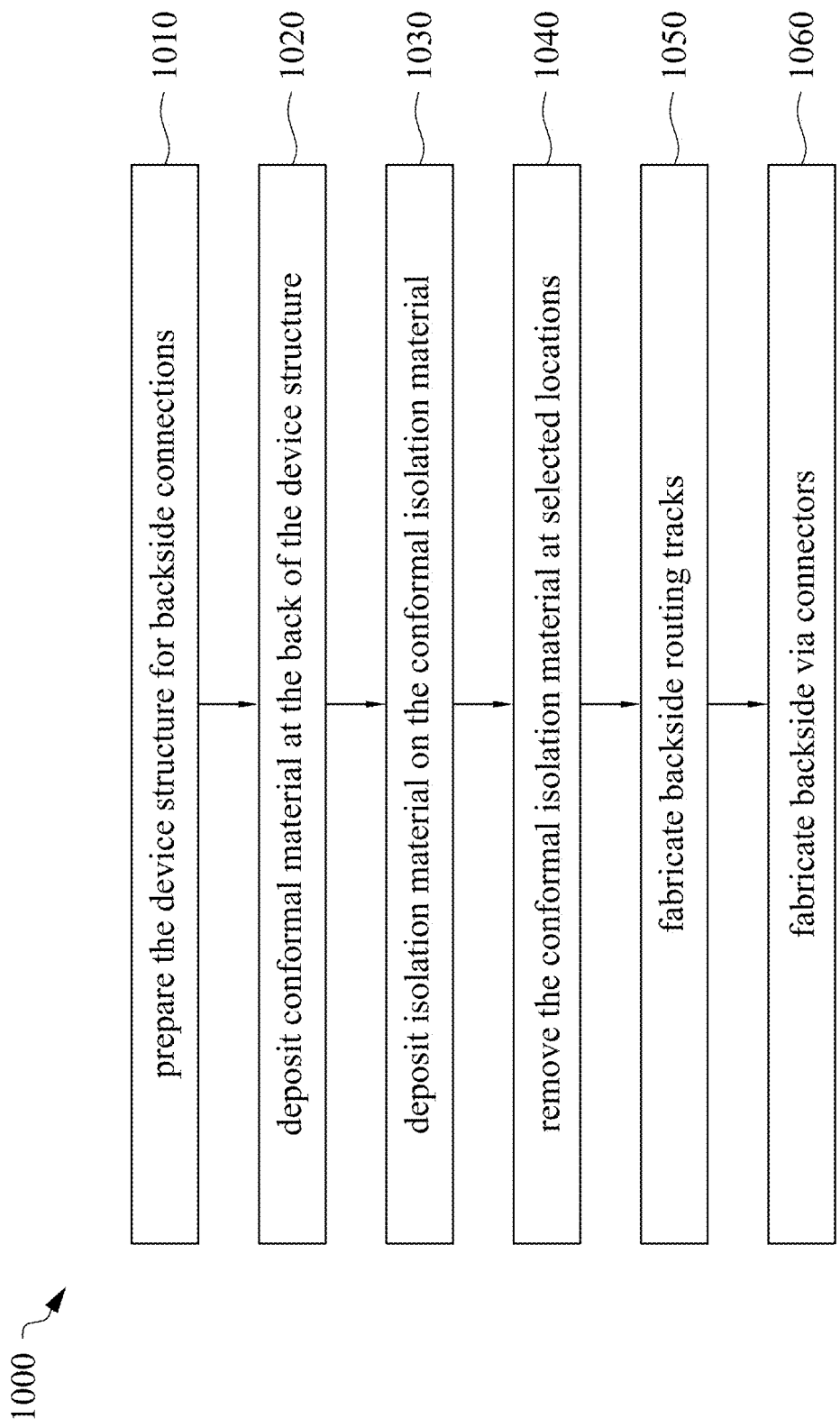
FIG. 10 is a flow chart of a method of fabricating the backside routing tracks and backside via connectors, in accordance with some embodiments.

FIG. 10 is a flow chart showing a method 1000 of fabricating the backside routing tracks and backside via connectors, in accordance with some embodiments. Examples of the backside routing tracks and backside via connectors fabricated with the process 1000 include the backside routing track (e.g., 162) and the backside via connectors (e.g., VB and VBd) as shown in FIGS. 2A-2D. FIGS. 11A-11E are top views and cross-sectional views of intermediate device structures obtained when fabricating the backside routing tracks and the backside via connector VBd for connecting a backside routing track with a source/drain terminal of a transistor, in accordance with some embodiments. FIGS. 12A-12E are top views and cross-sectional views of intermediate device structures obtained when fabricating the backside routing tracks and the backside via connector VB for connecting a backside routing track with a gate terminal of a transistor, in accordance with some embodiments.

In the top views of FIGS. 11A-11E and FIGS. 12A-12E, the gate-strip 50p overlaps with the p-type active zone 80p and forms the gate terminal of a p-type transistor, and the gate-strip 50n overlaps with the n-type active zone 80n and forms the gate terminal of an n-type transistor. The device structures in FIGS. 11A-11E when viewed along the cutting plan Q1-Q1' (as shown in the top view) are depicted correspondingly as the cross-sectional views in FIGS. 11A-11E. The device structures in FIGS. 12A-12E when viewed along the cutting plan Q2-Q2' (as shown in the top view) are depicted correspondingly as the cross-sectional views in FIGS. 12A-12E.

In FIG. 10, at process 1010, the device structure for backside connections is prepared. At process 1010, for preparing backside connections, active regions of the transistors in an integrated circuit, such as the channel regions and the source/drain regions, are isolated from each other by deposing dielectric materials onto the device structures from the backside of the integrated circuit. In some embodiments, the device structures prepared at the process 1010 includes the device structures of FIG. 11A and FIG. 12A.

In the cross-sectional view of FIG. 11A, the source/drain region 60n of the n-type transistor is isolated from the source/drain region 60p of the p-type transistor by the isolation material 1110. Dummy contact structures 1120n and 1120p contacting correspondingly the source/drain regions 60n and 60p are fabricated at the backside of the device structure. Dummy contact structures 1120n and 1120p are made of isolation materials. Hard masks 1130n and 1130p are fabricated covering correspondingly the dummy contact structures 1120n and 1120p. The isolation material 1110 in areas between the dummy contact structures 1120n and 1120p are recessed to a level as indicated by the surface 1112 of the isolation material 1110.

In the cross-sectional view of FIG. 12A, the channel region 70n of the n-type transistor is isolated from the channel region 70p of the p-type transistor by the isolation material 1215. Dummy contact structures 1220n and 1220p contacting correspondingly the channel regions 70n and 70p are fabricated at the backside of the device structure. Dummy contact structures 1220n and 1220p are made of isolation materials. Hard masks 1230n and 1230p are fabricated covering correspondingly the dummy contact structures 1220n and 1220p. The isolation material 1215 in areas between the dummy contact structures 1220n and 1220p are recessed to a level as indicated by the surface 1212 of the isolation material 1215.

In FIG. 10, at process 1020, conformal isolation material is deposited at the back of the device structure prepared at process 1010. In FIG. 11B, the conformal isolation material 1140 deposited at process 1020 covers the exposed surfaces of the hard masks 1130n and 1130p, the sidewalls of the dummy contact structures 1120n and 1120p, and the recessed surface 1112 of the isolation material 1110. In FIG. 12B, the conformal isolation material 1240 deposited at process 1020 covers the exposed surfaces of the hard masks 1230n and 1230p, the sidewalls of the dummy contact structures 1220n and 1220p, and the recessed surface 1212 of the isolation material 1215.

After the process 1020, a layer of isolation material is deposited at process 1030 and covers the surfaces of the conformal isolation material. In FIG. 11B, the layer of isolation material 1172 covers the conformal isolation material 1140. In FIG. 12B, the layer of isolation material 1272 covers the conformal isolation material 1240.

Then, at process 1040, the conformal isolation material at selected locations is removed. The selected locations include portions of the sidewalls of the dummy contact structures. In FIG. 11C and FIG. 12C, the backside of the device structure is covered with a layer of photoresist (e.g., 1150 or 1250), and the photoresist in a window area (e.g., 1155 or 1255) as defined by a photomask is removed by photolithography techniques. In FIG. 11C, the window area 1155 defines the location of a backside routing track for connecting with the source/drain region 60n of the n-type transistor through a backside via connector. In FIG. 12C, the window area 1155 defines the location of a backside routing track for connecting with the channel region 70n of the n-type transistor through a backside via connector. During process 1040, after the window areas in the photoresist layer for specifying the window area (e.g., 1155 or 1255) are generated, materials exposed within the window areas of the photoresist layer are removed with etching processes. In FIG. 11C, the conformal isolation material at the selected portion 1122n of a sidewall on the dummy contact structure 1120n is removed by the etching processes. In FIG. 12C, the conformal isolation material at the selected portion 1222n of a sidewall on the dummy contact structure 1220n is removed by the etching processes. In FIG. 11C and FIG. 12C, the layer of photoresist (e.g., 1150 or 1250) is striped off after the conformal isolation material at the selected portions of the sidewalls of the dummy contact structures is removed.

Next, at process 1050, backside routing tracks in a metal layer at the backside of the integrated circuit are fabricated. In FIG. 11D, the metal layer 1175 is deposited overlying the isolation material 1172, and the backside routing tracks (e.g., 1162, 1164, and 1166) are formed. After the backside routing tracks are formed, another layer of isolation material 1174 is deposited covering the backside routing tracks (e.g., 1162, 1164, and 1166). In FIG. 12D, the metal layer 1275 is deposited overlying the isolation material 1272, and the backside routing tracks (e.g., 1262, 1264, and 1266) are formed. After the backside routing tracks are formed, another layer of isolation material 1274 is deposited covering the backside routing tracks (e.g., 1262, 1264, and 1266).

Next, at process 1060, backside via connectors are fabricated. In FIG. 11E, the dummy structure 1120n and the associated mask 1130n are removed to expose a surface 62n of the source/drain region 60n of the n-type transistor. Then, conductive material such as metal is deposited to form the backside via connector 1180n. The backside via connector 1180n forms conductive contacts with both the backside routing track 1164 and the source/drain region 60n of the n-type transistor. The backside via connector 1180n is a backside via connector VBd for connecting a source/drain region of a transistor with a backside routing track. In FIG. 12E, the dummy structure 1220n and the associated mask 1230n are removed to expose a surface 72n of the channel region 70n of the n-type transistor. Then, conductive material such as metal is deposited to form the backside via connector 1280n. The backside via connector 1280n forms conductive contacts with both the backside routing track 1264 and the channel region 70n of the n-type transistor. The backside via connector 1280n is a backside via connector VB for connecting a gate terminal of a transistor with a backside routing track. In FIG. 11E and FIG. 12E, after the backside via connectors (e.g., 1180n or 1280n) are formed, protective covers (e.g., 1132n or 1232n) are formed by depositing isolation materials over the backside via connectors.

In addition to the method 1000 in FIG. 10 for fabricating the backside routing tracks and backside via connectors. There are also other embodiments of the method for fabricating the backside routing tracks and backside via connectors.

Figure 13:
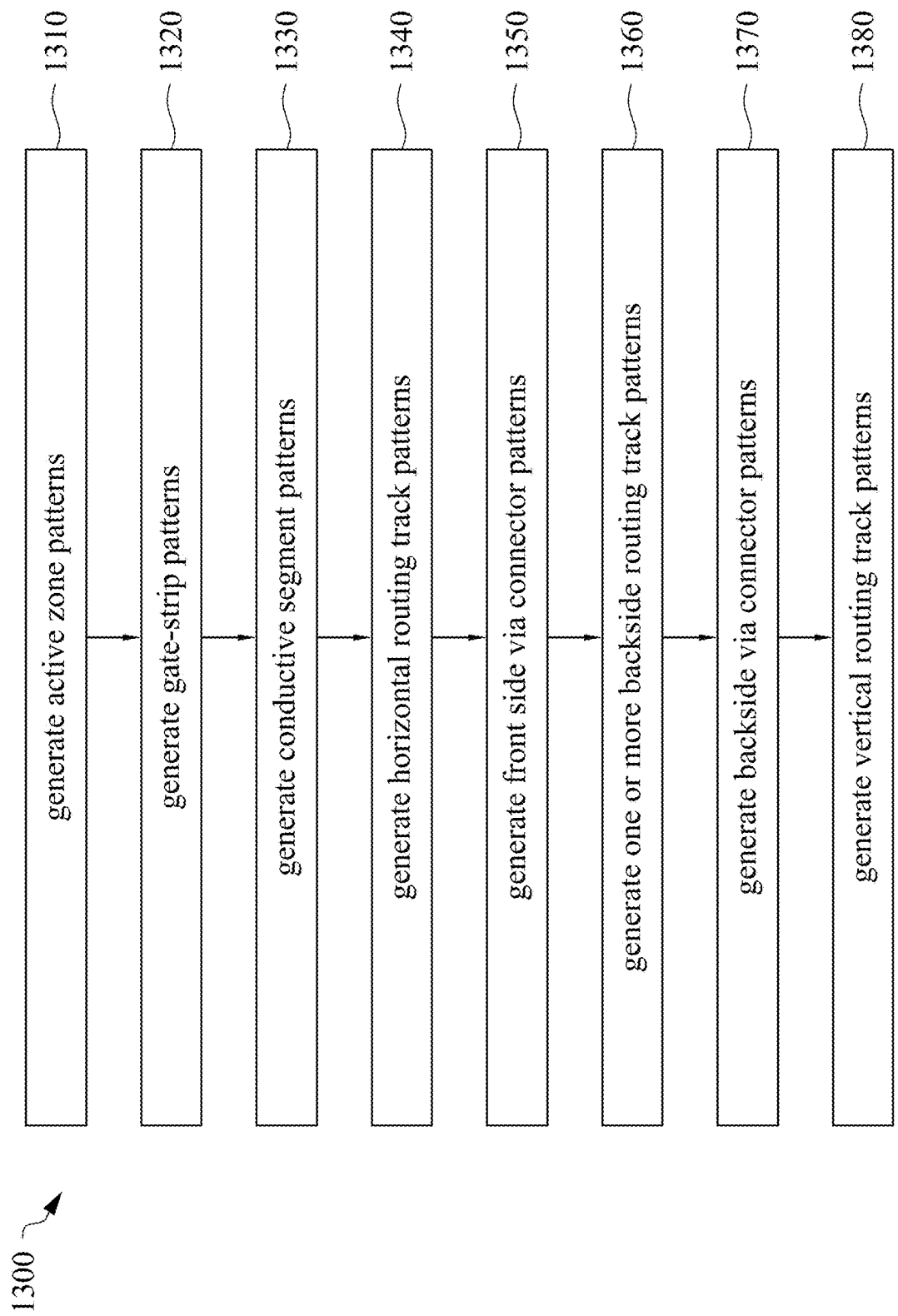
FIG. 13 is a flowchart of a method of generating a layout design of an integrated circuit in accordance with some embodiments.

FIG. 13 is a flowchart of a method 1300 of generating a layout design of an integrated circuit in accordance with some embodiments. It is understood that additional operations may be performed before, during, and/or after the method 1300 depicted in FIG. 13, and that some other processes may only be briefly described herein. In some embodiments, the method 1300 is usable to generate one or more layout designs, such as the layout designs in FIGS. 1A-1B, FIGS. 3A-3B, FIGS. 4A-4C, FIGS. 6A-6C, FIGS. 7A-7B, or FIGS. 8A-8B. In some embodiments, the method 1300 is usable to form integrated circuits having similar structural relationships as one or more of the semiconductor structures formed based on the layout designs in FIGS. 1A-1B, FIGS. 3A-3B, FIGS. 4A-4C, FIGS. 6A-6C, FIGS. 7A-7B, or FIGS. 8A-8B. In some embodiments, the method 1300 is usable to form integrated circuits having similar structural relationships as one or more of the semiconductor structures in FIGS. 2A-2D. In some embodiments, method 1300 is performed by a processing device (e.g., processor 1402 in FIG. 14) configured to execute instructions for generating one or more layout designs, such as the layout designs in FIGS. 1A-1B, FIGS. 3A-3B, FIGS. 4A-4C, FIGS. 6A-6C, FIGS. 7A-7B, or FIGS. 8A-8B.

In operation 1310 of method 1300, active zone patterns are generated. The active zone patterns generated include a first-type active zone pattern and a second-type active zone pattern. In the example layout designs of FIGS. 1A-1B, FIGS. 3A-3B, FIGS. 4A-4C, FIGS. 6A-6C, and FIGS. 7A-7B, each of the p-type active zone 80p and the n-type active zone 80n is specified by a corresponding p-type active zone pattern or a corresponding n-type active zone pattern. In the example layout design of FIGS. 8A-8B, each of the p-type active zones 80p and 82p is specified by a corresponding p-type active zone pattern, and each of the n-type active zones 80n and 82n is specified by a corresponding n-type active zone pattern. The flow proceeds to operation 1320.

In operation 1320 of method 1300, gate-strip patterns are generated. In the example layout designs of FIGS. 1A-1B, FIGS. 3A-3B, and FIGS. 4A-4C, each of the gate-strips 151, 152, 153, gB2, gB1, gA1, and gA2 is specified by a corresponding gate-strip pattern. In the example layout design of and FIGS. 6A-6C, each of the gate-strips gS1, gI1, gI0, gS0, 656, g03, g04, gS2, gI2, gI3, and gS3 is specified by a corresponding gate-strip pattern. In the example layout design of and FIGS. 7A-7B, each of the gate-strips pattern gA1, gA2, g2N, gA3, and gA4 is specified by a corresponding gate-strip pattern. In the example layout design of FIGS. 8A-8B, each of the gate-strips gS1, gSEB, gD, gSE, gnCKb1, gnCKbb2, gML_b, gCKb0, gQB, gSL_a, gSE, gSL_bx, gnCKb4, gnCKbb3, gML_ax, and gCP is specified by a corresponding gate-strip pattern. The flow proceeds to operation 1330.

In operation 1330 of method 1300, conductive segment patterns are generated. In the example layout design of FIGS. 1A-1B, each of the conductive segments 132, 134p, 134n, 136, 138p, and 138n is specified by a corresponding conductive segment pattern. In the example layout designs of FIGS. 3A-3B and FIGS. 4A-4C, each of the conductive segments 332p, 332n, 334p, 334n, 335p, 335n, 336p, 336n, 338p, and 338n is specified by a corresponding conductive segment pattern. In the example layout designs of FIGS. 6A-6C, FIGS. 7A-7B, or FIGS. 8A-8B, each of the conductive segments is similarly specified by a corresponding conductive segment pattern. The flow proceeds to operation 1340.

In operation 1340 of method 1300, horizontal routing track patterns are generated. In the example layout designs of FIGS. 1A-1B, FIGS. 3A-3B and FIGS. 4A-4C, each of the horizontal routing tracks 142,144, 146, B1, ZN, B2, A1, A2, 442, and 448 is specified by a corresponding horizontal routing track pattern. In the example layout design of FIGS. 6A-6C, each of the horizontal routing tracks n01, 642, n02, S1, S0, S2, S3, I1, I0, 648, I2, and I3 is specified by a corresponding horizontal routing track pattern. In the example layout design of FIGS. 7A-7B, each of the horizontal routing tracks A2, A3, A4, A1, and 742 is specified by a corresponding horizontal routing track pattern. In the example layout design of FIGS. 8A-8B, each of the horizontal routing tracks h_dSI, CKb1, CKbb2, CKb0, SI, ML_b, SEB, D, CKbb1, SE, CKb, Q, SL_a, hML_b, hSEB, CKb4, CKbb3, and CP is specified by a corresponding horizontal routing track pattern. In some embodiments, power rail patterns are also generated in operation 1340. In the example layout designs of FIGS. 1A-1B, FIGS. 3A-3B, FIGS. 4A-4C, FIGS. 6A-6C, FIGS. 7A-7B, and FIGS.

8A-8B, each of the power rails 122 and 124 is specified by a corresponding power rail pattern. The flow proceeds to operation 1350.

In operation 1350 of method 1300, front side via connector patterns are generated. In the example layout designs of FIGS. 1A-1B, FIGS. 3A-3B, FIGS. 4A-4C, FIGS. 6A-6C, and FIGS. 7A-7B, each of the side via connectors VG and VD is specified by a corresponding front side via connector pattern. In the example layout design of FIGS. 8A-8B, the positions of the front side via connector pattern for specifying each of the front side via connectors that are needed in the layout design can be determined from the circuit diagram in FIG. 8C. The flow proceeds to operation 1360.

In operation 1360 of method 1300, one or more backside routing track patterns are generated. In the example layout designs of FIGS. 1A-1B, FIGS. 3A-3B, FIGS. 4A-4C, FIGS. 6A-6C, FIGS. 7A-7B, and FIGS. 8A-8B, each of the backside routing tracks 162, 362, 364, n03, n04, and 762 is specified by a corresponding backside routing track pattern. In the example layout design of FIGS. 8A-8B, each of the backside routing tracks n01, n02, ML_ax, and SL_bx is specified by a corresponding backside routing track pattern. The flow proceeds to operation 1370.

In operation 1370 of method 1300, backside via connector patterns are generated. In the example layout designs of FIGS. 1A-1B, FIGS. 3A-3B, FIGS. 4A-4C, FIGS. 6A-6C, FIGS. 7A-7B, and FIGS. 8A-8B, each of the backside via connectors VB and VBd is specified by a corresponding backside via connector pattern. The flow proceeds to operation 1380.

In operation 1380 of method 1300, vertical routing track patterns are generated. In the example layout designs of FIGS. 4A-4C and FIGS. 6A-6C, each of the vertical routing tracks 472 and 672 is specified by a corresponding vertical routing track pattern. In the example layout design of FIGS. 8A-8C, the positions of the vertical routing track patterns for specifying various vertical routing tracks that are needed in the layout design can be determined from the circuit diagram in FIG. 8C. When the vertical routing track patterns are included in the layout design of FIGS. 8A-8B, each of the vertical routing tracks vSI, vQ, vSEB, vD, vSE, vCKb, vCKbb, vML_b, vCP, and vCKb0 will be specified by a corresponding vertical routing track pattern. In some embodiments, the layout patterns for specifying the front side via connectors V0 between the second metal layer M1 and the first metal layer M0 are also generated in operation 1380. A front side via connector V0 is a via connector that connects a vertical routing track in the second metal layer M1 with a horizontal routing track in the first metal layer M0.

Figure 14:
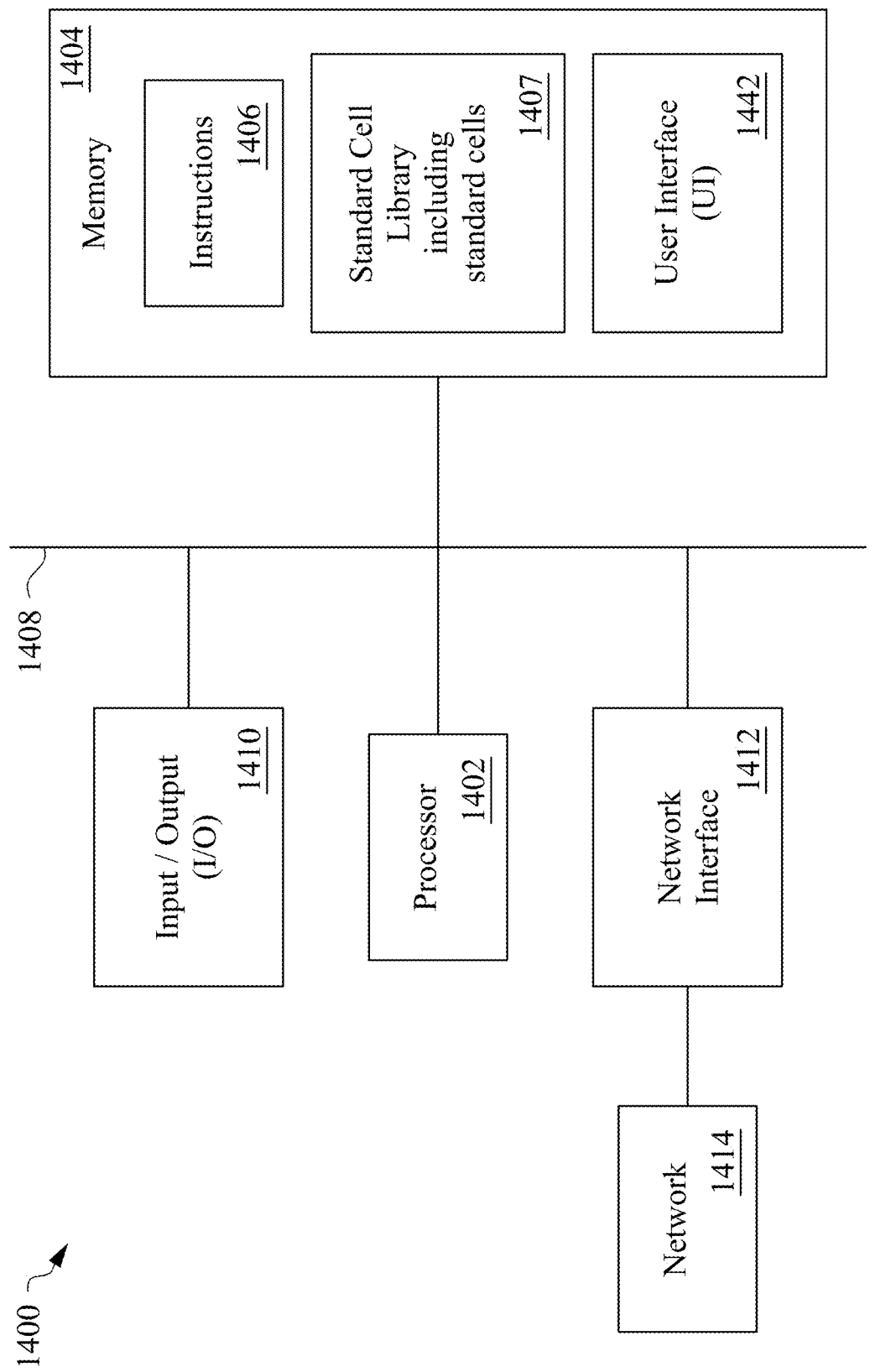
FIG. 14 is a block diagram of an electronic design automation (EDA) system, in accordance with some embodiments.

FIG. 14 is a block diagram of an electronic design automation (EDA) system 1400 in accordance with some embodiments.

In some embodiments, EDA system 1400 is a general purpose computing device including a hardware processor 1402 and a non-transitory, computer-readable storage medium (storage medium 1404). Storage medium 1404, amongst other things, is encoded with, i.e., stores, computer program code 1406, i.e., a set of computer-executable instructions (instructions). Execution of computer program code 1406 by hardware processor 1402 represents (at least in part) an EDA tool which implements a portion or all of, e.g., the methods described herein in accordance with one or more (hereinafter, the noted processes and/or methods).

Hardware processor 1402 is electrically coupled to computer-readable storage medium 1404 via a bus 1408. Hardware processor 1402 is also electrically coupled to an I/O interface 1410 by bus 1408. A network interface 1412 is also electrically connected to hardware processor 1402 via bus 1408. Network interface 1412 is connected to a network 1414, so that hardware processor 1402 and computer-readable storage medium 1404 are capable of connecting to external elements via network 1414. Hardware processor 1402 is configured to execute computer program code 1406 encoded in computer-readable storage medium 1404 in order to cause EDA system 1400 to be usable for performing a portion or all of the noted processes and/or methods. In one or more embodiments, hardware processor 1402 is a central processing unit (CPU), a multi-processor, a distributed processing system, an application specific integrated circuit (ASIC), and/or a suitable processing unit.

In one or more embodiments, computer-readable storage medium 1404 is an electronic, magnetic, optical, electromagnetic, infrared, and/or a semiconductor system (or apparatus or device). For example, computer-readable storage medium 1404 includes a semiconductor or solid-state memory, a magnetic tape, a removable computer diskette, a random access memory (RAM), a read-only memory (ROM), a rigid magnetic disk, and/or an optical disk. In one or more embodiments using optical disks, computer-readable storage medium 1404 includes a compact disk-read only memory (CD-ROM), a compact disk-read/write (CD-R/W), and/or a digital video disc (DVD).

In one or more embodiments, storage medium 1404 stores computer program code 1406 configured to cause EDA system 1400 (where such execution represents (at least in part) the EDA tool) to be usable for performing a portion or all of the noted processes and/or methods. In one or more embodiments, storage medium 1404 also stores information which facilitates performing a portion or all of the noted processes and/or methods. In one or more embodiments, storage medium 1404 stores a library 1407 of standard cells including such standard cells as disclosed herein.

EDA system 1400 includes I/O interface 1410. I/O interface 1410 is coupled to external circuitry. In one or more embodiments, I/O interface 1410 includes a keyboard, keypad, mouse, trackball, trackpad, touchscreen, and/or cursor direction keys for communicating information and commands to hardware processor 1402.

EDA system 1400 also includes network interface 1412 coupled to hardware processor 1402. Network interface 1412 allows EDA system 1400 to communicate with network 1414, to which one or more other computer systems are connected. Network interface 1412 includes wireless network interfaces such as BLUETOOTH, WIFI, WIMAX, GPRS, or WCDMA; or wired network interfaces such as ETHERNET, USB, or IEEE-1364. In one or more embodiments, a portion or all of noted processes and/or methods, is implemented in two or more EDA systems 1400.

EDA system 1400 is configured to receive information through I/O interface 1410. The information received through I/O interface 1410 includes one or more of instructions, data, design rules, libraries of standard cells, and/or other parameters for processing by hardware processor 1402. The information is transferred to hardware processor 1402 via bus 1408. EDA system 1400 is configured to receive information related to a UI through I/O interface 1410. The information is stored in computer-readable medium 1404 as user interface (UI) 1452.

In some embodiments, a portion or all of the noted processes and/or methods is implemented as a standalone software application for execution by a processor. In some embodiments, a portion or all of the noted processes and/or methods is implemented as a software application that is a part of an additional software application. In some embodiments, a portion or all of the noted processes and/or methods is implemented as a plug-in to a software application. In some embodiments, at least one of the noted processes and/or methods is implemented as a software application that is a portion of an EDA tool. In some embodiments, a portion or all of the noted processes and/or methods is implemented as a software application that is used by EDA system 1400. In some embodiments, a layout diagram which includes standard cells is generated using a tool such as VIRTUOSO® available from CADENCE DESIGN SYSTEMS, Inc., or another suitable layout generating tool.

In some embodiments, the processes are realized as functions of a program stored in a non-transitory computer readable recording medium. Examples of a non-transitory computer readable recording medium include, but are not limited to, external/removable and/or internal/built-in storage or memory unit, e.g., one or more of an optical disk, such as a DVD, a magnetic disk, such as a hard disk, a semiconductor memory, such as a ROM, a RAM, a memory card, and the like.

Figure 15:
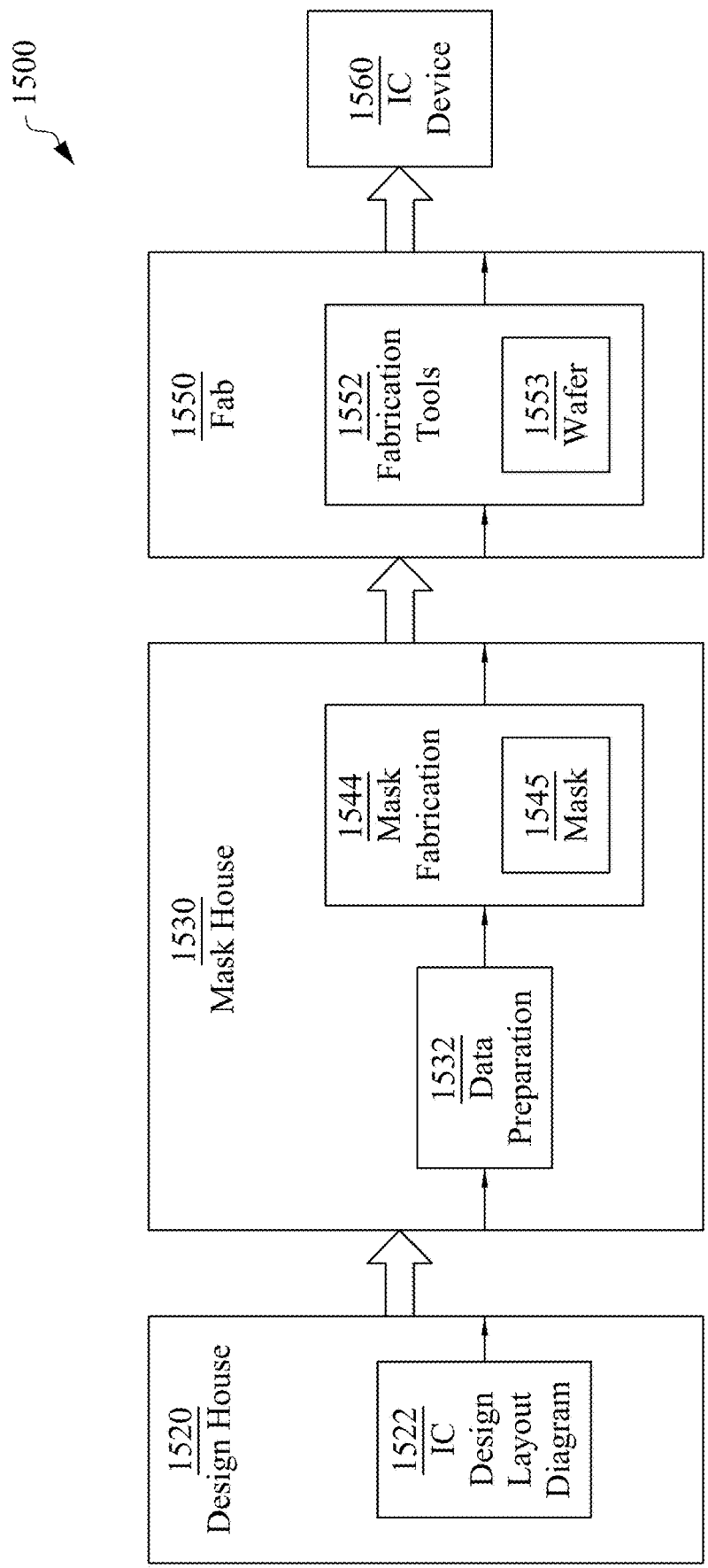
FIG. 15 is a block diagram of an integrated circuit (IC) manufacturing system, and an IC manufacturing flow associated therewith, in accordance with some embodiments.

FIG. 15 is a block diagram of an integrated circuit (IC) manufacturing system 1500, and an IC manufacturing flow associated therewith, in accordance with some embodiments. In some embodiments, based on a layout diagram, at least one of (A) one or more semiconductor masks or (B) at least one component in a layer of a semiconductor integrated circuit is fabricated using IC manufacturing system 1500.

In FIG. 15, IC manufacturing system 1500 includes entities, such as a design house 1520, a mask house 1530, and an IC manufacturer/fabricator ("fab") 1550, that interact with one another in the design, development, and manufacturing cycles and/or services related to manufacturing an IC device 1560. The entities in IC manufacturing system 1500 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and provides services to and/or receives services from one or more of the other entities. In some embodiments, two or more of design house 1520, mask house 1530, and IC fab 1550 is owned by a single larger company. In some embodiments, two or more of design house 1520, mask house 1530, and IC fab 1550 coexist in a common facility and use common resources.

Design house (or design team) 1520 generates an IC design layout diagram 1522. IC design layout diagram 1522 includes various geometrical patterns designed for an IC device 1560. The geometrical patterns correspond to patterns of metal, oxide, or semiconductor layers that make up the various components of IC device 1560 to be fabricated. The various layers combine to form various IC features. For example, a portion of IC design layout diagram 1522 includes various IC features, such as an active region, gate electrode, source and drain, metal lines or vias of an interlayer interconnection, and openings for bonding pads, to be formed in a semiconductor substrate (such as a silicon wafer) and various material layers disposed on the semiconductor substrate. Design house 1520 implements a proper design procedure to form IC design layout diagram 1522. The design procedure includes one or more of logic design, physical design or place and route. IC design layout diagram 1522 is presented in one or more data files having information of the geometrical patterns. For example, IC design layout diagram 1522 can be expressed in a GDSII file format or DFII file format.

Mask house 1530 includes data preparation 1532 and mask fabrication 1544. Mask house 1530 uses IC design layout diagram 1522 to manufacture one or more masks 1545 to be used for fabricating the various layers of IC device 1560 according to IC design layout diagram 1522. Mask house 1530 performs mask data preparation 1532, where IC design layout diagram 1522 is translated into a representative data file ("RDF"). Mask data preparation 1532 provides the RDF to mask fabrication 1544. Mask fabrication 1544 includes a mask writer. A mask writer converts the RDF to an image on a substrate, such as a mask (reticle) 1545 or a semiconductor wafer 1553. The design layout diagram 1522 is manipulated by mask data preparation 1532 to comply with particular characteristics of the mask writer and/or requirements of IC fab 1550. In FIG. 15, mask data preparation 1532 and mask fabrication 1544 are illustrated as separate elements. In some embodiments, mask data preparation 1532 and mask fabrication 1544 can be collectively referred to as mask data preparation.

In some embodiments, mask data preparation 1532 includes optical proximity correction (OPC) which uses lithography enhancement techniques to compensate for image errors, such as those that can arise from diffraction, interference, other process effects and the like. OPC adjusts IC design layout diagram 1522. In some embodiments, mask data preparation 1532 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, mask data preparation 1532 includes a mask rule checker (MRC) that checks the IC design layout diagram 1522 that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout diagram 1522 to compensate for limitations during mask fabrication 1544, which may undo part of the modifications performed by OPC in order to meet mask creation rules.

In some embodiments, mask data preparation 1532 includes lithography process checking (LPC) that simulates processing that will be implemented by IC fab 1550 to fabricate IC device 1560. LPC simulates this processing based on IC design layout diagram 1522 to create a simulated manufactured device, such as IC device 1560. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus ("DOF"), mask error enhancement factor ("MEEF"), other suitable factors, and the like or combinations thereof. In some embodiments, after a simulated manufactured device has been created by LPC, if the simulated device is not close enough in shape to satisfy design rules, OPC and/or MRC are be repeated to further refine IC design layout diagram 1522.

It should be understood that the above description of mask data preparation 1532 has been simplified for the purposes of clarity. In some embodiments, data preparation 1532 includes additional features such as a logic operation (LOP)

to modify the IC design layout diagram 1522 according to manufacturing rules. Additionally, the processes applied to IC design layout diagram 1522 during data preparation 1532 may be executed in a variety of different orders.

After mask data preparation 1532 and during mask fabrication 1544, a mask 1545 or a group of masks 1545 are fabricated based on the modified IC design layout diagram 1522. In some embodiments, mask fabrication 1544 includes performing one or more lithographic exposures based on IC design layout diagram 1522. In some embodiments, an electron-beam (e-beam) or a mechanism of multiple e-beams is used to form a pattern on a mask (photomask or reticle) 1545 based on the modified IC design layout diagram 1522. Mask 1545 can be formed in various technologies. In some embodiments, mask 1545 is formed using binary technology. In some embodiments, a mask pattern includes opaque regions and transparent regions. A radiation beam, such as an ultraviolet (UV) beam, used to expose the image sensitive material layer (e.g., photoresist) which has been coated on a wafer, is blocked by the opaque region and transmits through the transparent regions. In one example, a binary mask version of mask 1545 includes a transparent substrate (e.g., fused quartz) and an opaque material (e.g., chromium) coated in the opaque regions of the binary mask. In another example, mask 1545 is formed using a phase shift technology. In a phase shift mask (PSM) version of mask 1545, various features in the pattern formed on the phase shift mask are configured to have proper phase difference to enhance the resolution and imaging quality. In various examples, the phase shift mask can be attenuated PSM or alternating PSM. The mask(s) generated by mask fabrication 1544 is used in a variety of processes. For example, such a mask(s) is used in an ion implantation process to form various doped regions in semiconductor wafer 1553, in an etching process to form various etching regions in semiconductor wafer 1553, and/or in other suitable processes.

IC fab 1550 includes wafer fabrication 1552. IC fab 1550 is an IC fabrication business that includes one or more manufacturing facilities for the fabrication of a variety of different IC products. In some embodiments, IC fab 1550 is a semiconductor foundry. For example, there may be a manufacturing facility for the front end fabrication of a plurality of IC products (front-end-of-line (FEOL) fabrication), while a second manufacturing facility may provide the back end fabrication for the interconnection and packaging of the IC products (back-end-of-line (BEOL) fabrication), and a third manufacturing facility may provide other services for the foundry business.

IC fab 1550 uses mask(s) 1545 fabricated by mask house 1530 to fabricate IC device 1560. Thus, IC fab 1550 at least indirectly uses IC design layout diagram 1522 to fabricate IC device 1560. In some embodiments, semiconductor wafer 1553 is fabricated by IC fab 1550 using mask(s) 1545 to form IC device 1560. In some embodiments, the IC fabrication includes performing one or more lithographic exposures based at least indirectly on IC design layout diagram 1522. Semiconductor wafer 1553 includes a silicon substrate or other proper substrate having material layers formed thereon. Semiconductor wafer 1553 further includes one or more of various doped regions, dielectric features, multi-level interconnects, and the like (formed at subsequent manufacturing steps).

Details regarding an integrated circuit (IC) manufacturing system (e.g., manufacturing system 1500 of FIG. 15), and an IC manufacturing flow associated therewith are found, e.g., in U.S. Pat. No. 9,256,709, granted Feb. 9, 2016, U.S. Pre-Grant Publication No. 20150278429, published Oct. 1, 2015, U.S. Pre-Grant Publication No. 20140040838, published Feb. 6, 2014, and U.S. Pat. No. 7,260,442, granted Aug. 21, 2007, the entireties of each of which are hereby incorporated by reference.

An aspect of the present disclosure relates to an integrated circuit. The integrated circuit includes a semiconductor substrate and a first transistor having a first terminal, a second terminal, and a third terminal. The integrated circuit also includes a horizontal routing track extending in a first direction as a one-dimensional horizontal routing track in a first metal layer, and a via connector conductively connecting the horizontal routing track to the first terminal of the first transistor. The integrated circuit further includes a backside routing track extending in the first direction as a one-dimensional backside routing track in a backside metal layer, and a backside via connector conductively connecting the backside routing track to the second terminal of the first transistor. The backside metal layer and the first metal layer are formed at opposite sides of the semiconductor substrate. In the integrated circuit, either the first terminal or the second terminal is a gate terminal of the first transistor.

Another aspect of the present disclosure relates to an integrated circuit. The integrated circuit includes a semiconductor substrate and a first logic gate and a second logic gate formed with transistors having channel regions on the semiconductor substrate. A first output of the first logic gate is configured to generate a first output logic signal having a first output phase different from a first input phase of a first input logic signal at a first input of the first logic gate. The first output of the first logic gate is conductively connected to a second input of the second logic gate. The integrated circuit also includes a horizontal routing track extending in a first direction in a first metal layer, and a first via connector conductively connecting the horizontal routing track to the first input of the first logic gate. The integrated circuit further includes a backside routing track extending in the first direction in a backside metal layer, and a backside via connector conductively connecting the backside routing track to the first output of the first logic gate. The channel regions of the transistors are between the backside metal layer and the first metal layer.

Another aspect of the present disclosure relates to a method of fabricating an integrated circuit. The method includes fabricating gate-strips extending in a second direction perpendicular to a first direction, and fabricating conductive segments extending in the second direction. A gate-strip overlaps an active zone extending in the first direction at a first intersection and forms a gate terminal of a first transistor. A conductive segment overlaps the active zone at a second intersection and forms a channel connecting terminal of the first transistor. The channel connecting terminal includes either a source terminal or a drain terminal. The method also includes fabricating a horizontal routing track conductively connected to a first one of the gate terminals or the channel connecting terminal of the first transistor, and fabricating a backside routing track conductively connected to a second one of the gate terminals or the channel connecting terminal of the first transistor. The horizontal routing track extends in the first direction in a first metal layer. The backside routing track extends in the first direction in a backside metal layer. The backside metal layer and the first metal layer are formed at opposite sides of a semiconductor substrate.

It will be readily seen by one of ordinary skill in the art that one or more of the disclosed embodiments fulfill one or more of the advantages set forth above. After reading the foregoing specification, one of ordinary skill will be able to affect various changes, substitutions of equivalents and various other embodiments as broadly disclosed herein. It is therefore intended that the protection granted hereon be limited only by the definition contained in the appended claims and equivalents thereof.

What is claimed is:

1. An integrated circuit comprising:
    a semiconductor substrate;
    a first transistor having a first terminal, a second terminal, and a third terminal;
    a horizontal routing track extending in a first direction as a one-dimensional horizontal routing track in a first metal layer;
    a via connector conductively connecting the horizontal routing track to the first terminal of the first transistor;
    a backside routing track extending in the first direction as a one-dimensional backside routing track in a backside metal layer, wherein the backside metal layer and the first metal layer are formed at opposite sides of the semiconductor substrate;
    a backside via connector conductively connecting the backside routing track to the second terminal of the first transistor;
    wherein either the first terminal or the second terminal is a gate terminal of the first transistor; and
    a first gate-strip, extending in a second direction perpendicular to the first direction, overlapping a channel region of the first transistor and forming the gate terminal of the first transistor;
    a first conductive segment, extending in the second direction, overlapping a source region of the first transistor and forming a source terminal of the first transistor; and
    a second conductive segment, extending in the second direction, overlapping a drain region of the first transistor and forming a drain terminal of the first transistor.

2. The integrated circuit of claim 1, wherein the first transistor on the semiconductor substrate has a channel region between the backside metal layer and the first metal layer.

3. The integrated circuit of claim 1, wherein the backside via connector passes through the semiconductor substrate.

4. The integrated circuit of claim 1, wherein the first terminal is the gate terminal of the first transistor, and the second terminal is a source terminal or a drain terminal of the first transistor.

5. The integrated circuit of claim 1, wherein the first terminal is a source terminal or a drain terminal of the first transistor, and the second terminal is the gate terminal of the first transistor.

6. The integrated circuit of claim 1, wherein the via connector connects the horizontal routing track to the first gate-strip, and wherein the backside via connector connects the backside routing track to either the first conductive segment or the second conductive segment.

7. The integrated circuit of claim 1, wherein the via connector connects the horizontal routing track to either the first conductive segment or the second conductive segment, and wherein the backside via connector connects the backside routing track to the first gate-strip.

8. The integrated circuit of claim 1, wherein the first transistor, the horizontal routing track, the backside routing track is within an AOI logic cell, a multiplexer cell, a flip-flop cell, or a logic-gates combo cell.

9. The integrated circuit of claim 1, further comprising a second horizontal routing track adjacent to the horizontal routing track, and wherein the backside routing track is positioned vertically between the horizontal routing track and the second horizontal routing track.

10. An integrated circuit comprising:
    a semiconductor substrate;
    a first logic gate and a second logic gate formed with transistors having channel regions on the semiconductor substrate, a first output of the first logic gate being configured to generate a first output logic signal having a first output phase different from a first input phase of a first input logic signal at a first input of the first logic gate, and wherein the first output of the first logic gate is conductively connected to a second input of the second logic gate;
    a horizontal routing track extending in a first direction in a first metal layer;
    a first via connector conductively connecting the horizontal routing track to the first input of the first logic gate;
    a backside routing track extending in the first direction in a backside metal layer, wherein the channel regions of the transistors are between the backside metal layer and the first metal layer; and
    a backside via connector conductively connecting the backside routing track to the first output of the first logic gate.

11. The integrated circuit of claim 10, wherein the backside metal layer and the first metal layer are formed at opposite sides of the semiconductor substrate.

12. The integrated circuit of claim 10, wherein the first logic gate is one of a NAND gate, a NOR gate, or an inverter.

13. The integrated circuit of claim 10, wherein the second logic gate has an output conductively connected to a second horizontal routing track through a second via connector, a second output of the second logic gate being configured to generate a second output logic signal having a second output phase different from the first output logic signal at the first output of the first logic gate.

14. The integrated circuit of claim 13, wherein the second logic gate is one of a NAND gate, a NOR gate, or an inverter.

15. The integrated circuit of claim 10, further comprising a second horizontal routing track adjacent to the horizontal routing track, and wherein the backside routing track is positioned vertically between the horizontal routing track and the second horizontal routing track.

16. A method of fabricating an integrated circuit, the method comprising:
    fabricating gate-strips extending in a second direction perpendicular to a first direction, wherein a gate-strip overlaps an active zone extending in the first direction at a first intersection and forms a gate terminal of a first transistor;
    fabricating conductive segments extending in the second direction, wherein a conductive segment overlaps the active zone at a second intersection and forms a channel connecting terminal of the first transistor, the channel connecting terminal including either a source terminal or a drain terminal;
    fabricating a horizontal routing track conductively connected to a first one of the gate terminals or the channel connecting terminal of the first transistor, wherein the horizontal routing track extends in the first direction in a first metal layer; and
    fabricating a backside routing track conductively connected to a second one of the gate terminals or the channel connecting terminal of the first transistor, wherein the backside routing track extends in the first direction in a backside metal layer, and wherein the backside metal layer and the first metal layer are formed at opposite sides of a semiconductor substrate.

17. The method of claim 16, further comprising forming a front side via connector connecting the horizontal routing track to the gate terminal of the first transistor, and forming a backside via connector connecting the backside routing track to the channel connecting terminal of the first transistor.

18. The method of claim 16, further comprising forming a front side via connector connecting the horizontal routing track to the channel connecting terminal of the first transistor, and forming a backside via connector connecting the backside routing track to the gate terminal of the first transistor.

19. The method of claim 16, comprising:
fabricating the gate-strips in a layer between the backside metal layer and the first metal layer.

20. The method of claim 16, comprising:
fabricating the gate-strips, the conductive segments, the horizontal routing track, the backside routing track, a front side via connector, and a backside via connector as a part of a circuit including an AOI logic, a multiplexer, a flip-flop, or a logic-gates combo.

* * * * *